United States Patent
Camm et al.

(10) Patent No.: US 9,627,244 B2
(45) Date of Patent: Apr. 18, 2017

(54) METHODS AND SYSTEMS FOR SUPPORTING A WORKPIECE AND FOR HEAT-TREATING THE WORKPIECE

(75) Inventors: David Malcolm Camm, Vancouver (CA); Guillaume Sempere, Vancouver (CA); Ljubomir Kaludjercic, Vancouver (CA); Gregory Stuart, Burnaby (CA); Mladen Bumbulovic, Vancouver (CA); Tim Tran, Surrey (CA); Sergiy Dets, Burnaby (CA); Tony Komasa, Vancouver (CA); Marc Rudolph, Vancouver (CA); Joseph Cibere, Burnaby (CA)

(73) Assignee: Mattson Technology, Inc., Fremont, CA (US)

( * ) Notice: Subject to any disclaimer, the term of this patent is extended or adjusted under 35 U.S.C. 154(b) by 4261 days.

(21) Appl. No.: 10/742,575

(22) Filed: Dec. 19, 2003

(65) Prior Publication Data
US 2004/0178553 A1  Sep. 16, 2004

Related U.S. Application Data

(60) Provisional application No. 60/434,670, filed on Dec. 20, 2002, provisional application No. 60/468,659, filed on May 8, 2003.

(51) Int. Cl.
*H01L 21/687* (2006.01)
(52) U.S. Cl.
CPC .. *H01L 21/68728* (2013.01); *H01L 21/68721* (2013.01); *H01L 21/68757* (2013.01)
(58) Field of Classification Search
USPC ..... 248/342, 343; 204/297.14; 269/909, 903
See application file for complete search history.

(56) References Cited

U.S. PATENT DOCUMENTS

| 1,587,023 A | 6/1926 | Mottlau | 99/339 |
| RE24,296 E | 3/1957 | Stewart | 219/410 |

(Continued)

FOREIGN PATENT DOCUMENTS

| CA | 2339359 | 2/2000 | H01L 21/00 |
| DE | 42 23 133 C2 | 1/1993 | B01J 19/08 |

(Continued)

OTHER PUBLICATIONS

Habermehl, S. et al., "Properties of Residual Stress Silicon Oxynitrides Used as a Sacrificial Layer", VLSI Conference, Jan. 4-8, 2000.

(Continued)

*Primary Examiner* — Debra Sullivan
(74) *Attorney, Agent, or Firm* — Knobbe Martens Olson & Bear LLP

(57) ABSTRACT

Apparatuses and methods for supporting a workpiece such as a semiconductor wafer. A support system is configured to support the workpiece while allowing thermally-induced motion of the workpiece, which may include thermal bowing or thermal bending. The system may include a support member having a moveable engagement portion engageable with the workpiece, the engagement portion being moveable to allow the thermally-induced motion of the workpiece while supporting the workpiece. The moveable engagement portion may include a plurality of moveable engagement portions of a plurality of respective support members, which may be resiliently engageable with the workpiece. The support members may include flexible support members each having an unconstrained portion and a constrained portion, and the moveable engagement portions may include the unconstrained portions. Alternatively, the support members may be rigid and the system may include a plurality of (Continued)

force applicators such as springs in communication with the support members.

313 Claims, 24 Drawing Sheets

(56) References Cited

U.S. PATENT DOCUMENTS

| | | | |
|---|---|---|---|
| 2,981,819 A | 4/1961 | Gregory | 219/405 |
| 3,047,438 A | 7/1962 | Marinace | 117/91 |
| 3,108,173 A | 10/1963 | Barrett et al. | 99/389 |
| 3,160,517 A | 12/1964 | Jenkin | 427/585 |
| 3,213,827 A | 10/1965 | Jenkin | 118/725 |
| 3,227,065 A | 1/1966 | Litman | 99/241 |
| 3,239,651 A | 3/1966 | Silberman | 219/388 |
| 3,240,915 A | 3/1966 | Carter et al. | 392/411 |
| 3,460,510 A | 8/1969 | Currin | 118/720 |
| 3,502,516 A | 3/1970 | Henker | 117/103 |
| 3,610,613 A | 10/1971 | Worden | 269/254 |
| 3,623,712 A | 11/1971 | McNeilly et al. | 263/41 |
| 3,627,590 A | 12/1971 | Mammel | 148/1.5 |
| 3,661,637 A | 5/1972 | Sirtl | 117/201 |
| 3,692,572 A | 9/1972 | Strehlow | 359/586 |
| 3,700,850 A | 10/1972 | Lumley et al. | 219/121 LM |
| 3,836,751 A | 9/1974 | Anderson | 219/411 |
| 3,913,872 A | 10/1975 | Weber | 240/41 |
| 4,027,185 A | 5/1977 | Nodwell et al. | 313/35 |
| 4,041,278 A | 8/1977 | Boah | 219/411 |
| 4,081,313 A | 3/1978 | McNeilly et al. | 156/610 |
| 4,097,226 A | 6/1978 | Erikson et al. | 432/120 |
| 4,101,759 A | 7/1978 | Anthony et al. | 219/343 |
| 4,115,163 A | 9/1978 | Gorina et al. | 148/175 |
| 4,122,240 A | 10/1978 | Banas et al. | 428/655 |
| 4,151,008 A | 4/1979 | Kirkpatrick | 148/1.5 |
| 4,164,643 A | 8/1979 | Peart et al. | 219/411 |
| 4,220,483 A | 9/1980 | Cazcarra | 148/1.5 |
| 4,224,096 A | 9/1980 | Osborne | 156/380 |
| 4,233,493 A | 11/1980 | Nath | 219/354 |
| 4,306,731 A | 12/1981 | Shaw | 279/4 |
| 4,308,078 A | 12/1981 | Cook | 148/1.5 |
| 4,315,130 A | 2/1982 | Inagaki et al. | 219/121 L |
| 4,331,485 A | 5/1982 | Gat | 438/795 |
| 4,356,384 A | 10/1982 | Gat | 219/347 |
| 4,370,175 A | 1/1983 | Levatter | 148/1.5 |
| 4,375,993 A | 3/1983 | Mori et al. | 148/1.5 |
| 4,379,727 A | 4/1983 | Hansen et al. | 148/1.5 |
| 4,398,094 A | 8/1983 | Hiramoto | 250/492.1 |
| 4,421,048 A | 12/1983 | Adema et al. | 114/222 |
| 4,431,459 A | 2/1984 | Teng | 148/1.5 |
| 4,455,479 A | 6/1984 | Itoh et al. | 219/405 |
| 4,457,359 A | 7/1984 | Holden | |
| 4,482,393 A | 11/1984 | Nishiyama et al. | 438/530 |
| 4,493,977 A | 1/1985 | Arai et al. | 219/411 |
| 4,504,323 A | 3/1985 | Arai et al. | 148/1.5 |
| 4,533,820 A | 8/1985 | Shimizu | 219/411 |
| 4,539,431 A | 9/1985 | Moddel et al. | 136/258 |
| 4,540,876 A | 9/1985 | McGinty | 219/405 |
| 4,550,245 A | 10/1985 | Arai et al. | 219/405 |
| 4,550,684 A | 11/1985 | Mahawili | 118/724 |
| 4,560,420 A | 12/1985 | Lord | |
| 4,567,352 A | 1/1986 | Mimura et al. | 219/405 |
| 4,581,520 A | 4/1986 | Vu et al. | 219/349 |
| 4,636,969 A | 1/1987 | Kyoden et al. | 364/560 |
| 4,649,241 A | 3/1987 | Young et al. | 200/82 R |
| 4,649,261 A | 3/1987 | Sheets | 219/390 |
| 4,661,177 A | 4/1987 | Powell | 148/189 |
| 4,682,594 A | 7/1987 | Mok | 128/303.1 |
| 4,698,486 A | 10/1987 | Sheets | 250/492.2 |
| 4,700,102 A | 10/1987 | Camm et al. | 313/24 |
| 4,751,193 A | 6/1988 | Myrick | 437/19 |
| 4,755,654 A | 7/1988 | Crowley et al. | 219/405 |
| 4,787,551 A | 11/1988 | Hoyt et al. | 228/179 |
| 4,794,619 A | 12/1988 | Tregay | 374/131 |
| 4,818,327 A | 4/1989 | Davis et al. | 156/345 |
| 4,826,269 A | 5/1989 | Streifer et al. | 350/3.72 |
| 4,851,358 A | 7/1989 | Huber | 437/10 |
| 4,857,689 A | 8/1989 | Lee | 219/10.71 |
| 4,857,704 A | 8/1989 | Jannot et al. | 219/354 |
| 4,890,245 A | 12/1989 | Yomoto et al. | |
| 4,891,499 A | 1/1990 | Moslehi | 219/502 |
| 4,933,887 A | 6/1990 | Danko et al. | 364/557 |
| 4,937,490 A | 6/1990 | Camm et al. | 313/12 |
| 4,956,538 A | 9/1990 | Moslehi | 219/121.6 |
| 4,958,061 A | 9/1990 | Wakabayashi et al. | 219/411 |
| 4,959,244 A | 9/1990 | Penney et al. | 427/53.1 |
| 4,979,134 A | 12/1990 | Arima et al. | 364/557 |
| 4,981,815 A | 1/1991 | Kakoschke | 437/173 |
| 4,984,902 A | 1/1991 | Crowley et al. | 374/1 |
| 5,002,630 A | 3/1991 | Kermani et al. | 156/610 |
| 5,011,794 A | 4/1991 | Grim et al. | 437/247 |
| 5,041,714 A | 8/1991 | Funk | 219/121.62 |
| 5,073,698 A | 12/1991 | Stultz | 219/405 |
| 5,155,336 A | 10/1992 | Gronet et al. | 219/411 |
| 5,155,337 A | 10/1992 | Sorrell et al. | 219/411 |
| 5,188,458 A | 2/1993 | Thompson et al. | 374/121 |
| 5,196,353 A | 3/1993 | Sandhu et al. | 437/8 |
| 5,213,985 A | 5/1993 | Sandroff et al. | |
| 5,219,786 A | 6/1993 | Noguchi | 437/174 |
| 5,231,595 A | 7/1993 | Makino et al. | 364/557 |
| 5,249,142 A | 9/1993 | Shirakawa et al. | |
| 5,255,286 A | 10/1993 | Moslehi et al. | 374/121 |
| 5,258,824 A | 11/1993 | Carlson et al. | 356/382 |
| 5,271,084 A | 12/1993 | Vandenabeele et al. | 392/416 |
| 5,275,629 A | 1/1994 | Ajika et al. | 29/25.01 |
| 5,279,973 A | 1/1994 | Suizu | 437/25 |
| 5,282,017 A | 1/1994 | Kasindorf et al. | 356/446 |
| 5,293,216 A | 3/1994 | Moslehi | 356/371 |
| 5,305,417 A | 4/1994 | Najm et al. | 392/418 |
| 5,308,161 A | 5/1994 | Stein | 374/5 |
| 5,310,260 A | 5/1994 | Schietinger et al. | 374/142 |
| 5,313,044 A | 5/1994 | Massoud et al. | 219/121.85 |
| 5,317,429 A | 5/1994 | Mochizuki et al. | 359/42 |
| 5,317,656 A | 5/1994 | Moslehi et al. | 385/12 |
| 5,325,180 A | 6/1994 | Chappelow et al. | 356/401 |
| 5,326,173 A | 7/1994 | Evans et al. | 374/128 |
| 5,336,641 A | 8/1994 | Fair et al. | 437/248 |
| 5,347,128 A | 9/1994 | Puram et al. | 250/330 |
| 5,350,899 A | 9/1994 | Ishikawa et al. | 219/494 |
| 5,359,693 A | 10/1994 | Nenyei et al. | 392/418 |
| 5,364,186 A | 11/1994 | Wang et al. | 374/126 |
| 5,373,135 A | 12/1994 | Beyer et al. | 219/121.67 |
| 5,387,557 A | 2/1995 | Takagi | 437/247 |
| 5,399,506 A | 3/1995 | Tsukamoto | 437/19 |
| 5,399,523 A | 3/1995 | Kakoschke | 437/173 |
| 5,407,485 A | 4/1995 | Takagi | 118/724 |
| 5,418,885 A | 5/1995 | Hauser et al. | 392/416 |
| 5,431,700 A | 7/1995 | Sloan | 29/25.01 |
| 5,436,172 A | 7/1995 | Moslehi | 437/8 |
| 5,436,443 A | 7/1995 | Abtahi | 250/225 |
| 5,442,727 A | 8/1995 | Fiory | 392/416 |
| 5,444,217 A | 8/1995 | Moore et al. | 219/405 |
| 5,445,676 A | 8/1995 | Takagi | 118/719 |
| 5,446,824 A | 8/1995 | Moslehi | 392/416 |
| 5,446,825 A | 8/1995 | Moslehi et al. | 392/416 |
| 5,460,451 A | 10/1995 | Wadman | 374/126 |
| 5,463,534 A | 10/1995 | Raven | 362/32 |
| 5,467,220 A | 11/1995 | Xu | |
| 5,487,127 A | 1/1996 | Gronet et al. | 392/416 |
| 5,490,728 A | 2/1996 | Schietinger et al. | 374/7 |
| 5,501,637 A | 3/1996 | Duncan et al. | 374/126 |
| 5,508,934 A | 4/1996 | Moslehi et al. | 364/468 |
| 5,514,885 A | 5/1996 | Myrick | 257/216 |
| 5,517,359 A | 5/1996 | Gelbart | 359/623 |
| 5,530,221 A | 6/1996 | Benda et al. | 219/121.83 |
| 5,539,855 A | 7/1996 | Takahashi et al. | 392/416 |
| 5,553,939 A | 9/1996 | Dilhac et al. | |
| 5,561,612 A | 10/1996 | Thakur | 364/557 |
| 5,561,735 A | 10/1996 | Camm | 392/416 |
| 5,568,978 A | 10/1996 | Johnson et al. | |
| 5,580,388 A | 12/1996 | Moore | 118/728 |
| 5,593,608 A | 1/1997 | Suzuki | 219/492 |
| 5,597,237 A | 1/1997 | Stein | 374/9 |
| 5,601,366 A | 2/1997 | Paranjpe | 374/126 |
| 5,603,772 A | 2/1997 | Ide | 118/724 |

(56) References Cited

U.S. PATENT DOCUMENTS

| | | | |
|---|---|---|---|
| 5,604,592 A | 2/1997 | Kotidis et al. | 356/357 |
| 5,628,564 A | 5/1997 | Nenyei et al. | 374/121 |
| 5,635,093 A | 6/1997 | Arena et al. | 219/466 |
| 5,635,409 A | 6/1997 | Moslehi | 438/7 |
| 5,650,082 A | 7/1997 | Anderson | 219/390 |
| 5,654,904 A | 8/1997 | Thakur | 364/557 |
| 5,667,300 A | 9/1997 | Mandelis et al. | |
| 5,677,240 A | 10/1997 | Murakami et al. | 437/195 |
| 5,683,180 A | 11/1997 | De Lyon et al. | |
| 5,710,407 A | 1/1998 | Moore et al. | 219/405 |
| 5,715,361 A | 2/1998 | Moslehi | 392/416 |
| 5,727,017 A | 3/1998 | Maurer et al. | 374/9 |
| 5,738,165 A | 4/1998 | Imai | |
| 5,738,440 A | 4/1998 | O'Neill et al. | 374/9 |
| 5,790,750 A | 8/1998 | Anderson | 392/416 |
| 5,802,099 A | 9/1998 | Curran et al. | 374/131 |
| 5,809,211 A | 9/1998 | Anderson et al. | 392/416 |
| 5,814,365 A | 9/1998 | Mahawili | 427/10 |
| 5,815,396 A | 9/1998 | Shimamura et al. | |
| 5,822,172 A | 10/1998 | White | 361/234 |
| 5,830,277 A | 11/1998 | Johnsgard et al. | 118/725 |
| 5,841,110 A | 11/1998 | Nenyei et al. | 219/497 |
| RE36,050 E | 1/1999 | Thakur et al. | 374/161 |
| 5,858,819 A | 1/1999 | Miyasaka | 438/149 |
| 5,893,952 A | 4/1999 | Aronowitz et al. | 118/725 |
| 5,900,649 A | 5/1999 | Effelsberg | 257/81 |
| 5,908,307 A | 6/1999 | Talwar et al. | 438/199 |
| 5,937,142 A | 8/1999 | Moslehi et al. | 392/416 |
| 5,944,422 A | 8/1999 | Doitel et al. | 374/131 |
| 5,960,158 A | 9/1999 | Gat et al. | 392/416 |
| 5,971,565 A | 10/1999 | Zapata et al. | 362/294 |
| 5,993,059 A | 11/1999 | O'Neill et al. | 374/126 |
| 5,998,768 A | 12/1999 | Hunter et al. | 219/502 |
| 6,016,383 A | 1/2000 | Gronet et al. | 392/416 |
| 6,051,483 A | 4/2000 | Lee et al. | 438/530 |
| 6,056,434 A | 5/2000 | Champetier | |
| 6,066,516 A | 5/2000 | Miyasaka | 438/149 |
| 6,108,490 A | 8/2000 | Lee et al. | 392/416 |
| 6,122,439 A | 9/2000 | Gronet et al. | 392/416 |
| 6,146,504 A * | 11/2000 | Patadia et al. | 204/192.12 |
| 6,168,310 B1 | 1/2001 | Kurosaki et al. | |
| 6,171,641 B1 | 1/2001 | Okamoto et al. | 427/8 |
| 6,183,130 B1 | 2/2001 | Adams et al. | |
| 6,187,616 B1 | 2/2001 | Gyoda | 438/160 |
| 6,188,838 B1 | 2/2001 | Mikata et al. | 392/418 |
| 6,196,532 B1 | 3/2001 | Otwell | 269/21 |
| 6,217,212 B1 | 4/2001 | Brenninger et al. | |
| 6,222,990 B1 | 4/2001 | Guardado et al. | |
| 6,283,630 B1 | 9/2001 | Yazawa | 374/128 |
| 6,293,696 B1 | 9/2001 | Guardado | 374/2 |
| 6,303,411 B1 | 10/2001 | Camm et al. | 438/149 |
| 6,303,917 B1 | 10/2001 | Hawryluk | 250/205 |
| 6,315,878 B1 | 11/2001 | Patadia et al. | 204/298.15 |
| 6,348,099 B1 | 2/2002 | Xia et al. | 118/697 |
| 6,349,270 B1 | 2/2002 | Gurary et al. | 702/134 |
| 6,375,348 B1 | 4/2002 | Hebb et al. | 374/9 |
| 6,376,806 B2 | 4/2002 | Yoo | 219/411 |
| 6,406,545 B2 | 6/2002 | Shoda et al. | |
| 6,452,671 B1 | 9/2002 | Uda et al. | |
| 6,494,371 B1 | 12/2002 | Rekow et al. | 235/454 |
| 6,522,390 B2 | 2/2003 | Suzuki et al. | |
| 6,529,686 B2 | 3/2003 | Ramanan et al. | |
| 6,530,687 B1 | 3/2003 | Suzuki et al. | |
| 6,531,681 B1 | 3/2003 | Markle et al. | 219/121.8 |
| 6,534,752 B2 | 3/2003 | Camm et al. | 219/497 |
| 6,536,131 B2 | 3/2003 | Davis | 34/58 |
| 6,541,287 B2 | 4/2003 | Ino et al. | |
| 6,561,796 B1 | 5/2003 | Barrera et al. | 432/5 |
| 6,564,166 B1 | 5/2003 | Ume et al. | |
| 6,592,252 B2 | 7/2003 | Baba | |
| 6,594,446 B2 | 7/2003 | Camm et al. | 392/416 |
| 6,608,967 B1 | 8/2003 | Arrison | 392/407 |
| 6,609,909 B2 | 8/2003 | Aoki et al. | 432/258 |
| 6,610,968 B1 | 8/2003 | Shajii et al. | 219/497 |
| 6,613,685 B1 | 9/2003 | Granneman et al. | 438/710 |
| 6,621,199 B1 | 9/2003 | Parfeniuk et al. | 313/231.51 |
| 6,634,882 B2 | 10/2003 | Goodman | 432/253 |
| 6,645,356 B1 * | 11/2003 | Woodruff et al. | 204/242 |
| 6,669,783 B2 | 12/2003 | Sexton et al. | 118/728 |
| 6,702,302 B2 | 3/2004 | Smedt et al. | 279/106 |
| 6,752,625 B1 | 6/2004 | Aschner et al. | 432/253 |
| 6,798,142 B2 | 9/2004 | Eguchi | |
| 6,849,831 B2 | 2/2005 | Timans et al. | 219/390 |
| 6,855,916 B1 | 2/2005 | Matthews et al. | 219/390 |
| 6,859,616 B2 | 2/2005 | Kusuda et al. | 392/416 |
| 6,885,815 B2 | 4/2005 | Kusuda et al. | 392/416 |
| 6,887,317 B2 * | 5/2005 | Or et al. | 118/728 |
| 6,897,130 B2 | 5/2005 | Miyauchi et al. | 438/502 |
| 6,938,649 B2 | 9/2005 | Nakazawa | 141/7 |
| 6,941,063 B2 | 9/2005 | Camm et al. | 392/416 |
| 6,953,338 B2 | 10/2005 | Kreiser et al. | 432/259 |
| 6,963,692 B2 | 11/2005 | Camm et al. | 392/416 |
| 6,970,644 B2 | 11/2005 | Koren et al. | |
| 6,987,240 B2 | 1/2006 | Jennings et al. | 219/121.8 |
| 6,998,580 B2 | 2/2006 | Kusuda et al. | 219/411 |
| 7,002,363 B2 | 2/2006 | Mathieu | 324/758 |
| 7,005,601 B2 | 2/2006 | Jennings | 219/121.66 |
| 7,070,660 B2 | 7/2006 | Keeton et al. | 118/725 |
| 7,143,005 B2 | 11/2006 | Dahlen et al. | |
| 7,184,657 B1 | 2/2007 | Camm et al. | 392/418 |
| 7,616,872 B2 | 11/2009 | Camm et al. | |
| 7,700,467 B2 | 4/2010 | Bu et al. | |
| 7,955,074 B2 | 6/2011 | Jin et al. | |
| 8,073,316 B2 | 12/2011 | Nakagawa | |
| 8,138,456 B2 | 3/2012 | Fukuda et al. | |
| 8,242,417 B2 | 8/2012 | Tadokoro et al. | |
| 2001/0013684 A1 | 8/2001 | Smedt et al. | |
| 2001/0047990 A1 | 12/2001 | Yoo | 219/411 |
| 2002/0000547 A1 | 1/2002 | Yamaguchi | |
| 2002/0066859 A1 | 6/2002 | Ino et al. | |
| 2002/0080850 A1 | 6/2002 | Baba | |
| 2002/0096169 A1 * | 7/2002 | Gabelmann | 126/39 R |
| 2002/0102098 A1 | 8/2002 | Camm et al. | |
| 2003/0022402 A1 | 1/2003 | Takano | |
| 2003/0081945 A1 | 5/2003 | Kusuda | 392/416 |
| 2003/0196993 A1 | 10/2003 | Jennings | 219/121.8 |
| 2004/0105670 A1 | 6/2004 | Kusuda et al. | 392/418 |
| 2004/0178553 A1 | 9/2004 | Camm et al. | |
| 2005/0018196 A1 | 1/2005 | Kusuda | 356/448 |
| 2005/0062388 A1 | 3/2005 | Camm et al. | 313/231.71 |
| 2005/0063448 A1 | 3/2005 | Kusuda | 374/1 |
| 2005/0063453 A1 | 3/2005 | Camm et al. | 374/161 |
| 2005/0133167 A1 | 6/2005 | Camm et al. | 156/345.51 |
| 2005/0179354 A1 | 8/2005 | Camm et al. | 313/231.51 |
| 2005/0284371 A1 | 12/2005 | McFadden | |
| 2006/0096677 A1 | 5/2006 | Camm et al. | 148/565 |
| 2006/0201927 A1 | 9/2006 | Gat et al. | |
| 2006/0228897 A1 | 10/2006 | Timans | |
| 2006/0291835 A1 | 12/2006 | Nozaki et al. | |
| 2007/0069161 A1 | 3/2007 | Camm et al. | 250/504 |
| 2008/0157452 A1 | 7/2008 | Camm et al. | 269/55 |

FOREIGN PATENT DOCUMENTS

| | | | |
|---|---|---|---|
| EP | 0 399 662 A2 | 11/1990 | H01L 21/00 |
| EP | 0446425 | 9/1991 | |
| EP | 0 538 874 A1 | 4/1993 | C23C 16/54 |
| EP | 0 576 791 A1 | 1/1994 | H01L 21/00 |
| EP | 0 598 409 A1 | 5/1994 | H01L 21/336 |
| EP | 0 840 360 A2 | 5/1998 | H01L 21/00 |
| EP | 0 942 268 A1 | 9/1999 | G01J 5/00 |
| EP | 1 073 096 A1 | 1/2001 | H01L 21/00 |
| EP | 1557868 | 7/2005 | |
| GB | 938699 | 10/1963 | |
| GB | 2 065 973 A | 7/1981 | H01L 21/268 |
| JP | 55-115327 | 9/1980 | H01L 21/205 |
| JP | 56-048128 | 5/1981 | H01L 21/205 |
| JP | 57-080729 | 5/1982 | H01L 21/324 |
| JP | 57-208146 | 12/1982 | H01L 21/31 |
| JP | 58-070536 | 4/1983 | H01L 21/324 |
| JP | 58-106836 | 6/1983 | H01L 21/324 |
| JP | 59-211221 | 11/1984 | H01L 21/265 |
| JP | 01-246828 | 10/1989 | H01L 21/268 |
| JP | 01-268120 | 10/1989 | H01L 21/268 |

(56) References Cited

FOREIGN PATENT DOCUMENTS

| | | | |
|---|---|---|---|
| JP | 02-294027 | 12/1990 | ............ H01L 21/268 |
| JP | 04-355911 | 12/1992 | ............ H01L 21/205 |
| JP | 5-295543 | 11/1993 | |
| JP | 06-318558 | 11/1994 | .............. H01L 21/26 |
| JP | 07-058040 | 3/1995 | |
| JP | 07-058041 | 3/1995 | |
| JP | 07-245274 | 9/1995 | .............. H01L 21/26 |
| JP | 08-45922 A | 2/1996 | |
| JP | 08-107113 | 4/1996 | ............ H01L 21/324 |
| JP | 08-261967 | 10/1996 | .............. G01N 25/18 |
| JP | 09-126913 A | 5/1997 | |
| JP | HEI-09-293684 A | 11/1997 | ............ H01L 21/22 |
| JP | HEI-10-050629 A | 2/1998 | ............ H01L 21/01 |
| JP | 10-110977 | 4/1998 | ................ F24F 5/00 |
| JP | 11-097371 | 4/1999 | ............ H01L 21/26 |
| JP | 11-316159 | 11/1999 | |
| JP | 2000-058534 | 2/2000 | |
| JP | 2000-323487 | 11/2000 | |
| JP | 2001-126995 | 5/2001 | |
| JP | 2001-522142 A | 11/2001 | |
| JP | 2001-524749 | 12/2001 | |
| JP | 2003-525524 | 8/2003 | |
| JP | 2004-179510 | 6/2004 | |
| JP | 2004-186542 | 7/2004 | |
| JP | 2004-247339 | 9/2004 | |
| JP | 2005-101215 | 4/2005 | |
| JP | 2005-116812 | 4/2005 | |
| JP | 2006-170616 | 6/2006 | |
| JP | 2006-278806 | 10/2006 | |
| JP | 2006-351871 A | 12/2006 | |
| KR | 1999-0020323 | 6/1999 | |
| NO | 32864 | 8/1921 | |
| TW | 465000 | 11/2001 | |
| TW | 526580 | 4/2003 | |
| TW | 556283 | 10/2003 | |
| WO | WO 87/05054 | 8/1987 | ............ C23C 16/48 |
| WO | WO 91/10873 | 7/1991 | ................ F27B 5/14 |
| WO | WO 94/01982 | 1/1994 | ................ H05B 3/00 |
| WO | WO 99/23691 A2 | 5/1999 | |
| WO | WO 99/41777 | 8/1999 | ............ H01L 21/20 |
| WO | WO 99/58733 | 11/1999 | ............ H01L 21/00 |
| WO | WO 99/60184 | 11/1999 | ............ C23C 14/50 |
| WO | WO 00/58700 | 5/2000 | |
| WO | WO 00/67298 | 11/2000 | ............ H01L 21/00 |
| WO | WO 01/56064 | 8/2001 | ............ H01L 21/00 |
| WO | WO 02/47123 | 6/2002 | ............ H01L 21/00 |
| WO | WO 02/47143 | 6/2002 | ............ H01L 21/324 |
| WO | WO 02/075264 | 9/2002 | |
| WO | WO 03/060447 | 7/2003 | ................ G01J 5/10 |
| WO | WO 2004/057650 | 7/2004 | ............ H01L 21/00 |
| WO | WO 2005/029014 | 3/2005 | ................ H03K 3/00 |
| WO | WO 2005/059991 | 6/2005 | ............ H01L 21/68 |
| WO | WO 2005/078762 | 8/2005 | .............. H01J 61/00 |
| WO | WO 2008/058397 | 5/2008 | |

OTHER PUBLICATIONS

Combined International Search Report and Written Opinion for commonly owned PCT application No. PCT/CA2007/002070 (publication No. WO 2008/058397).
Office Action mailed Jun. 9, 2006 in connection with commonly owned U.S. Appl. No. 11/018,388.
Office Action mailed Oct. 25, 2006 in connection with commonly owned U.S. Appl. No. 11/018,388.
Office Action mailed Mar. 30, 2007 in connection with commonly owned U.S. Appl. No. 11/018,388.
Office Action mailed Oct. 16, 2007 in connection with commonly owned U.S. Appl. No. 11/018,388.
Office Action mailed Mar. 18, 2008 in connection with commonly owned U.S. Appl. No. 11/018,388.
Notice of Allowance mailed Sep. 29, 2008 in connection with commonly owned U.S. Appl. No. 11/018,388.

British Stainless Steel Association, "Maximum service temperatures in air for stainless steels", author unknown, published at http://www.bssa.org.uk/topics.php?article=42, as of Sep. 13, 2010, earliest publication date unknown.
British Stainless Steel Association, "Melting temperature ranges for stainless steels", author unknown, published at http://www.bssa.org.uk/topics.php?article=103, as of Sep. 13, 2010, earliest publication date unknown.
International Preliminary Report on Patentability for PCT/CA2004/002155, mailed Jun. 29, 2006.
International Search Report dated Sep. 1, 2009, for International Application No. PCT/CA2009/000681.
International Search Report for International Application No. PCT/CA02/01987, mailed on Jun. 10, 2003.
Office Action mailed Aug. 12, 2008 in connection with commonly owned U.S. Appl. No. 11/302,600.
Office Action mailed Aug. 21, 2006 in connection with commonly owned U.S. Appl. No. 10/497,447.
Office Action mailed Feb. 21, 2007 in connection with commonly owned U.S. Appl. No. 10/497,447.
Office Action mailed May 19, 2006 in connection with commonly owned U.S. Appl. No. 10/497,447.
Xu et al. "Measurement of Solid-Liquid Interface Temperature During Pulsed Excimer Laser Melting of Polycrystalline Silicon Films," Applied Physical Letters, vol. 65, No. 14, pp. 1745-1747, Oct. 3, 1994.
Search Report completed Nov. 15, 2011 and issued to Taiwanese patent application 093139109.
Blake, J., et al., "Slip Free Rapid Thermal Processing", Mat. Res. Soc. Symp. Proc., vol. 92, p. 265-272 (1987).
Bomke, H. A., et al., "Annealing of Ion-Implanted Silicon by an Incoherent Light Pulse," Appl. Phys. Lett., vol. 33, No. 11, pp. 955-957, Dec. 1, 1978.
Burggraaf, P. S., "Rapid Wafer Heating: Status 1983," Semiconductor International, pp. 69-74, Dec. 1983.
Camm, D. M., et al. "2D Real Time Temperature Measurements in a New Short Wavelength Arc Lamp RTP Chamber for Improved Uniformity", Proc. 3rd Int. RTP Conf., RTP'95 p. 241 (Round Rock Texas) (1995).
Camm, D. M, et al., "Engineering Ultra-Shallow Junctions Using fRTP™", 10th IEEE International Conference on Advanced Thermal Processing of Semiconductors—RTP 2002, pp. 5-10 (2002).
Camm, D. M., et al., "High Power Arc Lamp RTP System for High Temperature Annealing Applications", Proc. 2nd Int. RTP Conf., RTP'94, p. 259 (Round Rock Texas) (1994).
Camm, D. M., et al., "Spike Thermal Processing Using Arc Lamps," Advances in Rapid Thermal Processing, (2000).
Celler, G. K., et al., "Drift of Arsenic in SiO2 in a Lamp Furnace with a Built-in Temperature Gradient", Mat. Res. Soc. Symp. Proc., vol. 92, p. 53-58 (1987).
Chen, M. M., et al., "The Use of a Kaleidoscope to Obtain Uniform Flux Over a Large Area in a Solar or Arc Imaging Furnace," Applied Optics,|vol. 2, No. 3, pp. 265-271, Mar. 1963.
Cibere, J. J, et al., "Flash Thermal Processing Through the Melting Point of Silicon", 11th IEEE International Conference on Advanced Thermal processing of Semiconductors—RTP 2003 (2003).
Cohen, R. L., et al., "Thermally Assisted Flash Annealing of Silicon and Germanium", Appl. Phys. Lett. vol. 33, No. 8, pp. 751-753, Oct. 1978.
Current, M., et al., "Ion Implantation and Rapid Annealing of 125 mm Wafers," Solid State Technology, pp. 197-202, Oct. 1983.
Dilhac, J-M., et al., "Adaptive Process Control for a Rapid Thermal Processor", SPIE vol. 1393, Rapid Thermal and Related Processing Techniques, p. 395-403 (1990).
Dilhac, J-M., et al, "Thermal Model for Rapid Thermal Processors: Theory and Applications", RTP '93 Conference Proceedings, pp. 12-18 (1993).
Fair, R. B., "Rapid Thermal Processing—A Justification", in Fair, R. B., ed., *Rapid Thermal Processing: Science and Technology* (Boston: Academic Press, Inc., 1993), pp. 1-11.
Fan, J. C. C., et al., "Transient Heating with Graphite Heaters for Semiconductor Processing," in Appleton, B. R. et al., ed., *Laser and Electron-Beam Interactions with Solids: Proceedings of the Mate-*

(56) References Cited

OTHER PUBLICATIONS

*rials Research Society Annual Meeting*, Nov. 1981, Boston (New York: North Holland / Elsevier, 1982), pp. 751-758.
Fiory, A. T., et al., "Annealing Ultra-Low Energy Boron Implants with an Arc Lamp System," RTP 1999, pp. 273-280 (1999).
Fiory, A. T., et al., "Electrical Measurements of Annealed Boron Implants for Shallow Junctions," Advances in Rapid Thermal Processing, vol. 99-10, pp. 133-140, (1999).
Fiory, A. T., et al., "Spike Annealing of Implanted PMOS Gates," Proc. of RTP 2000 Conference, pp. 1-8, Sep. 20-22, 2000.
Gat, A., et al. "Introduction to Heatpulse™ Processing Technology," AG Associates, Mountain View, California, pp. 1-29.
Gelpey, J. C., et al., "Advanced Annealing for Sub-130nm Junction Formation", 201st Electrochemical Society Meeting, Symposium Q1, Rapid Thermal and Other Short-Time Processing Technologies III, May 12-17, 2002, paper 735 (May 2002).
Gelpey, J. C., et al., "Process Control for a Rapid Optical Annealing System," Mat. Res. Soc. Symp. Press, vol. 52 (1986).
Gelpey, J. C., et al., "Rapid Optical Annealing Using the Water-Wall DC Arc Lamp," Microelectronic Manufacturing and Testing, pp. 22-24, Aug. 1983.
Hill, C., et al., "Rapid Thermal Annealing—Theory and Practice", in Levy, R. A., ed., *Reduced Thermal Processing for ULSI* (New York: Plenum, 1989), pp. 143-180.
Hirscher, H., "Electrostatic Chuck to Boost your Yield", Unaxis Wafer Processing, Chip Online, Issue No. 5, pp. 39-43, undated.
Kakoschke, R., "Is There a Way to a Perfect Rapid Thermal Processing System?", Mat. Res. Soc. Symp. Proc., vol. 224, p. 159-170 (1991).
Kakoschke, R., et al., "Simulation of Temperature Effects During Rapid Thermal Processing", Mat. Res. Soc. Symp. Proc., vol. 146, p. 473-482 (1989).
Kapany, N. S., et al., "Fiber Optics. Part II. Image Transfer on Static and Dynamic Scanning with Fiber Bundles," Journal of the Optical Society of America, vol. 47, No. 5, pp. 423-427, May 1957.
Klabes, R., et al., "Pulsed Incoherent Light Annealing of Arsenic and Phosphorus Implanted Polycrystalline Silicon," Physica Status Solidi, pp. K5-7, K9-12 (1982).
Lefrancois, M. E., et al., "Emissivity Independent Process Control in a Short Wavelength Arc Lamp RTP Chamber", in *MRS Symposium Proceedings*, vol. 429, Rapid Thermal and Integrated Processing V (Pittsburgh, 1996), p. 321.
Lefrancois, M., et al., "Temperature Uniformity During Impulse™ Anneal," 8th International Conference on Advanced Thermal Processing of Semiconductors, RTP 2000, pp. 1-6, Sep. 20-22, 2000.
Lietoila, A., et al., "Temperature Rise Induced in Si by Continuous Xenon Arc Lamp Radiation," American Institute of Physics, vol. 53, No. 2, pp. 1169-1172, Feb. 1982.
Lischner, D. J., et al., "Rapid Large Area Annealing of Ion-Implanted Si with Incoherent Light," in Appleton, B. R. et al., ed., *Laser and Electron-Beam Interactions with Solids: Proceedings of the Materials Research Society Annual Meeting*, Nov. 1981, Boston (New York: North Holland / Elsevier, 1982), pp. 759-764.
Lojek, B., "Issues in Manufacturing Unique Silicon Devices Using Rapid Thermal Annealing", in Fair, R. B., ed., *Rapid Thermal Processing: Science and Technology* (Boston: D61Academic Press, Inc., 1993), pp. 311-347.
Lord, H. A., "Thermal and Stress Analysis of Semiconductor Wafers in a Rapid Thermal Processing Oven", IEEE Transactions on Semiconductor Manufacturing, vol. 1, No. 3, p. 105-114 (Aug. 1988).
Lue, J. T., "Arc Annealing of BF+2 Implanted Silicon by a Short Pulse Flash Lamp," Appl. Phys. Lett., vol. 36, No. 1, pp. 73-76, Jan. 1, 1980.
Myer, J. H., "Zoomable Kaleidoscopic Mirror Tunnel," Applied Optics, vol. 10, No. 9, pp. 2179-2182, Sep. 1971.
Nishiyama, K., et al., "Radiation Annealing of Boron-Implanted Silicon with a Halogen Lamp," Japanese Journal of Applied Physics, vol. 19, No. 10, pp. L563-L566, Oct. 1980.

Nulman, J., et al., "Pyrometric Emissivity Measurements and Compensation in an RTP Chamber", Mat. Res. Soc. Symp. Proc., vol. 146, p. 461-466 (1989).
Potter, R. J., "Transmission Properties of Optical Fibers," Journal of the Optical Society of America, vol. 51, No. 10, pp. 1079-1089, Oct. 1961.
Powell, R. A., et al., "Activation of Arsenic-Implanted Silicon Using an Incoherent Light Source," Appl. Phys. Lett., vol. 39, No. 2, pp. 150-152, Jul. 15, 1981.
Powell, R. A., et al., "Annealing of Implantation Damage in Integrated-Circuit Devices Using an Incoherent light Source," J. Vac. Sci. Technol., vol. 20, No. 1, pp. 32-36, Jan. 1982.
Riccardi, A., et al., "The Adaptive Secondary Mirror for the 6.5m Conversion of the Multiple Mirror Telescope", Beyond Conventional Adaptive Optics, Venice, 2001.
Roozeboom, F., "Manufacturing Equipment Issues in Rapid Thermal Processing", in Fair, R. B., ed., *Rapid Thermal Processing: Science and Technology* (Boston: Academic Press, Inc., 1993), pp. 349-423.
Ross, J., et al., "Characterizing Implant Behavior During Flash RTP by Means of Backside Diagnostics", 10th IEEE International Conference on Advanced Thermal Processing of Semiconductors—RTP 2002, pp. 99-105 (2002).
Sedgwick, T.O., "Short Time Annealing," J. Electrochem. Soc., vol. 130, No. 2, pp. 484-492, Feb. 1983.
Semco Engineering, "Smart Solutions for . . . Single Wafer Clamping", as available from http://www.semcoeng.com/Pilot01/Rubrique/Index.php3?IdTheme=6&IdPage=24 on Jul. 11, 2006 (undated).
Semiconductor Industry Association, "International Technology Roadmap for Semiconductors," International Sematech, Austin Texas, pp. 7, 14, 123-131, (1999).
Service Support Specialties, "Hot Plates", as available from http://www.s-cubed.com/pdf/StandAloneHP.pdf on Jul. 11, 2006.
Sheets, R. E., "Automatic Cassette to Cassette Radiant Impulse Processor," Nuclear Instruments and Methods in Physics Research, Amsterdam, North Holland / Elsevier Science Publishers B.V., pp. 219-223 (1985).
Stuart, G. C., et al., "Temperature Diagnostics for a Dual-Arc FRTP Tool", 10th IEEE International Conference on Advanced Thermal Processing of Semiconductors—RTP 2002—pp. 77-82 (2002).
Sumitomo Osaka Cement Co., Ltd., Advanced Materials Research Division, "Characteristics of fine Al2—O3—SiC Composite ESC", Technical Report, 1999.
Tamarack Scientific Company, "Transient Calorimeter Calibration System," Technical Report AFFDL-TR-75-24, Orange, California, pp. 1-50, Mar. 1975.
Tichy, R. S., et al., "Annealing of Ultra-Shallow Implanted Junctions Using Arc-Lamp Technology: Achieving the 90 nm Node", 9th IEEE International Conference on Advanced Thermal Processing of Semiconductors—RTP 2001 (Sep. 2001).
Tillmann, A., et al., "Processing of 200 and 300 mm Wafers in an Advanced Rapid Thermal Processing System", Proc. RTP 1998, 6th International Conference on Advanced Thermal Processing of Semiconductors, Kyoto, Japan, 1998, pp. 62-63 (1998).
Vandenabeele, P., et al., "Impact of Patterned Layers on Temperature Non-Uniformity During Rapid Thermal Processing for VLSI-Applications", Mat. Res. Soc. Symp. Proc., vol. 146, p. 149-160 (1989).
Varian, Extrion Division Semiconductor Equipment Group, "RTP-800 Rapid Thermal Processor," pp. 1-6, Dec. 1985.
Von Gutfeld, R. J., "Crystallization of Silicon for Solar Cell Applications," IBM Technical Disclosure, vol. 19, IBM Corp., pp. 3955-3956, Mar. 1977.
Williamson, D. E., "Cone Channel Condenser Optics," Journal of the Optical Society of America, vol. 42, No. 10, pp. 712-715, Oct. 1952.
Wilson, S. R. et al., "An Overview and Comparison of Rapid Thermal Processing Equipment: A User's Viewpoint", Mat. Res. Soc. Symp. Proc., vol. 52, p. 181-190 (1986).

* cited by examiner

METHODS AND SYSTEMS FOR SUPPORTING A WORKPIECE AND FOR HEAT-TREATING THE WORKPIECE

CROSS-REFERENCE TO RELATED APPLICATIONS

This application claims the benefit of priority from U.S. patent application Ser. No. 60/434,670 filed Dec. 20, 2002, and from U.S. provisional patent application Ser. No. 60/468,659 filed May 8, 2003, both of which are hereby incorporated herein by reference.

BACKGROUND OF THE INVENTION

1. Field of Invention

The present invention relates to methods and apparatuses for supporting a workpiece, and also relates to methods and apparatuses for heat-treating a workpiece.

2. Description of Related Art

Numerous applications require a workpiece to be supported. For example, in the manufacture of semiconductor chips such as microprocessors, the workpiece typically includes a semiconductor wafer, which must be supported in a thermal processing chamber for annealing or other heat-treating processes. The wafer is normally supported in the chamber by either a plurality of support pins (typically quartz), or alternatively, by a guard ring (typically formed of a semiconductor material similar to that of the wafer itself). Due to the fact that physical contact between the support pins or ring can cause thermal gradients in the wafer during thermal processing, thereby damaging either the crystal lattice of the wafer or devices in the wafer, the pins or guard ring in many typical systems contact the wafer only at its outer edges, within the confines of a narrow "exclusion zone" or waste zone, which is not used to produce semiconductor chips. The exclusion zone extends radially inward for only a small distance (e.g. 3 mm) from the outer circumferential edge of the wafer. However, the support pins in at least some conventional systems contact the wafer at locations other than the exclusion zone. For example, one conventional system employs contact pins that contact the wafer at a distance from the center of the wafer of about two-thirds of the wafer's radius. Thus, although use of the exclusion zone to support the wafer is advantageous for many applications, it is not viewed as essential.

Device size and performance requirements of semiconductor chips are becoming increasingly demanding, with the result that new heat-treating methods are emerging, and existing heat-treating methods are being modified, to attempt to satisfy these evolving requirements. However, conventional methods of supporting the semiconductor wafer may no longer be appropriate for some specific applications of these emerging heat-treating methods.

Examples of such emerging heat-treating methods are disclosed in commonly-owned U.S. Pat. No. 6,594,446 which issued to Camm et al. on Jul. 15, 2003, and commonly-owned U.S. patent application Ser. No. 10/005,186 published on Aug. 1, 2002 as Publication No. US 2002/0102098, both of which are hereby incorporated herein by reference. One such method involves pre-heating the wafer to an intermediate temperature at a rate that is slower than a thermal conduction time through the wafer, so that the entire wafer is heated relatively uniformly to the intermediate temperature. This pre-heating stage may be achieved by irradiating the back-side or substrate side of the wafer with an arc lamp, to heat the wafer at a ramp rate such as 100° C. per second to 400° C. per second, for example. Following the pre-heating stage, the top-side or device side of the wafer is rapidly heated to a substantially higher annealing temperature, at a rate much faster than a thermal conduction time through the wafer, so that only the top-side surface region of the wafer is heated to the final annealing temperature, while the bulk of the wafer remains close to the relatively cooler intermediate temperature. This may be achieved by exposing the top-side surface to a high-power flash from a flash-lamp, for a relatively short duration, on the order of one millisecond, for example. The cooler bulk of the wafer then acts as a heat sink to facilitate rapid cooling of the top-side surface.

Other annealing methods, which do not necessarily involve any pre-heating stage, include rapidly heating the device side surface of the wafer to the annealing temperature using excimer lasers or a microwave pulse, for example, while the bulk of the wafer remains at a much lower temperature. One variation of such a method involves scanning a laser line across the surface of the workpiece, to rapidly heat the area of the workpiece covered by the line as it scans.

However, the present inventors have discovered that certain specific implementations of such annealing methods may give rise to special problems and difficulties that have not been previously discovered or appreciated. In particular, the present inventors have discovered that conventional methods of supporting a workpiece may not be suitable for some applications of these annealing methods, as discussed in greater detail herein.

Accordingly, there is a need for an improved method and system for supporting a workpiece. There is also a need for an improved method of heat-treating a workpiece which assists in addressing the difficulties discussed herein.

SUMMARY OF THE INVENTION

Annealing methods such as those referred to above, which involve rapidly heating the device side of the wafer to a substantially higher temperature than the bulk of the wafer, cause the device side to thermally expand at a greater rate than the rest of the wafer. The present inventors have discovered that, depending on the magnitude of the temperature difference between the device side temperature and the temperature of the bulk of the wafer, this may tend to cause "thermal bowing", whereby the normally-planar wafer deforms itself into a dome-shape, with the center of the wafer tending to rapidly rise relative to its edge regions. The dome shape represents a minimum stress configuration of the wafer, minimizing the thermal stress resulting from the temperature gradient between the device side and the bulk of the wafer. However, due to the extreme rapidity at which the device side of the wafer is heated (in the course of a 1-millisecond flash, for example, much faster than a typical thermal conduction time in the wafer), the deformation of the wafer may occur sufficiently rapidly that the edges of the wafer apply a large downward force onto the support pins that support the wafer in the chamber. As conventional support pins are typically rigid, the resulting reaction force between the pins and the edges of the wafer may damage the wafer. Such forces may also cause the wafer to launch itself vertically upward from the support pins, which may result in further damage to the wafer as the wafer falls back down and strikes the pins. Also, as conventional support pins are not designed to withstand such forces, they tend to break, with the result that the wafer falls in the chamber and is damaged or destroyed. In addition, due to the rapidity at which such thermal bowing occurs, the initial velocities imparted to the various regions of the wafer tend to cause the wafer to overshoot the equilibrium minimum stress dome shape and oscillate or vibrate, resulting in additional stress and potential damage to the wafer.

The magnitude of such thermally-induced motion of the workpiece tends to increase in proportion to the magnitude of the temperature jump, i.e. the temperature difference between the intermediate temperature to which the wafer as a whole is heated, and the subsequent temperature to which only the device side is much more rapidly heated. Thus, the use of conventional support systems employing rigid fixed support pins or rings imposes undesirable limitations on the magnitude of the temperature jump that can be achieved without damaging or breaking the wafer.

The present invention addresses the above needs by providing, in accordance with a first aspect of the invention, a method of supporting a workpiece. The method includes supporting the workpiece while allowing thermally-induced motion of the workpiece. Advantageously, by allowing the thermally-induced motion rather than attempting to prevent it, the workpiece is allowed to naturally deform into a stress-minimizing shape, thereby reducing stress in the workpiece. At the same time, by continuing to support the workpiece while allowing such thermally-induced motion, the workpiece is maintained in a desired region.

Supporting may include engaging a moveable engagement portion of a support member with the workpiece, the engagement portion being moveable to allow the thermally-induced motion of the workpiece while supporting the workpiece.

In one important application of the invention, the workpiece includes a semiconductor wafer. Thus, engaging may include engaging the moveable engagement portion of the support member with a semiconductor wafer to allow thermally-induced motion of the wafer while supporting the wafer.

The method may include automatically allowing motion of the engagement portion in response to the thermally-induced motion of the workpiece.

Allowing the thermally-induced motion may include allowing motion of the engagement portion to minimize stress in the workpiece while supporting the workpiece during the thermally-induced motion.

Allowing the thermally-induced motion may include allowing motion of outer regions of the workpiece while maintaining a center of mass of the workpiece in a desired range. Maintaining may include minimizing motion of the center of mass of the workpiece.

Allowing the thermally-induced motion of the workpiece may include allowing thermal bowing of the workpiece. Alternatively, this may include allowing thermal bending of the workpiece, for example.

Engaging may include engaging with the workpiece, as the engagement portion, a portion of a rigid moveable support member.

The support member may be flexible and may have a constrained portion and an unconstrained portion, in which case engaging may include engaging the unconstrained portion with the workpiece.

Engaging may include resiliently engaging the moveable engagement portion of the support member with the workpiece. Advantageously in such embodiments, when thermal bowing of the workpiece occurs, the outer edge of the workpiece may press down on the resiliently engaged moveable engagement portion, causing the engagement portion to move downward with the edge of the workpiece, and to resiliently rise back up with the outer edge of the workpiece as the workpiece returns toward its original shape. Such resilient support allows the workpiece to thermally bow, thereby reducing its internal stress, while reducing or eliminating the tendency of the wafer to launch itself upward from the engagement portion at the commencement of the bowing motion.

Engaging may include engaging a plurality of moveable engagement portions of a plurality of respective support members with the workpiece. For example, engaging may include engaging at least three moveable engagement portions of at least three respective support members with the workpiece. Similarly, engaging may include engaging at least four moveable engagement portions of at least four respective support members with the workpiece.

The method may further include suppressing vibration of the workpiece. Suppressing may include suppressing at least one natural vibration mode of the workpiece. This may include suppressing a second natural vibration mode of the workpiece, or may include suppressing a first natural vibration mode of the workpiece, for example.

Suppressing may include absorbing kinetic energy from the workpiece.

Engaging may include engaging a plurality of tips of a plurality of respective support pins with the workpiece. This may include engaging the tips of the support pins with an outer perimeter zone of the workpiece. In such a case, the method may further include automatically allowing motion of the tips of the support pins in response to thermally-induced motion of the outer perimeter zone of the workpiece.

Engaging may include resiliently engaging each of the moveable engagement portions with the workpiece. This may include applying a force to each of the support members to cause each engagement portion to tend to maintain contact with the workpiece during the thermally-induced motion of the workpiece.

Applying a force may include applying a torque to each of the support members. Applying a torque may include applying an upward force at a location on each support member interposed between a pivot point of the support member and the engagement portion. Alternatively, applying a torque may include applying a downward force at a location on each support member such that a pivot point of the support member is interposed between the location and the engagement portion.

Applying a force may include applying first and second forces to apply first and second opposing torques to each of the support members, the second torque acting to oppose overshoot by the support member of an equilibrium position thereof.

Applying a force may include applying a spring force. This may include applying the force with a spring connected to each of the support members. For example, this may include applying a constant force with a constant force spring connected to each of the support members.

Engaging may include engaging, with the workpiece, a plurality of tips of a plurality of respective support pins including material that is trans parent to at least some irradiance wavelengths with which the workpiece is capable of being irradiance-heated. Thus, for example, engaging may include engaging, with the workpiece, a plurality of tips of a plurality of respective support pins including optically transparent material.

Engaging may include engaging, with the workpiece, a plurality of tips of a plurality of respective support pins including quartz. Alternatively, the support pins may include sapphire, or may include metal. For example, the support pins may include tungsten.

Engaging may include engaging, with the workpiece, a plurality of coated tips of a plurality of respective support pins with the workpiece. This may include, for example, engaging a plurality of tungsten nitride coated tips of a plurality of respective tungsten support pins with the workpiece. Alternatively, the tips may be tungsten carbide coated, for example.

Engaging may include engaging a plurality of smooth-surfaced tips of a plurality of respective support pins with the workpiece. Advantageously, such smooth-surfaced tips tend to reduce friction between the support pins and the workpiece. This in turn reduces the likelihood of scratching the workpiece, thereby avoiding particulate contamination, or undesirable roughening of the surface of the workpiece. Reducing friction may also assist in reducing stress in the workpiece. Such smooth-surfaced tips may include melted, polished, or coated tips, for example.

The method may further include moving the moveable engagement portions in response to the thermally-induced motion of the workpiece. Moving the moveable engagement portions may include moving the support members. This may include, for each of the support members, applying an electric current to an actuator connected to the support member. Applying an electric current may include applying an electric current to a voice-coil actuator connected to the support member. Alternatively, this may include applying an electric current to a piezoelectric actuator or a linear servo actuator connected to the support member.

The method may further include translating a linear motion of a moveable member of the actuator into an arcuate motion of the support member.

Moving may include adjusting positions of the plurality of support members to minimize a difference between a weight of the workpiece and an upward force applied to the workpiece by the plurality of engagement portions of the plurality of support members. Advantageously, in such embodiments, the upward force supplied by the support member to the workpiece is approximately sufficient to balance the force of gravity acting downward on the workpiece, but is not appreciably greater. This further reduces the tendency of the workpiece to launch itself.

Moving may include adjusting positions of the support members to maintain a difference between a weight of the workpiece and an upward force applied to the workpiece by the engagement portions of the support members within a desired range.

Moving the engagement portions in response to the thermally-induced motion may include moving the support members in response to a predicted value of the thermally-induced motion.

Alternatively, moving the engagement portions in response to the thermally-induced motion may include moving the support members in response to a detected parameter of the thermally-induced motion.

Thus, the method may further include detecting the thermally-induced motion of the workpiece. Detecting may include detecting, in each of a plurality of actuators each of which is connected to a respective one of the plurality of support members, an electric current resulting from a force applied to the engagement portion of the support member by the motion of the workpiece.

Moving the engagement portions may include applying an electric current to each of the actuators.

Detecting the electric current may include detecting the current in each of a plurality of voice-coil actuators each of which is connected to a respective one of the support members, and moving the engagement portions may include applying electric currents to the voice-coil actuators.

Detecting the electric current may include, for each actuator, detecting a deviation of the electric current from a desired electric current level, and moving the engagement portions may include, for each support member, adjusting a position of the support member to minimize the deviation. Detecting the deviation may include detecting the deviation at a processor circuit in communication with the actuator.

Engaging may include engaging a first plurality of moveable engagement portions of a first plurality of respective support members with a lower surface of the workpiece and engaging a second plurality of engagement portions of a second plurality of support members with an upper surface of the workpiece. This may include engaging the first and second pluralities of engagement portions with the lower and upper surfaces of the workpiece at an outer perimeter zone of the workpiece.

Moving may include moving the engagement portions to minimize forces applied between the workpiece and the engagement portions. For example, moving may include moving a first plurality of engagement portions of a first plurality of respective support members engaged with a lower surface of the workpiece to minimize a difference between a weight of the workpiece and a force applied between the first plurality of engagement portions and the workpiece. Likewise, moving may include moving a second plurality of engagement portions of a second plurality of support members engaged with an upper surface of the workpiece to minimize a force applied between the workpiece and the second plurality of engagement portions.

If desired, a combined passive/active support method may be employed. For example, engaging may include resiliently engaging the engagement portions of the support members with the workpiece, and moving may include moving the support members in response to the thermally-induced motion. Resiliently engaging may include applying torques to the support members about respective pivot points thereof to cause the engagement portions to tend to maintain contact with the workpiece, and moving may include moving the pivot points of the support members. Applying torques may include applying spring forces to the support members at locations other than the pivot points thereof, and moving may include applying electric currents to a plurality of actuators connected to the plurality of support members to move the support members. The plurality of support members may include a plurality of flexible support members, each having a constrained portion and an unconstrained portion. In such a case, resiliently engaging may include resiliently engaging the unconstrained portions of the flexible support members with the workpiece, and moving may include moving the constrained portions of the support members. Moving may include applying electric currents to a plurality of actuators connected to the plurality of constrained portions.

More generally, the plurality of support members may include a plurality of flexible support members each having an unconstrained portion and a constrained portion, and engaging the plurality of moveable engagement portions may include engaging the unconstrained portions of the flexible support members with the workpiece.

The plurality of flexible support members may include a plurality of fibers, and engaging may include engaging the unconstrained portions of the fibers with the workpiece. For example, the flexible support members may include optical fibers such as quartz fibers or sapphire fibers.

The method may further include constraining each of the constrained portions of the flexible support members.

Constraining may include constraining the constrained portions in a plurality of constrainers disposed around an outer perimeter of the workpiece.

The plurality of constrainers may consist of fewer constrainers than the number of the flexible support members, and constraining may include constraining more than one of the flexible support members in each of the constrainers. This may include, in each of the constrainers, constraining the more than one of the flexible support members generally parallel to each other. Alternatively, this may include constraining the more than one of the flexible support members generally divergent from each other.

Alternatively, the plurality of constrainers may consist of the same number of constrainers as the number of the flexible support members, in which case constraining may include constraining each of the constrained portions in a respective corresponding one of the constrainers.

Engaging may include applying a force to each of the constrainers to cause each of the unconstrained portions to tend to maintain contact with the workpiece during the thermally-induced motion of the workpiece. Applying a force may include applying a torque. This may include applying a spring force.

Engaging may include engaging each of the engagement portions with a lower surface of the workpiece at an angle of 10 to 80 degrees relative to a plane of the workpiece. More particularly, this may include an angle of 15 to 35 degrees relative to a plane of the workpiece. More particularly still, this may include an angle of 25 degrees relative to a plane of the workpiece.

Each of the flexible support members may include the constrained portion at an end thereof, and constraining may include constraining the constrained portion to cause the unconstrained portion to extend inwardly toward a central region of the workpiece.

An inner tip of the each of the unconstrained portions may extend inwardly past an outer edge of the workpiece, and engaging may include engaging, with the outer edge of the workpiece, an intermediate point along the unconstrained portion between the constrained portion and the inner tip.

Constraining may include constraining the constrained portions in a workpiece plane plate surrounding the workpiece. Constraining may include clamping.

Constraining each of the constrained portions may include affixing the constrained portion to the workpiece plane plate with the unconstrained portion extending inwardly toward the workpiece through a workpiece support aperture defined in the plate.

Constraining may include constraining the constrained portions in a generally horizontal direction to cause the unconstrained portions to extend generally horizontally inwardly toward the central region of the workpiece while downwardly sagging.

Engaging may include engaging the unconstrained portions with an outer edge of the workpiece. This may include engaging the unconstrained portions with the outer edge of the workpiece at an angle of less than about 10 degrees downward relative to a plane of the workpiece.

The plurality of flexible support members may include a plurality of elongated flexible support members. The plurality of elongated flexible support members may include at least twenty elongated flexible support members, and constraining may include constraining each of the at least twenty elongated flexible support members in the workpiece plane plate. Similarly, the plurality of elongated flexible support members may include at least fifty elongated flexible support members, and constraining may include constraining each of the at least fifty elongated flexible support members in the workpiece plane plate.

Each of the flexible support members may include first and second constrained portions at opposite ends of the support member defining the unconstrained portion therebetween, and constraining may include constraining the first and second constrained portions in spaced apart relation to cause the unconstrained portion to extend in a curved path therebetween.

Constraining may include constraining the first and second constrained portions to cause the unconstrained portion to extend along the curved path from the first constrained portion upwardly and inwardly toward the workpiece to a region of contact therewith and to extend from the region of contact downwardly and outwardly to the second constrained portion.

Constraining may include constraining the first and second constrained portions to cause the unconstrained portion to extend along the curved path such that a tangent to the unconstrained portion at the region of contact is substantially parallel to a tangent to an outer circumference of the workpiece in the vicinity of the region of contact.

Alternatively, constraining may include constraining the first and second constrained portions to cause the unconstrained portion to extend along the curved path such that a tangent to the unconstrained portion at the region of contact extends radially inward toward a center of the workpiece.

As a further alternative, constraining may include constraining the first and second constrained portions to cause the unconstrained portion to extend along the curved path to form a first generally loop-shaped path segment extending from the first constrained portion below a plane of the workpiece and contacting the workpiece at a lower surface thereof, a second generally loop-shaped path segment extending between an outer edge of the workpiece and an inner edge of a workpiece plane plate, and a third generally loop-shaped path segment extending above the plane of the workpiece and contacting the workpiece at an upper surface thereof, the curved path terminating at the second constrained portion.

The method may further include retracting the second constrained portion to move the third generally loop-shaped path segment out of a volume defined above the upper surface of the workpiece.

Constraining may include affixing the first and second constrained portions to prevent motion of the constrained portions.

Constraining may include retractably constraining at least one of the first and second constrained portions. The method may further include retracting the at least one of the first and second constrained portions to effectively shorten the unconstrained portion. Conversely, the method may further include extending the at least one of the first and second constrained portions to effectively lengthen the unconstrained portion.

The plurality of flexible support members may include first and second pluralities of flexible support members, and engaging the plurality of moveable engagement portions may include engaging the unconstrained portions of the first plurality of flexible support members with a lower surface of the workpiece and engaging the unconstrained portions of the second plurality of flexible support members with an upper surface of the workpiece.

The method may further include laterally supporting the workpiece. Laterally supporting may include positioning a plurality of lateral support members at respective positions relative to an outer edge of the workpiece. Positioning may include resiliently engaging the plurality of lateral support members with the outer edge of the workpiece.

Positioning may include positioning a plurality of flexible fibers at the respective positions. This may include positioning the flexible fibers at an angle substantially normal to a plane of the workpiece.

Engaging and laterally supporting may include engaging a vertical support engagement portion of a support member with a lower surface of the workpiece, and engaging a lateral support engagement portion of the support member with an outer edge of the workpiece.

Engaging and laterally supporting may include engaging a plurality of vertical and lateral support engagement portions of a plurality of respective support members with the workpiece. Engaging and laterally supporting may include resiliently engaging the vertical and lateral support engagement portions with the workpiece. Engaging and laterally supporting may include engaging, as the vertical and lateral support engagement portions, flexible engagement portions. Engaging and laterally supporting may include engaging with the workpiece, as the vertical and lateral support engagement portions, first and second fibers.

Positioning may include positioning a plurality of optical fibers. Similarly, positioning may include positioning a plurality of quartz fibers or sapphire fibers, for example.

In accordance with another aspect of the invention, there is provided a method of heat-treating a workpiece. The method includes heating a surface of the workpiece relative to a bulk of the workpiece to cause the thermally-induced motion of the workpiece. Heating may include irradiating the surface of the workpiece. Irradiating may include irradiating the surface for a time period shorter than a thermal conduction time of the workpiece to heat the surface to a greater temperature than a temperature of the bulk of the workpiece. Irradiating may include irradiating the surface for a time period of less than about 1 millisecond, for example.

Irradiating may include irradiating the surface of the workpiece for a first time period less than the thermal conduction time of the workpiece, to heat the surface to an intermediate temperature greater than that of the bulk of the workpiece. Irradiating may then include irradiating the surface for a second time period less than the thermal conduction time of the workpiece, to heat the surface to the desired temperature greater than the intermediate temperature, wherein the second time period commences within an interval following the first time period sufficient to allow at least some thermal bowing of the workpiece. Advantageously, such a method tends to reduce the magnitude of the initial thermal bowing of the workpiece resulting from the irradiance during the first time period, and the subsequent irradiance during the second time period may assist in suppressing vibration of the workpiece.

Irradiating may include imparting more radiant energy to the surface of the workpiece during the second time period than during the first time period.

Irradiating may include commencing the second time period within several milliseconds following the end of the first time period.

Irradiating may include continuously irradiating the surface of the workpiece for an interval shorter than a thermal conduction time of the workpiece and sufficiently long to allow at least some thermal bowing of the workpiece. Continuously irradiating may include varying an intensity of irradiance during the interval. Varying may include irradiating the surface with a greater intensity during a later portion of the interval than during an earlier portion of the interval. Advantageously, such a method tends to reduce the magnitude of the thermal bowing of the workpiece and suppress subsequent vibration of the workpiece.

Irradiating may include irradiating the surface with a flash lamp.

Advantageously, such heat-treating methods may serve to reduce thermal stress and suppress vibration in the workpiece, by taking advantage of the finding of the present inventors that, depending on the rapidity of the surface heating stage, the thermal bowing of the workpiece may significantly lag the temperature increase itself. For example, in one particular case, where the irradiating for the first time period was achieved by way of a heating flash of approximately one millisecond in duration, a peak temperature of the irradiated surface occurred roughly simultaneously with the end of the flash (t=1 ms). However, at that time, the wafer had only just begun to thermally bow, and had therefore achieved only a relatively small percentage of its maximum thermal bowing amplitude. The maximum thermal bowing amplitude was not achieved until nearly four milliseconds later, at which time the wafer had overshot its equilibrium shape. A short time later, at approximately t=6 ms, the wafer was still significantly bowed but was returning toward its flat position with significant return velocity. In accordance with one embodiment of the aforementioned aspect of the invention, the device side of the wafer is subjected to a second irradiance flash, timed so that the resulting thermal bowing from the second irradiance flash occurs while the wafer is already thermally bowed from the first flash and is returning toward its flat position. The stress in the wafer produced by the thermal bowing resulting from the second flash is diminished, because the wafer is already thermally bowed due to the first flash. The thermal bowing resulting from the second flash also acts in a direction opposite to the existing return velocity of the wafer as it attempts to return toward its flat position. Accordingly, the thermal bowing resulting from the second flash tends to suppress residual vibrations from the first flash. The combination of two such flash-heating stages in rapid succession allows higher peak temperatures to be achieved, while reducing residual vibrations in the wafer. The alternative use of continuous irradiance may also provide similar advantages.

Such heat-treating methods may be employed in combination with the supporting methods and systems described herein, or may be employed separately, if desired.

In accordance with another aspect of the invention, there is provided an apparatus for supporting a workpiece. The apparatus includes a support system configured to support the workpiece while allowing thermally-induced motion of the workpiece. Numerous elements of exemplary support systems are described in the following detailed description of exemplary embodiments of the invention.

In accordance with another aspect of the invention, there is provided an apparatus for supporting a workpiece. The apparatus includes means for supporting the workpiece, and means for allowing thermally-induced motion of the workpiece while the workpiece is being supported.

In accordance with another aspect of the invention, there is provided a computer-readable medium storing instruction codes for directing a processor circuit to control a workpiece support system to allow thermally-induced motion of a workpiece while the workpiece is being supported by the system. The instruction codes may include codes for directing the processor circuit to cause motion of a moveable engagement portion of a support member of the support system engaged with the workpiece, in response to the thermally-induced motion of the workpiece.

In accordance with another aspect of the invention, there is provided a signal embodied in at least one of a communications medium or a carrier wave, the signal including code segments for directing a processor circuit to control a workpiece support system to allow thermally-induced motion of a workpiece while the workpiece is being supported by the system. The code segments may include code segments for directing the processor circuit to cause motion of a moveable engagement portion of a support member of the support system engaged with the workpiece, in response to the thermally-induced motion of the workpiece.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention.

DETAILED DESCRIPTION

Figure 1:
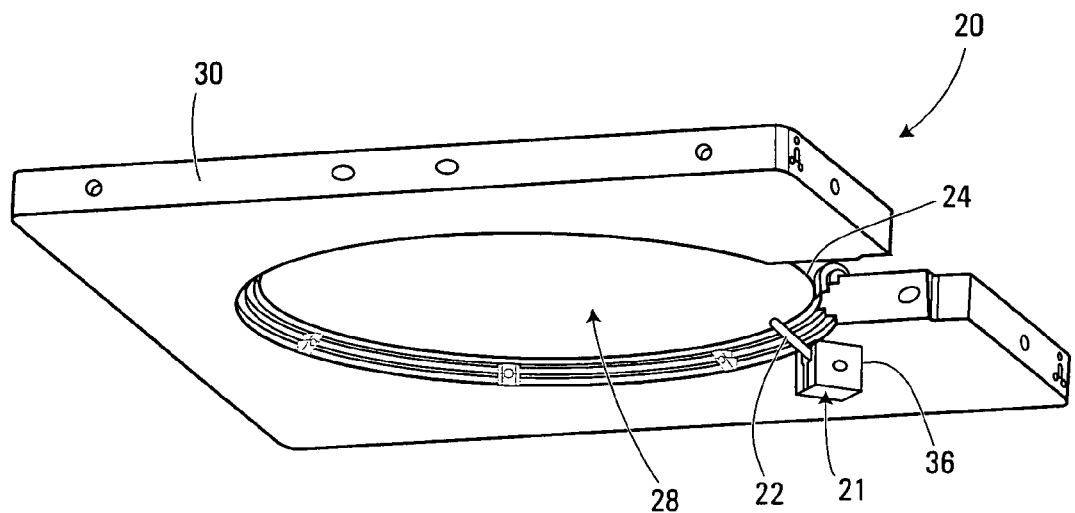
FIG. 1 is an upper perspective view of a workpiece and an apparatus for supporting the workpiece, according to a first embodiment of the invention.

Referring to FIGS. 1-4, an apparatus for supporting a workpiece according to a first embodiment of the invention is shown generally in FIG. 1. In the present embodiment, the apparatus includes a support system 20 configured to support a workpiece 24 while allowing thermally-induced motion of the workpiece.

In this embodiment, the support system 20 includes a supporting device shown generally at 21. More particularly, in this embodiment the supporting device 21 includes a support member 22 engageable with the workpiece 24. More particularly still, in the present embodiment the support member 22 has a moveable engagement portion 52 shown in FIG. 3, which is engageable with the workpiece 24 and which is moveable to allow the thermally-induced motion of the workpiece while supporting the workpiece.

In the present embodiment, the moveable engagement portion 52 of the support member 22 includes a tip of the support member. In this embodiment, the support member 22 is rigid, and the moveable engagement portion 52 is moveable by virtue of the support member 22 being pivotally moveable, as described in greater detail below. Alternatively, however, the moveable engagement portion 52 may be moveable in other ways, such as those described in connection with the further embodiments described herein, for example.

In this embodiment, the workpiece 24 includes a semiconductor wafer, and the moveable engagement portion 52 is engageable with the semiconductor wafer to allow the thermally-induced motion of the wafer while supporting the wafer. More particularly, in this embodiment the semiconductor wafer has a top-side or device side 26, and a back-side or substrate side 28.

In the present embodiment the support system 20 includes a plurality of moveable engagement portions 52 of a plurality of respective support members 22. More particularly, in this embodiment, the workpiece 24, i.e. the semiconductor wafer, is supported within a workpiece plane plate 30 by the supporting device 21 and by a plurality of similar supporting devices (not shown in FIG. 1), such as those shown at 32 and 34 in FIG. 4 for example. Preferably, the plurality of moveable engagement portions includes at least three moveable engagement portions of at least three respective support members, to provide stable support of the workpiece. Even more preferably, the plurality of engagement portions includes at least four moveable engagement portions of at least four respective support members, so that stable support of the workpiece may be maintained even if one of the support members breaks or otherwise fails to function properly.

At the same time, however, although larger numbers of support members add stability, it is desirable to minimize the total mass of the moveable engagement portions. In this regard, in the present embodiment, in which the workpiece includes a semiconductor wafer to be subjected to thermal processing employing a high-intensity irradiance flash, the support system is designed to allow the wafer to move freely and thus reduce wafer stress during the flash while secondarily dampening vibrations after the flash. To achieve this, it is desirable to minimize the reaction force from the support members on the wafer. In the present embodiment, this is achieved by employing moveable engagement portions with minimized mass, while in other embodiments, reaction forces may be minimized in other ways, such as by actively moving the supports, for example.

In this embodiment, each support member 22 includes a support pin. Thus, in this embodiment the plurality of moveable engagement portions 52 of the plurality of support members 22 comprises a plurality of tips of a plurality of respective support pins.

In the present embodiment, the plurality of support pins include material that is transparent to at least some irradiance wavelengths with which the workpiece 24 is capable of being irradiance-heated. Thus, in this embodiment, the plurality of support pins include optically transparent material. More particularly, in the present embodiment the support pins include quartz support pins. In this regard, quartz is a particularly suitable material for the support pins of the present embodiment (in which the workpiece is a semiconductor wafer to be heated by irradiance), due to its low thermal conductivity, its transparency, its non-contaminating nature, its good thermal stability, and its rigidity. Alternatively, other materials may be suitable for similar applications, and thus the support pins may alternatively include sapphire, silicon nitride, or silicon carbide, for example. Alternatively, other materials may be substituted, depending on the requirements of the application at hand.

In this embodiment, each of the moveable engagement portions 52 of the support members 22 is resiliently engageable with the workpiece 24. To achieve this, in this embodiment the support system 20 further includes a plurality of force applicators in communication with the plurality of support members 22 to apply forces thereto to cause each of the engagement portions 52 to tend to maintain contact with the workpiece 24 during the thermally-induced motion of the workpiece. More particularly, as discussed in greater detail below, each of the force applicators includes a spring 48 connected to a respective one of the support members 22.

To achieve this, in the present embodiment, the workpiece plane plate 30 is connected to a support member housing 36 of the supporting device 21, to which the support member 22 is pivotally connected. The workpiece plane plate 30 is also connected to a spring assembly 38, which includes the spring 48 to which the support member 22 is connected.

Figure 3:
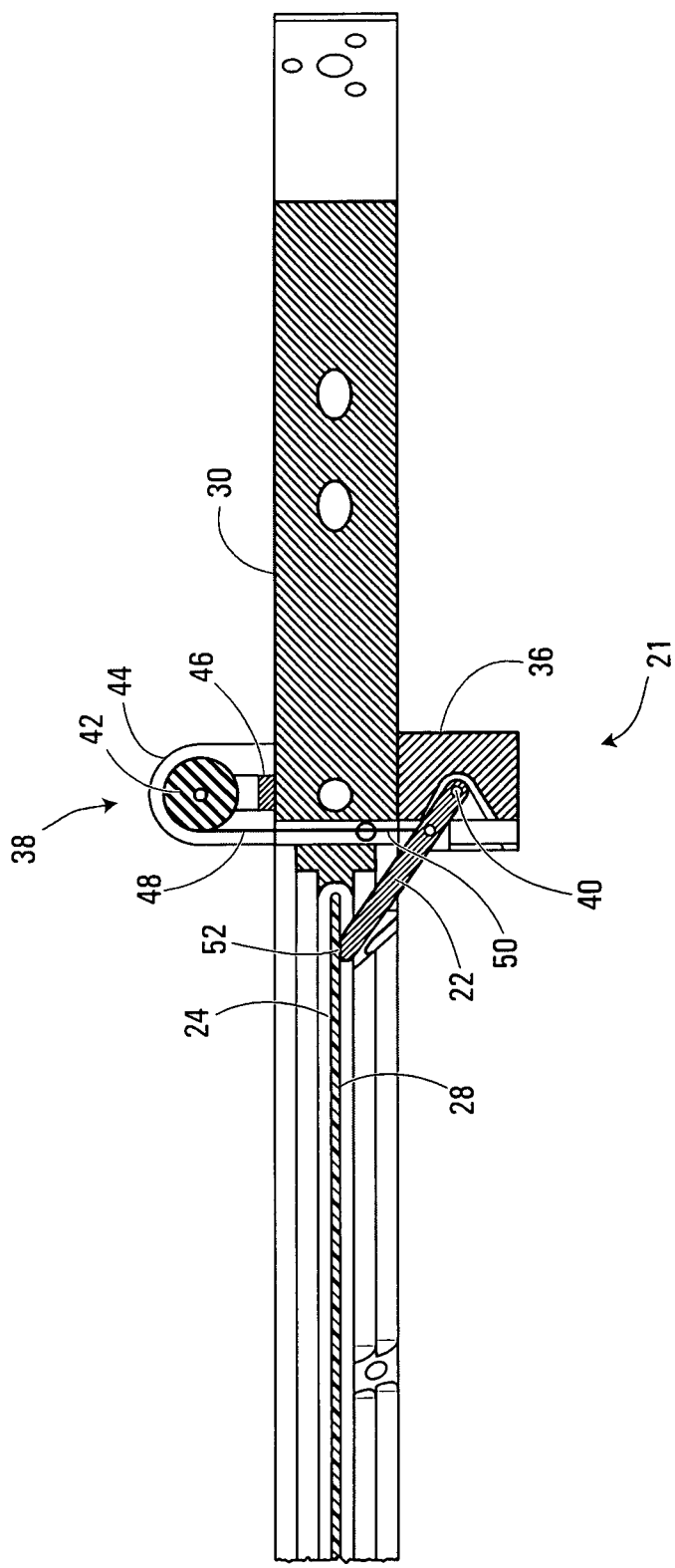
FIG. 3 is a cross-section of the supporting device shown in FIGS. 1 and 2.

Referring to FIG. 3, the supporting device 21 is shown in greater detail. In this embodiment, the support member 22 is pivotally connected to the support member housing 36. To achieve this, a pivot pin 40, which in this embodiment includes a stainless steel dowell pin, is connected to opposite internal walls of the support member housing 36, and extends through a hole formed in one end of the support member 22.

In the present embodiment, the spring assembly 38 includes a spring drum 42, which in this embodiment includes teflon. Alternatively, other materials, such as stainless steel for example, may be substituted. The spring drum 42 is housed within a spring drum housing 44, and is mounted to the workpiece plane plate 30 by a spring holder bracket 46. The spring drum 42 is used to mount the spring 48, which in this embodiment includes a constant force spring.

In this embodiment, the force applicator, or more particularly, the spring 48 connected to the support member 22, acts as a torque applicator. To achieve this, in the present embodiment the spring 48 is connected to a link 50, which in this embodiment is composed of stainless steel. The link 50 is pivotally connected to the support member 22, at a location on the support member interposed between a pivot point (at the location of the pivot pin 40) of the support member 22 and the engagement portion 52 at which the support member 22 contacts the workpiece 24. Thus, the torque applicator, or more particularly the spring 48, applies an upward force at the location at which the link 50 is connected to the support member 22. The constant force supplied by the spring 48, and the forces supplied by the constant force springs of the other supporting devices similar to the supporting device 21, are selected so that the cumulative constant upward force applied by the supporting members to the workpiece balances the downward force of gravity on the workpiece.

In the present embodiment, the moveable engagement portions 52 of the support members 22, which in this embodiment include the tips of the support pins, contact the lower side or substrate side 28 of the workpiece 24 to support the workpiece. More particularly, in this embodiment the tips of the support pins are engageable with an outer perimeter zone of the workpiece, or more particularly, with an outer "exclusion zone" or waste region, that is not used to manufacture semiconductor chips. In this embodiment, the workpiece 24 is a 150 mm radius silicon semiconductor wafer, and the outer exclusion zone extends 3 mm radially inward from the outer edge of the workpiece (i.e., r=147 mm to r=150 mm). Thus, to the extent that the physical contact between the moveable engagement portion 52 of the support member 22 and the substrate side 28 of the workpiece may cause potentially deleterious effects such as highly localized temperature gradients during thermal processing, such localized gradients are unlikely to damage devices formed on the device side 26.

Figure 4:
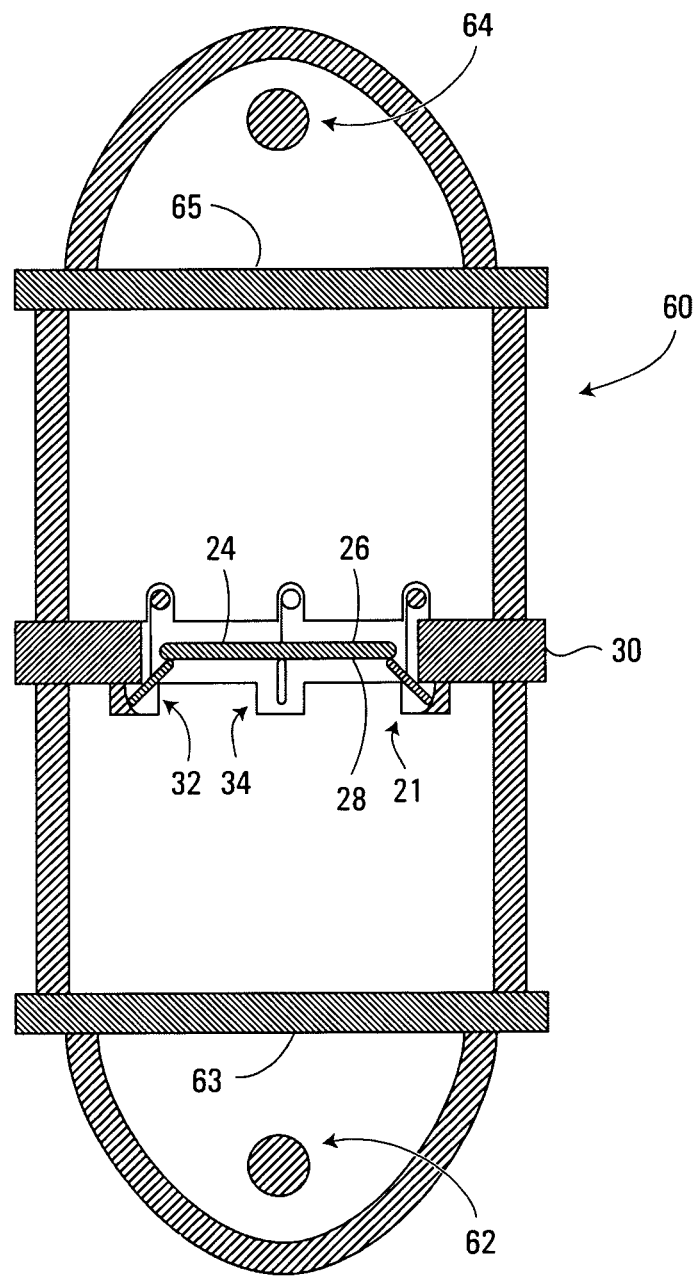
FIG. 4 is a cross-section of the workpiece shown in FIGS. 1-3 supported in a heat-treating chamber by a plurality of the supporting devices shown in FIGS. 1-3.

Referring to FIG. 4, in this embodiment the supporting device 21, and the other similar supporting devices (such as the exemplary supporting devices 32 and 34), are used to support the workpiece 24 within a heat-treating chamber 60. More particularly, in this embodiment the chamber 60 is similar to a heat-treating chamber disclosed in the aforementioned U.S. patent application Publication No. US 2002/0102098, for thermal annealing of the device side 26 of the workpiece 24. In this embodiment, the workpiece plane plate 30, including the supporting device 21 and the similar supporting devices 32 and 34, are mounted in a middle region of the chamber 60.

In this embodiment, the heat-treating chamber 60 includes a heating system configured to heat a surface of the workpiece 24 relative to a bulk of the workpiece to cause the thermally-induced motion of the workpiece. More particularly, in the present embodiment the heating system includes an irradiance system configured to irradiate the surface of the workpiece. In this embodiment the irradiance system includes a pre-heating device 62 and a heating device 64.

The pre-heating device 62, which may include an arc lamp or an array of arc lamps for example, irradiates the workpiece through a water-cooled quartz window 63, to pre-heat the workpiece to an intermediate temperature at a rate that is slower than a thermal conduction time through the workpiece, so that the entire workpiece is heated relatively uniformly to the intermediate temperature. For example, the pre-heating device may pre-heat the workpiece at a rate of 250° C./sec to 400° C./sec, to an intermediate temperature of 600° C. to 1250° C., although these are merely illustrative examples.

Following the pre-heating stage, the irradiance system, or more particularly, the heating device 64, is configured to irradiate the surface (in this case the device side 26) for a time period shorter than a thermal conduction time of the workpiece 24, to heat the surface to a greater temperature than the bulk of the workpiece. In other words, the heating device 64 is used to rapidly heat the device side 26 of the workpiece to a substantially higher annealing temperature, at a rate much faster than a thermal conduction time through the wafer, so that only the top-side surface region of the workpiece is heated to the final annealing temperature, while the bulk of the workpiece remains close to the relatively cooler intermediate temperature. The final annealing temperature may include a higher temperature in the range of 1050° C. to a temperature close to the melting point of silicon, such as 1410° C., for example.

To achieve this, in the present embodiment the irradiance system, or more particularly the heating device 64 thereof, includes a flash-lamp operable to irradiate the device side 26 through a second water-cooled quartz window 65 with a high-power flash having a relatively short duration, preferably on the order of about one millisecond or less, for example, to heat the device side 26 at a heating rate in excess of 10⁵° C./sec. More particularly, in this embodiment the flash lamp includes a liquid-cooled arc lamp. More particularly still, the flash lamp includes a double water-wall arc lamp similar to that disclosed in commonly-owned U.S. Pat. No. 6,621,199 to Parfeniuk et al., configured to act as a flash lamp, as described in the aforementioned U.S. patent application Ser. No. US 2002/0102098. As the one-millisecond flash produced by the flash lamp incident on the device side 26 occurs much faster than the thermal conduction time of the workpiece (typically 10-15 ms), the device side 26 is heated to the final annealing temperature, while the bulk of the workpiece remains substantially at the intermediate temperature. The cooler bulk of the wafer then acts as a heat sink to facilitate rapid cooling of the device side surface. Alternatively, other types of heating devices, such as an array of flash lamps for example, may be substituted.

Depending on the brevity of the duration of the flash, and the difference between the intermediate temperature of the bulk of the workpiece and the final annealing temperature to which only the device side 26 is heated, the workpiece 24 may experience rapid thermal bowing, as described earlier herein. Advantageously, in the present embodiment the support system 20 is configured to support the workpiece 24 while allowing thermal bowing of the workpiece, or more particularly, to automatically allow motion of the tips of the support pins in response to the thermally-induced motion of the outer perimeter zone of the workpiece. Therefore, in contrast with conventional systems in which the initial downward thermal bowing motion of the edge of the wafer may tend to either break the support pins or launch the wafer vertically upward from the support pins, in the present embodiment, if the workpiece 24 thermally bows in response to a heating flash produced by the heating device 64, the moveable engagement portions 52 of the support members 22 are automatically moveable in response to such thermally-induced motion, by virtue of the springs 48 to which the support members 22 are connected. Thus, if rapid thermal bowing occurs, the outer edges of the workpiece and the support members (i.e. the support member 22 of the supporting device 21 and similar support members of similar supporting devices) are allowed to move downward, thereby preventing breakage of the support members due to the reduced reaction force between the support members and the workpiece, and also preventing the workpiece from launching itself upward. In the latter regard, the resilient downward movability of the moveable engagement portions 52 allows downward motion of the outer regions of the workpiece while maintaining a center of mass of the workpiece in a desired range, or more particularly, while minimizing motion of the center of mass of the workpiece. (Alternatively, other ranges of motion of the center of mass may be tolerable or desired for certain applications.) In addition, as the initial deformation of the workpiece into a dome shape minimizes stress in the workpiece, the movability of the engagement portions to allow such thermally-induced motion and deformation serves to minimize stress in the workpiece while at the same time supporting the workpiece during the thermally-induced motion. As noted earlier herein, the thermal bowing tends to occur sufficiently rapidly that the workpiece overshoots its equilibrium shape, and then tends to vibrate or oscillate about the equilibrium shape. Thus, as the outer edges of the workpiece begin to move back upward and the center of the workpiece begins to travel back downward, the upward force applied by the constant force spring 48 to the support member 22 pulls the support member back up, tending to maintain contact with the outer edge of the workpiece. As the workpiece continues to vibrate, the outer edges of the workpiece are allowed to move up and down, while tending to maintain contact with the support member 22 (and similar support members), until the vibration subsides. Thus, the spring-driven upward and downward movement of the support members 22 allows upward and downward motion of the outer regions of the workpiece while minimizing the motion of the center of mass of the workpiece and minimizing stress in the workpiece.

Figure 5:
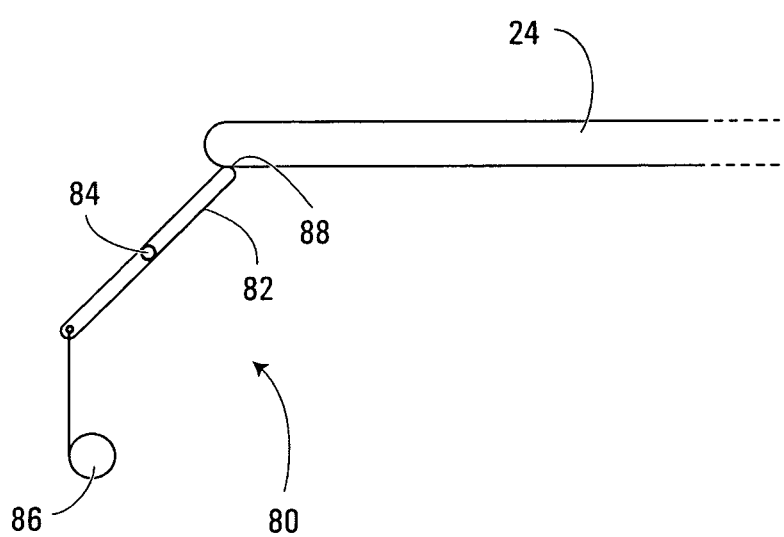
FIG. 5 is a partial side elevation view of a workpiece and an apparatus for supporting the workpiece according to a second embodiment of the invention.

Referring to FIG. 5, a supporting device according to a second embodiment of the invention is shown generally at 80. In this embodiment, the supporting device 80 includes a support member 82, similar to the support member 22 discussed earlier herein. In this embodiment, the support member 82 is mounted to a support member housing (not shown) at a pivot point 84, for pivotal motion thereabout. As in the previous embodiment, the supporting device 80 includes a force applicator, or more particularly a torque applicator comprising a spring 86, in communication with the support member 82 to apply a force to the support member to cause an engagement portion 88 to tend to maintain contact with the workpiece during thermally-induced motion thereof. In the present embodiment, however, the torque applicator is configured to apply a downward force at a location on the support member 82 such that the pivot point 84 of the support member 82 is interposed between the location and the engagement portion 88. More particularly, in this embodiment the pivot point 84 is interposed between a point at which the support member 82 is connected to the spring 86, and a point of contact between the engagement portion 88 of the support member and the workpiece 24. Therefore, unlike the configuration shown in FIG. 3, in the present embodiment the spring 86 (which in this embodiment includes a constant force spring) applies a downward force on one end of the support member 82, so as to provide a torque that counter-balances a torque applied by the weight of the workpiece 24 on the engagement portion 88 of the support member 82.

Figure 6:
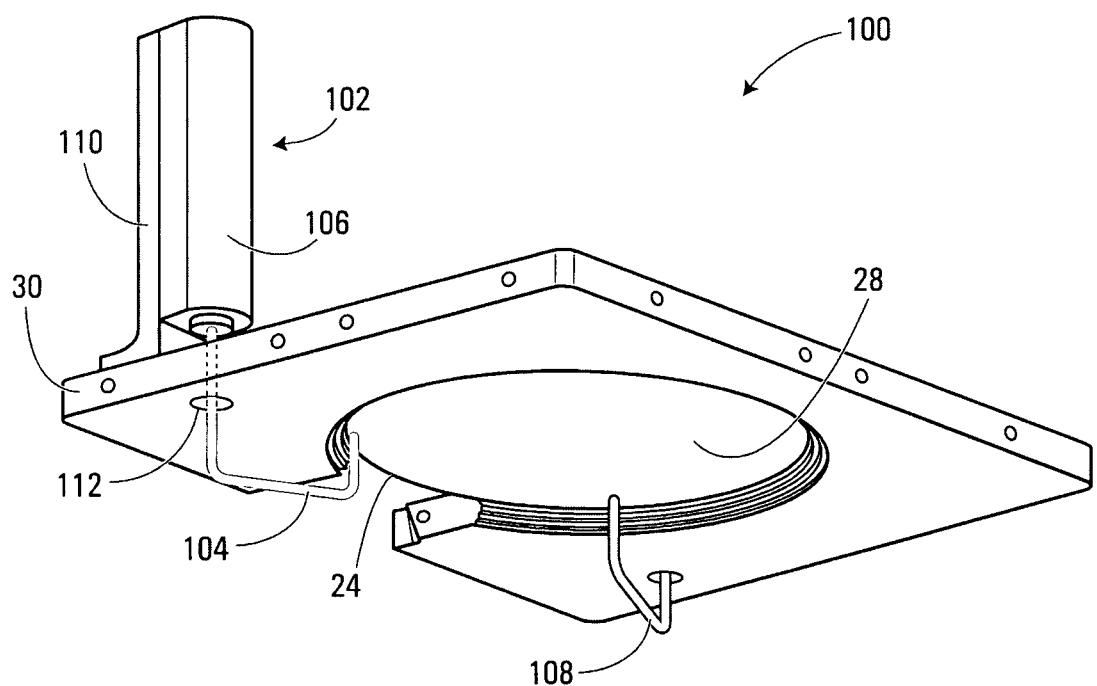
FIG. 6 is a lower perspective view of an apparatus for supporting a workpiece according to a third embodiment of the invention, including a support member engageable with a workpiece and an actuator co-operating with the support member.

Referring to FIG. 6, a system for supporting a workpiece according to a third embodiment of the invention is shown generally at 100. The system 100 includes a supporting device 102 configured to support the workpiece 24 while allowing thermal bowing or other thermally-induced motion of the workpiece.

In this embodiment, the supporting device 102 includes a support member 104 having a moveable engagement portion engageable with the workpiece 24. In the present embodiment, the moveable engagement portion includes a tip of the support member 104. The support member 104 is rigid, and the moveable engagement portion is moveable by virtue of the support member 104 as a whole being moveable, as described below.

In the present embodiment the support member 104 is engageable with the exclusion zone at the outer perimeter of the substrate side 28 of the workpiece. The support member 104 includes a quartz pin, for reasons similar to those discussed in connection with the first embodiment of the invention. Alternatively, other materials may be substituted.

In this embodiment, the system 100 further includes a plurality of support members similar to the support member 104, such as a support member 108, for example. Preferably, the system 100 includes at least three such support members, for stably supporting the workpiece. Ideally, four or more support members are provided, so that stable support of the workpiece may be maintained even if one of the support members breaks or otherwise fails to function properly.

In this embodiment, the system 100 includes a support member motion system configured to move the moveable engagement portions of the plurality of support members 104 in response to the thermally-induced motion of the workpiece 24. More particularly, in this embodiment, in which the support members 104 are rigid, the system is configured to move the engagement portions by moving the support members 104 themselves. More particularly still, in this embodiment the support member motion system includes, for each of the support members 104, a respective actuator 106 connected to the support member 104, for controlling motion of the support member 104.

Thus, in this embodiment the system 100 includes a plurality of actuators (not shown) similar to the actuator 106, for actuating the respective support members. Each actuator 106 is mounted to an upper surface of the workpiece plane plate 30, by way of a mounting bracket such as that shown at 110 in FIG. 6. The support member 104 extends through a hole 112 defined through the workpiece plane plate 30, into the actuator 106.

Figure 7:
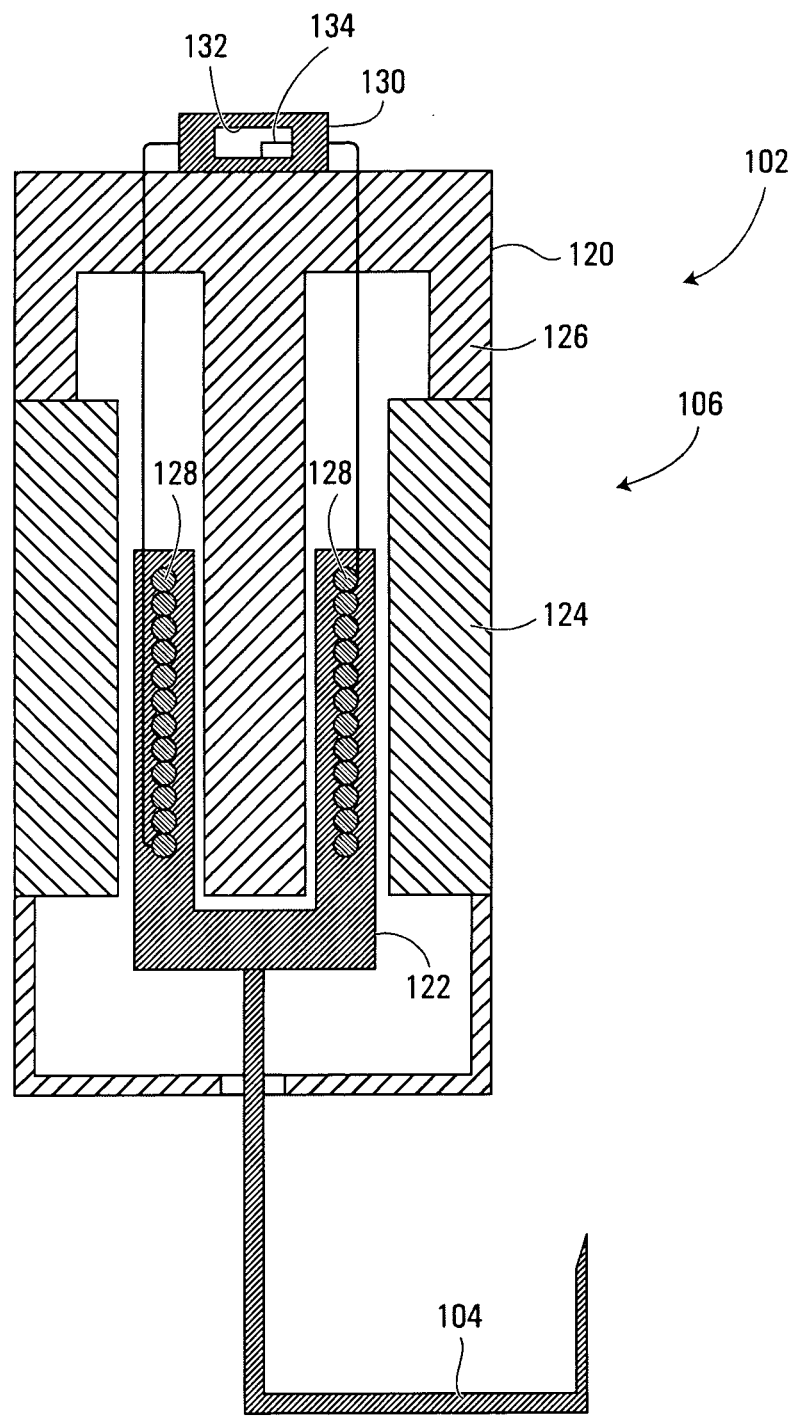
FIG. 7 is a simplified cross-section view of a voice coil actuator for co-operating with the support member shown in FIG. 6.

Referring to FIGS. 6 and 7, an exemplary actuator 106 is shown in greater detail in FIG. 7. In this embodiment, the actuator 106 includes a voice coil actuator, which is connected to the support member 104. More particularly, in this embodiment the actuator 106 includes a fixed member 120 mounted to the bracket 110, and a moving member 122 that moves relative to the fixed member. The fixed member 120 produces a magnetic field through the moving member 122. To achieve this, in the present embodiment the fixed member 120 includes a permanent magnet 124 and a ferromagnetic member 126. In this embodiment, the moving member 122 includes an electric wire coil 128. The actuator 106 further includes a power supply unit 130 operable to apply a voltage between opposite ends of the electric wire coil 128, thereby producing an electric current in the coil. It will be appreciated that as a result of the electric current produced in the coil of the moving member 122, the magnetic field produced by the fixed member 120 exerts a force on the moving member 122, in a direction dependent upon the direction of the current. The magnitude of the exerted force is directly proportional to the magnitude of the current in the coil 128.

In the present embodiment, the moving member 122 of the actuator 106 is connected to the support member 104. Thus, the magnitude of the upward supporting force exerted by the support member 104 upon the outer edge of the substrate side 28 of the workpiece 24 may be controlled by controlling the electric current in the coil 128 of the actuator 106.

In this embodiment, the support member motion system includes at least one controller configured to apply an electric current to each of the actuators to move each of the support members, thereby moving the moveable engagement portions thereof. More particularly, in this embodiment the at least one controller includes a plurality of controllers, each in communication with a respective one of the plurality of actuators 106. More particularly still, in this embodiment each controller includes a combined detector/controller 132, which also acts as a detector for detecting the thermally-induced motion of the workpiece. In this embodiment, the detector/controller 132 is in communication with the power supply unit 130 and the coil 128 of the actuator 106. Thus, in the present embodiment the detector/controller detects the thermally-induced motion of the workpiece by detecting an electric current in the coil 128, and conversely, the controller moves the support member 104 by controlling the power supply unit 130 to apply an electric current to the coil 128.

In the present embodiment each detector/controller 132 includes a processor circuit. More particularly, in this embodiment each detector/controller includes a digital signal processor (DSP). Alternatively, the detector/controller 132 may include a microcontroller or a similar device, with or without a central processing unit (CPU), for example. Alternatively, other types of detectors or controllers may be substituted, and the detecting and controlling functions may be performed by either the same or by different components. More generally, in this specification, including the claims, the terms "controller", "detector" and "processor circuit" are intended to broadly encompass any type of device or combination of devices capable of performing the functions described herein or equivalent functions, including (without limitation) other types of microprocessors, microcontrollers, other integrated circuits, other types of circuits or combinations of circuits, logic gates or gate arrays, or programmable devices of any sort, for example, either alone or in combination with other such devices located at the same location or remotely from each other, for example. Additional types of controllers, detectors and processor circuits will be apparent to those ordinarily skilled in the art upon review of this specification, and substitution of any such other types of controllers, detectors or processor circuits is considered not to depart from the scope of the present invention as defined by the claims appended hereto.

In the present embodiment, the detector/controller 132 includes a program memory 134, which acts as a computer-readable medium for storing instruction codes for directing the detector/controller 132 to perform the various functions described herein. It will be appreciated that the program memory 132 is merely one example of such a computer readable medium. Alternatively, such instruction codes may be provided on a different medium such as a compact disc, a floppy diskette, a hard disk drive, a read-only memory, or a FLASH memory, to name but a few examples. Alternatively, rather than relying upon a local memory to provide such instruction codes in the form of computer data signals, such instruction codes may be provided as code segments of signals embodied in carrier waves or embodied in a communications or transmission medium, such as a local area network or a wide area network such as the Internet, for example, and may be received from remote devices. Referring to FIGS. 4, 6 and 7, a plurality of supporting devices similar to the supporting device 102 shown in FIG. 6 may be substituted for the supporting devices 21, 32 and 34 within the heat-treating chamber 60 shown in FIG. 4. Generally, in this embodiment, the support member motion system is configured to move the engagement portions of the support members 104 to minimize forces applied between the workpiece 24 and the engagement portions, as discussed in greater detail below.

During the pre-heating stage, during which the substrate side 28 of the workpiece 24 is being irradiated by the pre-heating device 62 to heat the workpiece to the desired intermediate temperature, the detector/controller 132 controls the power supply unit 130 to control the voltage applied to the leads of the coil 128, to cause a constant current having a desired magnitude to flow in the coil 128, thereby applying a corresponding constant upward force on the moving member 122 and thus on the support member 104, which in turn applies the upward force to the outer edge of the substrate side 28 of the workpiece 24. The desired magnitude of the current is selected so that the constant upward forces applied to the workpiece by the support member 104, and by the similar support members of the other supporting devices, precisely balance the downward force of gravity acting on the workpiece 24.

Then, during the subsequent heating stage, in which the device side 26 of the workpiece is exposed to a high-power flash of irradiance from the heating device 64 to heat the device side to the higher desired temperature while the bulk of the workpiece remains at the cooler intermediate temperature, the workpiece 24 may again experience rapid thermal bowing, as described earlier herein (depending on the brevity of the duration of the flash, and the magnitude of the difference between the intermediate temperature of the bulk of the workpiece and the final annealing temperature to which only the device side 26 is heated). Assuming that such rapid thermal bowing occurs, as the workpiece initially begins to rapidly deform, the outer edge of the workpiece 24 will abruptly apply a significant downward force on the engagement portion of the support member 104 (and on the engagement portions of the similar support members of the other supporting devices). It will be appreciated that this sudden downward force induces a corresponding sudden increase in the electric current in the coil 128. Thus, to detect the thermally-induced motion of the workpiece 24 in the present embodiment, each of the detector/controllers 132 is configured to detect, in its respective actuator 106, an electric current resulting from a force applied to the engagement portion of the respective support member 104 by the thermally-induced motion of the workpiece. More particularly, the detector/controller 132 is configured to detect a deviation of the electric current in the coil 128 from a desired current level, the desired current level representing the above-noted constant current having the desired magnitude in order to precisely balance the gravitational force exerted on the support member by the workpiece.

Upon detecting the thermally-induced motion in the above manner, the detector/controllers 132 are configured to adjust positions of their respective support members 104 to maintain a difference between a weight of the workpiece 24 and an upward force applied to the workpiece by the engagement portions of the support members within a desired range. More particularly, each of the detector/controllers 132 is configured to minimize this difference. To achieve this, in the present embodiment, upon detecting the above-described deviation in the current level in the coil 128 resulting from the thermally-induced motion, the detector/controller 132 is configured to control the actuator 106 to adjust a position of the support member 104 to minimize the deviation. To achieve this, the detector/controller 132 controls the power supply unit 130 to adjust the voltage applied to the leads of the coil 128, to cause the actual current in the coil to return to the desired magnitude, thereby reducing the upward force applied by the support member 104 to the workpiece 24, so that the support member 104 continues to counter-balance only the downward force of gravity on the workpiece, and does not counter-balance the additional downward force applied by the initial thermal deformation or bowing of the workpiece. Effectively, therefore, the support member 104 will be lowered, to allow the outer edge of the workpiece 24 to move abruptly downward as it initially bows. As noted earlier herein, the thermal bowing tends to occur sufficiently rapidly that the workpiece overshoots its equilibrium shape, and then tends to vibrate or oscillate about the equilibrium shape. Thus, as the outer edges of the workpiece begin to move back upward and the center of the workpiece begins to travel back downward, the detector/controller 132 continues to apply the desired magnitude of current to the support member 104 (corresponding to an upward force that precisely balances the weight of the workpiece on the support member), but due to the upward thermal bowing motion of the edge of the workpiece, this upward force is no longer fully counter-balanced by the downward force applied by the workpiece to the support member, with the result that the support member 104 rises with the edge of the workpiece. Similarly, as the next cycle of the vibratory motion of the workpiece commences and the edge of the workpiece begins to move downward again, the downward force applied by the edge of the workpiece to the support member 104 once again exceeds the upward force applied by the support member 104, inducing a change in the current in the coil 128, and the detector/controller 132 quickly controls the power supply unit 130 to adjust the actual current in the coil so that the upward force applied by the support member 104 to the workpiece counter-balances only the force of gravity, thereby allowing the support member 104 to lower under the added force applied by the downward thermal bowing motion of the edge of the workpiece. As the workpiece continues to vibrate, the outer edges of the workpiece are allowed to move up and down, while tending to maintain contact with the support member 104 (and similar support members), until the vibration subsides.

Alternatively, the actuator 106 may include different types of actuators. For example, the actuator 106 may include a linear servo actuator. Or, as a further alternative, the actuator 106 may include a piezoelectric actuator. In this regard, piezoelectric actuators may be advantageous due to their fast response times (typically at least as fast as $10^{-5}$ sec), precise movements, and significant available forces. However, most existing piezoelectric actuators are limited in their available ranges of motion, and for this reason may not be suitable for some applications.

Alternatively, other types of actuators may be substituted for the actuator 106.

In the foregoing embodiment, the support member motion system is configured to move the support members in response to a detected parameter of the thermally-induced motion of the workpiece, namely, the detected change in electric current in the coil 128 produced by the change in the force applied to the support member 104 by the workpiece resulting from the thermally-induced motion. Alternatively, if desired, the motion system may be configured to move the support members in response to a predicted value of the thermally-induced motion. Such predicted values may be obtained empirically through observation of thermal processing of similar workpieces, for example. Similarly, it will be appreciated that rather than employing a separate detector/controller 132 for each of the actuators 106, if desired, a single detector/controller 132 may be employed for detection and control purposes for some or all of the actuators 106.

Referring back to FIG. 6, the moving member 122 of the actuator 106 need not be connected directly to the support member 104. For example, the actuator 106 may be connected to the support member 104 indirectly. In this regard, it will be appreciated that the thermal bowing motion of the outer edge of the workpiece 24 does not trace a vertical line, but rather, is more akin to an arc. Accordingly, the motion of the edge of the workpiece also has a horizontal component. For example, for some applications, taking into account the downward motion of the outer edge of the workpiece and the upward motion of the center of the workpiece, the outer edge of the workpiece may be expected to travel horizontally inward by a distance on the order of one millimeter. Therefore, if the support member 104 is horizontally fixed, then effectively the point at which the tip of the support member contacts the outer edge region of the workpiece would slide further outward toward the edge of the workpiece. This inward horizontal travel distance is typically smaller than the radial width of the outer exclusion zone of the workpiece, and therefore, by initially positioning the support member 104 further inward within the exclusion zone than the expected horizontal inward travel of the workpiece during bowing, contact between the workpiece and the support members may be maintained, without the edge of the workpiece travelling further inward than the tips of the support members and falling through the space between the support members. Nevertheless, such sliding of the outer exclusion zone of the workpiece across the tips of the support members may be undesirable for some applications. For example, such sliding may scratch the lower surface of the workpiece, thereby producing particulate contamination, and also undesirably roughening the lower surface of the workpiece.

Accordingly, if desired, rather than connecting the support member 104 directly to the moving member 122 of the actuator 106, the moving member may be connected to the support member 104 via a motion translation device, for translating the vertical motion of the moving member into a motion of the support member 104 having both a vertical and a horizontal component.

Figure 8:
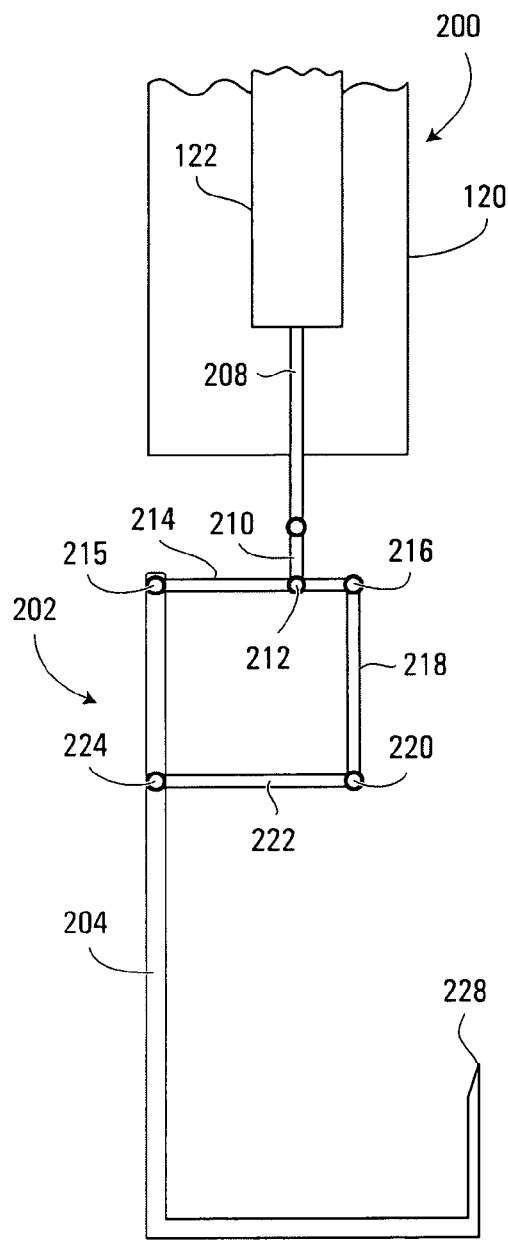
FIG. 8 is a simplified side elevation view of an apparatus for supporting a workpiece according to a fourth embodiment of the invention, including a moving member of an actuator co-operating with a motion translator to impart an arcuate motion to the support member shown in FIG. 6.
Figure 9:
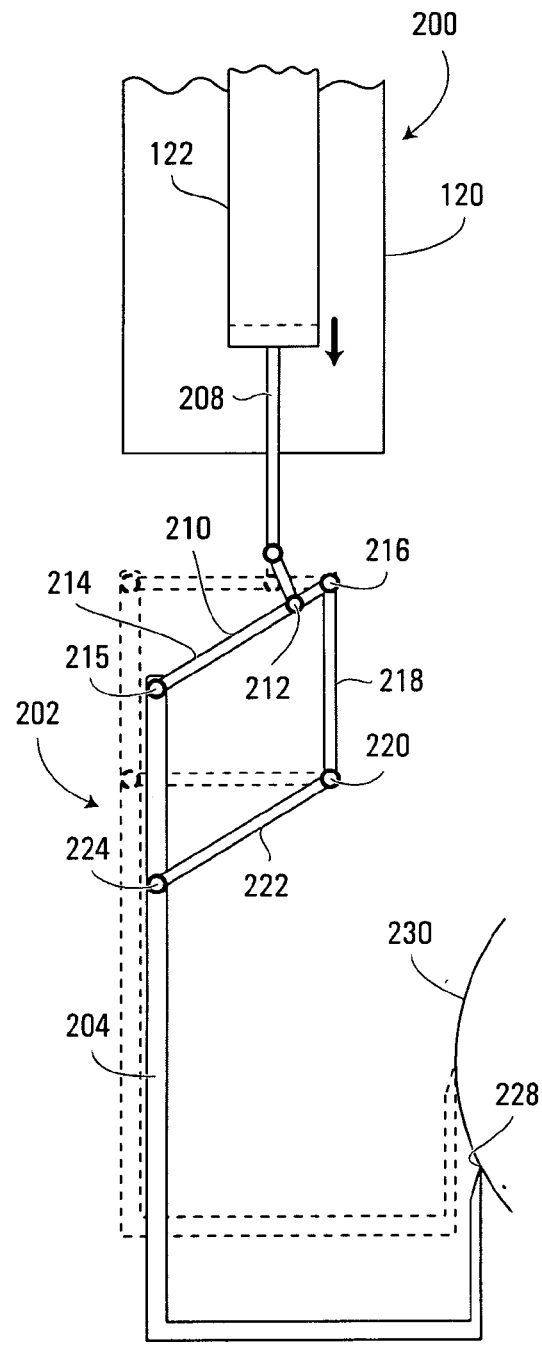
FIG. 9 is a simplified side elevation view of the moving member, motion translator and support member shown in FIG. 8, shown in a second position.

For example, referring to FIGS. 8 and 9, an actuator according to a fourth embodiment of the invention is shown generally at 200. The actuator 200 is similar to the actuator 106 shown in FIG. 7, and includes the moving member 122 and the fixed member 120. However, in this embodiment the moving member 122 is not directly connected to the support member 104, but rather, is connected to a motion translator 202. In this embodiment, the motion translator 202 is configured to translate a linear motion of a moveable member of the actuator 106, or more particularly a linear motion of the moving member 122, into an arcuate motion of the support member 104. To achieve this, in the present embodiment the motion translator 202 includes a first connector arm 208, to which the moving member 122 of the actuator 200 is rigidly connected. The motion translator further includes a second connector arm 210, to which the first connector arm 208 is pivotally connected. The second connector arm 210 is pivotally connected to a first rigid bar 214, at a first freely-movable pivot point 212. The first rigid bar 214 rigidly extends between a second freely-movable pivot point 215 and a first fixed pivot point 216. In this embodiment, the first freely-movable pivot point 212 is disposed at a location along the first rigid bar 214 that is closer to the first fixed pivot point 216 than to the second freely-movable pivot point 215. The first rigid bar 214 is pivotally connected to a modified support member 204 at the second freely-movable pivot point 215. The first fixed pivot point 216 is connected to a housing (not shown) to prevent translational movement or displacement in any spatial dimension of the fixed pivot point 216 while permitting rotation of the first rigid bar 214 (and thus, permitting rotation of the pivot points 212 and 215) about the pivot point 216. The motion translator further includes a second rigid bar 218, which is pivotally connected to the first fixed pivot point 216 and to a second fixed pivot point 220, which is also locked to prevent translational movement or displacement of the pivot point 220. The motion translator 202 also includes a third rigid bar 222 connecting the second fixed pivot point 220 to a third freely-movable pivot point 224 disposed along the support member 204. Thus, any vertical linear motion of the moving member 122 of the actuator 200 causes the first and second freely-movable pivot points 212 and 215 to move in respective arcuate paths centered about the first fixed pivot point 216, and likewise, causes the third freely-movable pivot point 224 of the support member 204 to move in an arcuate path centered about the second fixed pivot point 220. Therefore, vertical linear motion of the moving member 122 of the actuator 200 causes a supporting tip 228 of the support member 204 to move along an arcuate path 230 shown in FIG. 9. In addition, due to the location of the first freely-movable pivot point 212 along the first rigid bar 214 (proximal to the first fixed pivot point 216), a relatively small magnitude of downward linear motion of the moving member 122 is effectively amplified into a greater magnitude of downward arcuate motion of the supporting tip 228 of the support member 204 along the arcuate path 230.

For ease of illustration, the dimensions of the various elements shown in FIG. 9 are not to scale, but rather, are exaggerated. The actual dimensions of these components will vary, to cause the arcuate path 230 traced by the tip 228 of the support member 204 to conform to the expected path of the outer edge of the workpiece 24 during thermal bowing. Alternatively, any other suitable type of motion translator may be substituted if desired.

Figure 10:
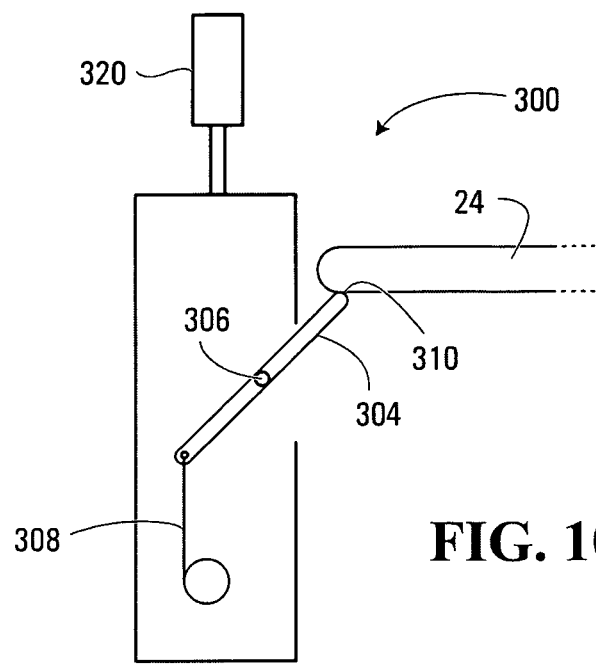
FIGS. 10-12 are simplified partial side elevation views of an apparatus for supporting a workpiece, according to a fifth embodiment of the invention.

Referring to FIGS. 5-7 and 10-12, a system for supporting a workpiece according to a fifth embodiment of the invention is shown generally at 300 in FIG. 10. In this embodiment, each of the plurality of moveable engagement portions of the plurality of support members is resiliently engageable with the workpiece, in a manner similar to that shown in FIG. 5. Also in this embodiment, a support member motion system similar to that shown in FIGS. 6 and 7 is configured to move the plurality of support members in response to the thermally-induced motion of the workpiece 24.

More particularly, in this embodiment, the system 300 includes a plurality of supporting devices, including a first supporting device 302 shown in FIG. 10, which is similar to the supporting device 80 shown in FIG. 5. Thus, each supporting device 302 includes a support member 304 having a pivot point 306, about which the support member 304 may pivot. A respective spring 308 is connected to each support member 304 at a location other than the pivot point 306 thereof. More particularly, in this embodiment the pivot point 306 is interposed between a point at which the support member 304 is connected to the spring 308, and an engagement portion (a tip) 310 of the support member which contacts the workpiece 24. Therefore, as with the configuration shown in FIG. 5, in the present embodiment the spring 308 (which in this embodiment includes a constant force spring) acts as a torque applicator configured to apply a torque to the support member 304 about the pivot point 306 thereof to cause the engagement portion 310 to tend to maintain contact with the workpiece. To achieve this, the spring 308 applies a downward force on one end of the support member 304, so as to provide a torque that counterbalances a torque applied by the weight of the workpiece 24 on the engagement portion (tip) 310 of the support member 304.

Figure 11:
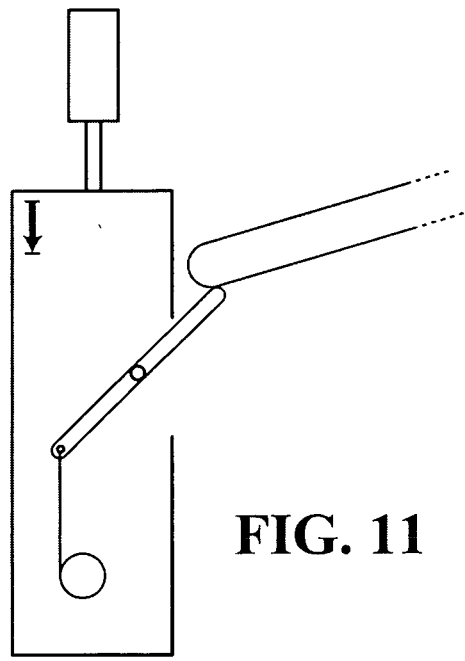
Figure 12:
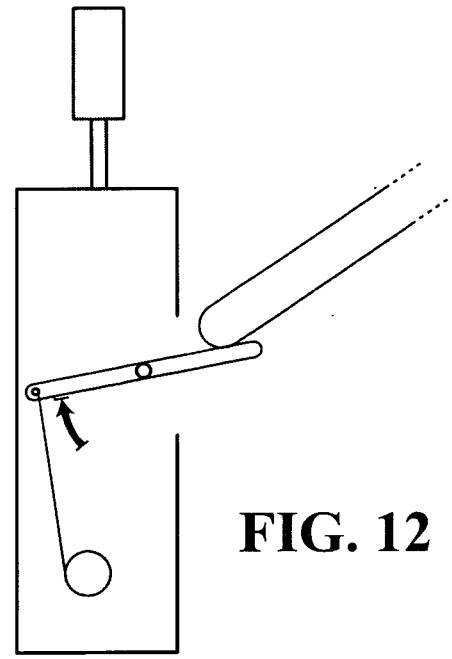

Referring to FIGS. 4 and 10-12, in the present embodiment, the support member motion system is configured to move the pivot points 306 of the support members 304. In this regard, in the present embodiment, the pivot point 306 is not fixed in space relative to the rest of the chamber 60, but rather, is connected to an actuator 320. The connection may be direct, or alternatively, may be indirect (for example, the pivot point 306 may be provided by a pivot bar mounted between opposing walls of a housing 312, and a direct connection may be provided by connecting the pivot bar to the actuator, or alternatively, an indirect connection may be made by connecting the housing to the actuator 320). The actuator 320 may include a voice coil actuator such as that described earlier herein, or alternatively, may include any other suitable type of actuator. In this embodiment, the motion system is configured to apply electric currents to each of the actuators 320, to move the support members 304 connected thereto, thereby moving the pivot points 306 of the support members. To achieve this, in this embodiment the actuator 320 is synchronized with the heating device 64, so that approximately simultaneously with the commencement of the thermal bowing motion of the workpiece 24 resulting from the abrupt heating flash produced by the heating device 64, the actuator 320 moves the entire supporting device 302 downward, thereby causing the support member 304 to also move downward simultaneously with the initial downward thermal bowing motion of the outer edge of the workpiece 24, but without any significant pivoting of the support member 304 about the pivot point 306. The magnitude of the downward motion of the supporting device 302 may be pre-determined in response to a predicted value of the thermally-induced motion of the workpiece 24, for example. In this embodiment, the actuator 320 includes a detector/controller (not shown) similar to that discussed above in connection with FIG. 7, which may be used to detect the thermally-induced motion of the workpiece. Thus, if desired, such synchronization and prediction may be omitted, and the initial downward motion of the actuator 320 and the supporting device 302 may be initiated and controlled in response to detection of the thermally-induced motion. FIG. 11 illustrates the configuration of the supporting device 302 following this initial motion caused by the actuator 320. Following this motion, a shown in FIG. 12, as the downward thermal bowing motion of the outer edge of the workpiece 24 continues, the support member 304 begins to pivot about the pivot point 306, such pivotal motion being resisted by the constant force spring 308, in a manner similar to the embodiment shown in FIG. 5. As the outer edge of the workpiece begins to rise back up as the workpiece vibrates, the actuator may similarly produce an upward motion of the entire supporting device 302, if desired. Thus, in the present embodiment, the upward and downward motion of the support member 304 is provided in a partly passive manner by the spring 308, and in a partly active manner by the actuator 320. Alternatively, other types of hybrid active/passive supporting systems may be substituted if desired. Similarly, motion translators such as that described earlier herein may also be employed, so that the motion of the pivot point 306 caused by the actuator 320 traces an arcuate path corresponding to the expected path of the edge of the workpiece during thermal bowing.

Figure 14:
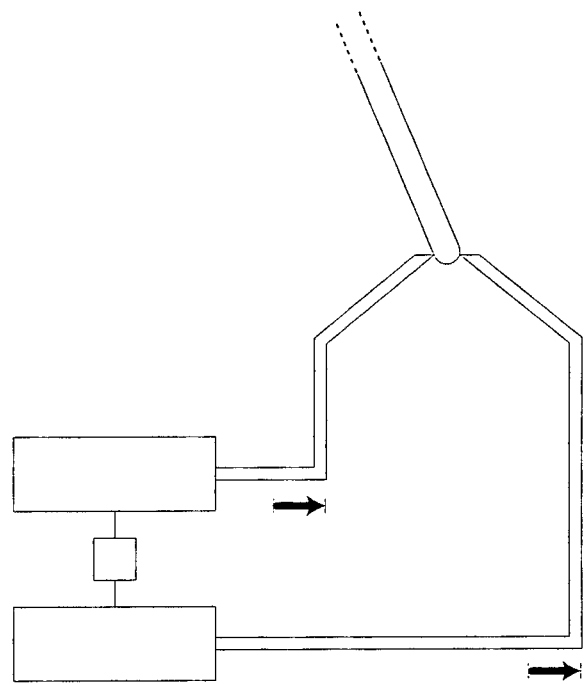
FIGS. 13-14 are simplified partial side elevation views of an apparatus for supporting a workpiece, according to a sixth embodiment of the invention.
Figure 13:
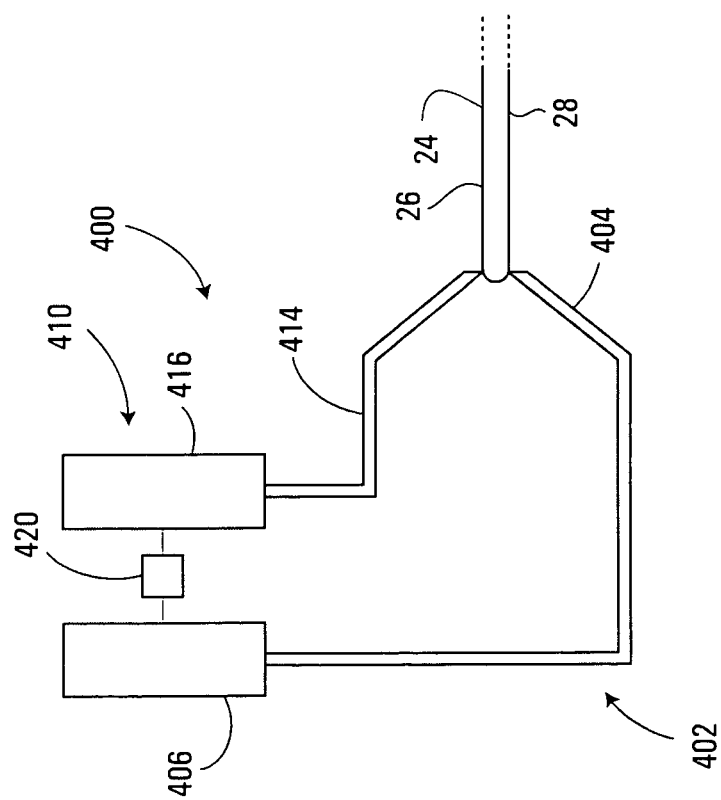

Referring to FIGS. 6, 13 and 14, a system for supporting a workpiece according to a sixth embodiment of the invention is shown generally at 400 in FIG. 13. In this embodiment, the system 400 includes a first plurality of moveable engagement portions of a first plurality of respective support members engageable with a lower surface of the workpiece 24, and also includes a second plurality of moveable engagement portions of a second plurality of support members engageable with an upper surface of the workpiece. In this embodiment, the first and second pluralities of engagement portions are respectively engageable with the lower and upper surfaces of the workpiece at an outer perimeter zone thereof, which in this embodiment is the outer exclusion zone of the workpiece.

More particularly, in this embodiment each of the first plurality of support members includes a support member 404 of a first supporting device 402, which is somewhat similar to the supporting device 102 shown in FIG. 6, and thus includes an actuator 406. In this embodiment, each of the second plurality of support members includes a suppressing member 414 of a suppression device 410, which in turn includes an actuator 416. In this embodiment, the suppressing member 414 and the suppression device 410 are somewhat similar to the supporting member 104 and the supporting device 102 shown in FIG. 6, but are configured to engage the workpiece by contacting the device side 26 of the workpiece, in the outer exclusion zone thereof. In the present embodiment, however, the actuators 406 and 416 are controlled by a controller 420, in communication with force detectors (not shown) in each of the actuators. The controller 420 receives signals from the force detectors representing forces applied by the workpiece 24 to the support member 404 and the suppressing member 414 during thermal bowing or other thermally-induced motion. In response to such force detection signals, the controller 420 adjusts the relative positions and/or forces applied by the support member 404 and the suppressing member 414, to maintain the supporting and suppressing members in contact with the outer exclusion zone of the workpiece during thermal bowing and resulting vibration of the workpiece, as shown in FIG. 14, for example.

To achieve this, the controller 420 is configured to move the first plurality of engagement portions of the support members 404 to minimize a difference between a weight of the workpiece and a force applied between the first plurality of engagement portions and the workpiece, in a manner similar to that discussed above in connection with FIGS. 6-9. Similarly, the controller 420 is configured to move the second plurality of engagement portions of the suppressing members 414, to minimize a force applied between the workpiece and the second plurality of engagement portions. The latter minimization is similar to the former, except that in the case of the suppressing members 414, the desired electric current level in the coil of the actuator 416 corresponds to zero force applied between the suppressing member 414 and the workpiece, whereas in the case of the support members 404, the desired electric current level in the coil of the actuator 406 corresponds to a gravitational force, i.e. the weight of the workpiece on the support members 404. The controller 420 detects deviations from these desired electric current levels, and controls the voltages supplied to the actuators 406 and 416 to move the support members 404 and the suppressing members 414, to restore the electric current levels in the coils of the actuators to their respective desired levels. Ideally, the force detectors and the controller 420 should be shielded so as to minimize any electrical interference or noise that may result from the sudden discharge of the capacitor banks or other pulsed power supply that is used to power the heating device 64 to produce the flash to heat the device side 26 of the workpiece to its final annealing temperature. In addition to the advantages of supporting the workpiece in this manner as discussed earlier herein, the action of the suppressing member 414 and actuator 416 under the direction of the controller 420 assists in suppressing the vibration of the workpiece, thereby reducing the possibility that damage to the workpiece may result from such vibration. If desired, motion translators such as that described earlier herein may also be employed for the supporting member and the suppressing member.

Figure 15:
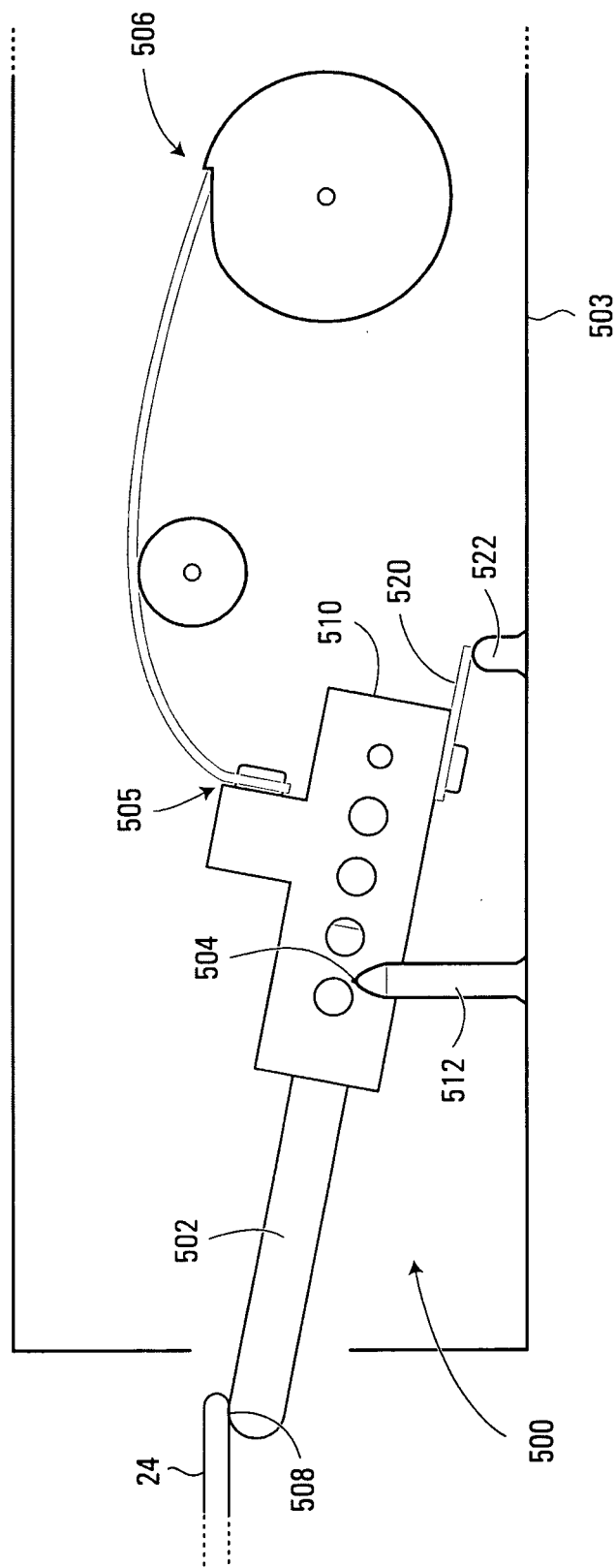
FIG. 15 is a side elevation view of a supporting device of an apparatus for supporting a workpiece, according to a seventh embodiment of the invention.

Referring to FIGS. 1-5 and 15, a supporting device according to a seventh embodiment of the invention is shown generally at 500 in FIG. 15. The supporting device 500 is similar in some respects to the supporting device 80 shown in FIG. 5, and thus includes a support member 502 similar to the support member 82, pivotally mounted to a support member housing 503 at a pivotal axis 504, for pivotal motion thereabout. The housing 503 may include the workpiece plane plate 30 shown in FIGS. 1-4, or alternatively, may include a separate housing such as the housing 36 shown in FIG. 1, for example, if desired. The pivotal axis 504 is interposed between a point 505 at which the support member 502 is connected to a spring 506 (which in this embodiment includes a constant force spring), and a point of contact between a tip 508 of the support member and the workpiece 24. To achieve such a pivotal connection, the support member 502, which in this embodiment includes a quartz pin, is rigidly connected to a casing 510, which in turn is pivotally connected at the pivotal axis 504 to first and second mounting members (one of which is shown at 512) on opposite sides of the casing, each of which is rigidly secured to the housing 503.

Figure 2:
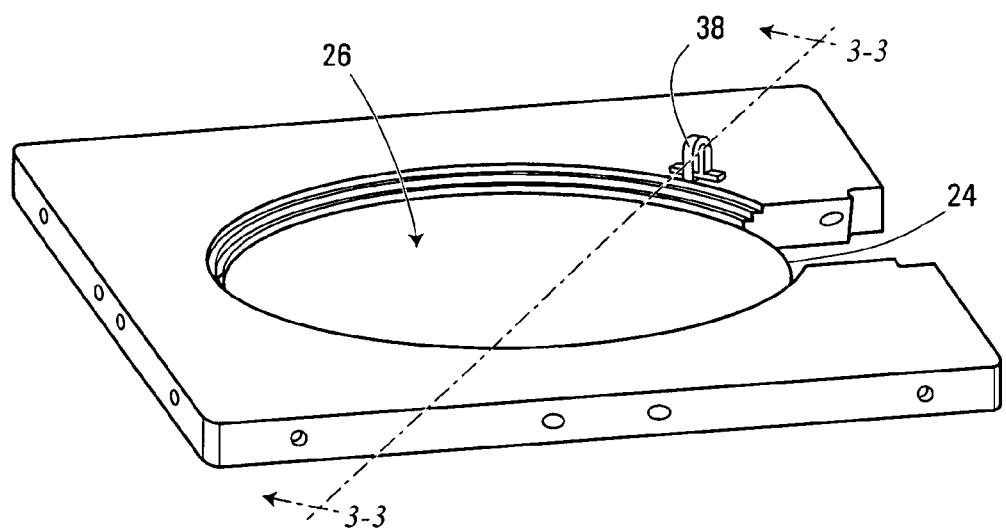
FIG. 2 is a lower perspective view of a spring drum and a support member of a supporting device of the apparatus shown in FIG. 1.

As in the embodiment shown in FIGS. 1-3, the supporting device 500 of the present embodiment includes a force applicator in communication with the support member 502 to apply a force thereto, to cause the engagement portion of the support member 502 to tend to maintain contact with the workpiece during the thermally-induced motion thereof. However, in this embodiment the force applicator includes first and second torque applicators configured to apply first and second opposing torques to the support member 502, the second torque acting to oppose overshoot by the support member 502 of an equilibrium position thereof. More particularly, in the present embodiment, the first torque applicator includes the spring 506, which applies a torque (in a clockwise direction as shown in FIG. 15) that tends to counter-balance an opposing torque applied by the weight of the workpiece 24 on the tip 508 of the support member 502. In this embodiment, the second torque applicator includes a second spring 520, which in this embodiment is connected to the supporting device 500 at an end distal or opposite from the tip 508 of the support member 502. In this embodiment, the second spring 520 includes a flexible elongated metal member extending from the supporting device 500 in a direction away from the workpiece 24. When the workpiece 24 is at rest and the supporting device is at equilibrium, a distal end of the second spring 520 maintains contact with a rigid stopper 522 protruding upward from a lower surface of the housing 503. During operation, when the outer edges of the workpiece 24 initially thermally bow downward, the support member 502 pivots (in a direction counter-clockwise shown in FIG. 15) relative to the housing 503, and accordingly, the distal end of the second spring 520 rises upward away from the stopper 522 along a counter-clockwise arcuate path. Several milliseconds later, when the outer edge of the workpiece 24 rapidly oscillates back upward, the force applied to the supporting device 500 by the first spring 506 causes the support member 502 to pivot in a clockwise direction, until the second spring 520 contacts the stopper 522 and bends as the supporting device overshoots its equilibrium angular position, thereby applying a counterclockwise torque to the supporting device to cause it to tend to return toward its equilibrium angle. It will be appreciated that the stopper 522 in this embodiment prevents the supporting device 500 from rotating clockwise too far past its equilibrium angular position. Advantageously, because the second spring 520 engages the stopper 522 in a resilient manner to achieve this, deleterious effects that would have otherwise have occurred (such as particle contamination that would have resulted from an abrupt collision between a rigid portion of the supporting device and the stopper) are minimized or avoided.

Figure 16:
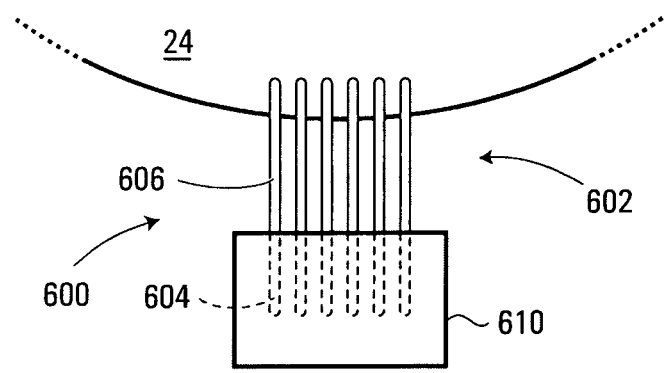
FIG. 16 is a partial bottom elevation view of a supporting device of an apparatus for supporting a workpiece, according to an eighth embodiment of the invention.

Referring to FIG. 16, a supporting device according to an eighth embodiment of the invention is shown generally at 600. In this embodiment, the supporting device 600 includes a plurality of flexible support members shown generally at 602. In the present embodiment, each of the flexible support members 602 has a constrained portion such as that shown at 604, and an unconstrained portion such as that shown at 606. In this embodiment, the moveable engagement portion of each of the support members 602 includes the unconstrained portion 606.

In the present embodiment, each of the flexible support members 602 includes a flexible fiber. More particularly, in this embodiment each of the flexible fibers includes an optical fiber. More particularly still, in the present embodiment each of the flexible fibers includes a quartz optical fiber. In the present embodiment, optical fibers were selected due to their widespread availability, low cost and adequate mechanical properties, although some optical fibers may be undesirably brittle for certain applications. Alternatively, however, other types of fibers may be substituted. For example (without limitation), fibers composed of sapphire, crystalline quartz covered with amorphous quartz, silicon carbide, carbon fiber, metal-in-quartz, glass, or metal-in-glass, may be substituted. For example, sapphire fibers typically have greater strength than quartz, and may be advantageous for embodiments such as the present embodiment, in which an cater cladding of the fiber has been removed or is otherwise not present, as discussed in greater detail below. More generally, other types of flexible support members may be substituted. Preferably, for the purposes of the present embodiment, suitable flexible support members should be non-contaminating, flexible, low-mass, and should possess adequate temperature survivability to withstand the thermal cycles described herein.

It will be appreciated that optical fibers are typically sold with an outer aluminum coating or cladding. Thus, to prevent the aluminum cladding from contacting and contaminating the workpiece, in the present embodiment, the aluminum coating has been chemically removed from the distal ends of the unconstrained portions of the flexible support members 602 ("distal" meaning distal from the casing 610). More particularly, in this embodiment the aluminum cladding has been removed along a length of 2 mm from the distal end of each of the unconstrained portions 606. The unclad distal end of each of the unconstrained portions 606 preferably has a smooth surface, such as the smooth surfaces discussed below in connection with FIG. 37, for example.

Referring to FIG. 16, in this embodiment, the supporting device 600 includes at least ore constrainer configured to constrain the constrained portions 604 of the flexible support members 602. More particularly, in this embodiment the at least one constrainer includes a casing 610 of the supporting device 600. In this embodiment, each of the constrained portions 604 has a length of 10 mm, and is constrained or locked in position within the casing 610. Also in this embodiment, each of the unconstrained portions has a length of 17 mm, of which 15 mm is aluminum-clad and the remaining 2 mm is the unclad distal end. Each of the unconstrained portions 606 extends from the casing 610 so that the unclad distal end of each unconstrained portion 606 engages the workpiece 24 in its outer exclusion zone. Also in this embodiment, each of the flexible support members 602 has a diameter of less than 2 mm. Alternatively, however, other dimensions or combinations of dimensions may be substituted in a particular embodiment. Generally, the dimensions will be selected to provide the desired balance of flexibility and sufficiently fast response time. In this regard, a larger diameter typically tends to increase the stiffness of the support member. Lengthening the unconstrained portion of the support member may serve to decrease its stiffness and thus allow for a thicker diameter, although this approach tends to slow the response time constant of the support member, which is also undesirable in the present embodiment. It is also desirable to minimize the mass of the flexible support members. Thus, in embodiments such as the present embodiment, where the workpiece is a semiconductor wafer expected to experience extremely rapid thermal bowing and vibration, the diameter will be sufficiently small and the unconstrained length sufficiently long to provide the desired resiliency or flexibility, while the length should also be sufficiently short to provide a fast response time to allow the flexible support members to react to workpiece movements on a time scale on the order of a millisecond or less, while at the same time achieving these goals with a minimum mass of the unconstrained portion.

In general, the frequency of vibration of a support member is related to its physical dimensions and mass as follows:

$$\omega_n = A \sqrt{\frac{EI}{\mu * t^4}} \text{ RAD/SEC}$$

where
 E=Young's Modulus [N/m$^2$]
 I=Area Moment of Inertia of Support Member Cross Section [m$^4$]
 t=Length of Support Member [m]
 μ=Mass per Unit Length of Support Member [kg/m]
 A=Coefficient (A=3.52 for vibrational mode 2; A=22.0 for mode 2; A=61.7 for mode 3, etc.)

Thus, the foregoing relationship and observations may be used to assist in the selection of a desired length and diameter of the support members for a given application.

Figure 19:
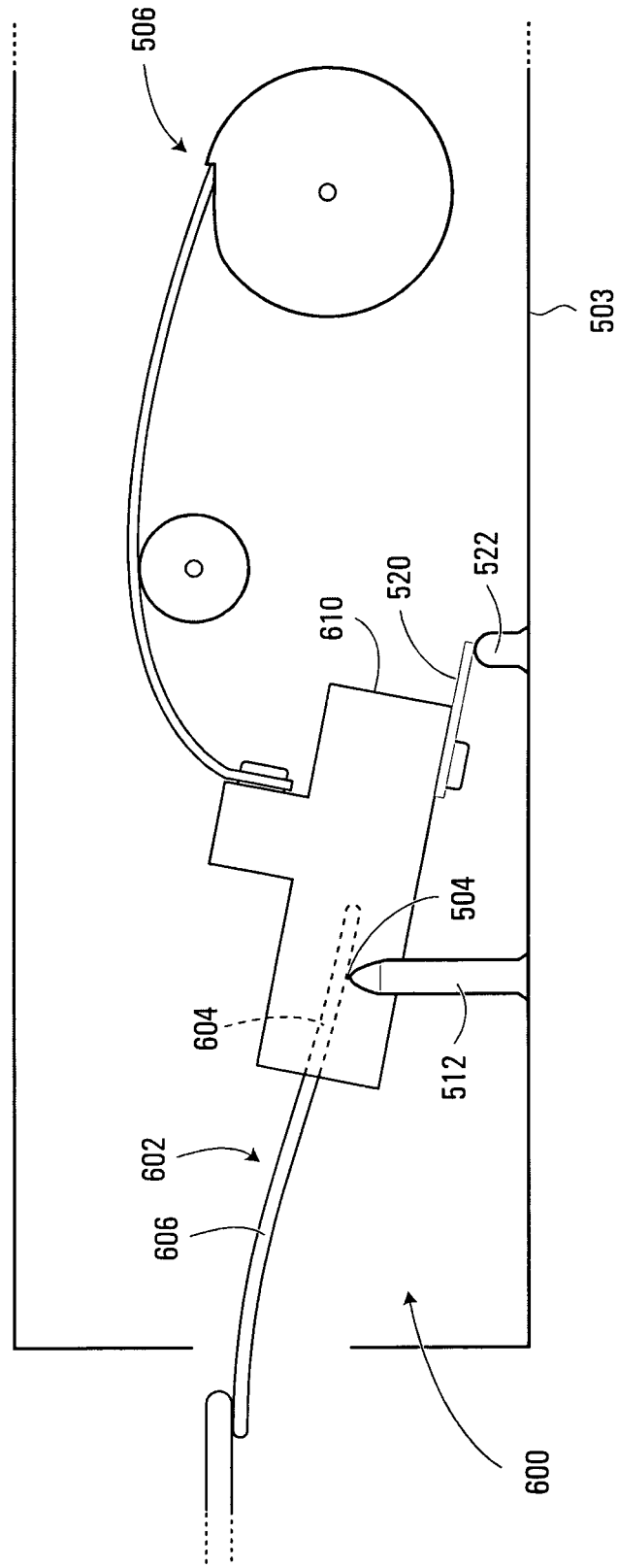
FIG. 19 is a side elevation view of the supporting device shown in FIG. 16.

Referring to FIGS. 15, 16 and 19, in this embodiment, the supporting device 600 shown in FIGS. 16 and 19 is somewhat similar to the supporting device 500 shown in FIG. 15, the most significant difference being the substitution of the flexible support members 602 (in this embodiment, flexible quartz fibers) for the rigid support member 502. Thus, the present embodiment includes a plurality of force applicators configured to apply forces to the plurality of supporting devices 600 to cause each of the unconstrained portions 606 to tend to maintain contact with the workpiece 24 during the thermally-induced motion of the workpiece. More particularly, the force applicators comprise torque applicators, or more particularly, the springs 506 and 520.

In this embodiment, a support system includes a plurality of supporting devices similar to the supporting device 600, disposed at various intervals around the outer perimeter of the workpiece 24. Thus, in this embodiment the at least one constrainer includes a plurality of constrainers, i.e. the plurality of casings 610 of the respective supporting devices 600, disposed around the outer perimeter of the workpiece. As is apparent from FIG. 16, in this embodiment the plurality of constrainers consists of fewer constrainers than the number of the flexible support members, and each of the constrainers is configured to constrain more than one of the flexible support members, such as the set of six support members 602 shown in FIG. 16, for example. More particularly, in this embodiment each of the constrainers, i.e. each of the casings 610, is configured to constrain the more than one of the flexible support members generally parallel to each other.

Figure 17:
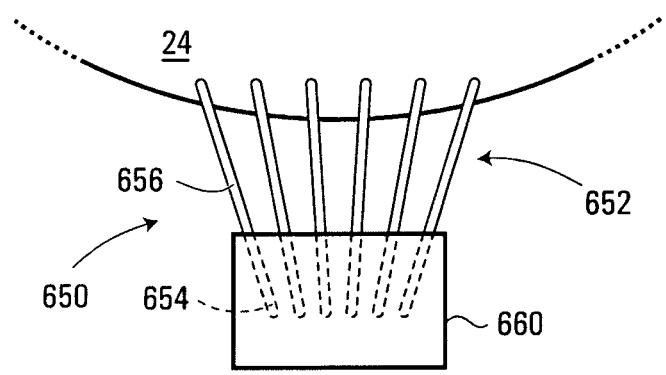
FIG. 17 is a partial bottom elevation view of a supporting device of an apparatus for supporting a workpiece, according to a ninth embodiment of the invention.

Referring to FIGS. 16 and 17, a supporting device according to a ninth embodiment of the invention is shown generally at 650 in FIG. 17. The supporting device 650 is generally similar to the supporting device 600, and includes a plurality of flexible support members shown generally at 652, each of which has a constrained portion such as that shown at 654, and an unconstrained portion such as that shown at 656. Each of the constrained portions is constrained or locked in position within constrainer, or more particularly, within a casing 660. As in the preceding embodiment, each constrainer constrains more than one of the flexible support members 652. However, in this embodiment each constrainer is configured to constrain the more than one of the flexible support members generally divergent from each other. Thus, in this embodiment, the flexible support members 652 are not generally parallel, but rather, extend from the casing 660 toward the workpiece 24 in a divergent manner. In the embodiment shown in FIG. 17, the flexible support members are generally straight (but may include curved end regions as discussed in greater detail below in connection with FIG. 20), and extend from the casing 660 along outwardly diverging paths.

Figure 18:
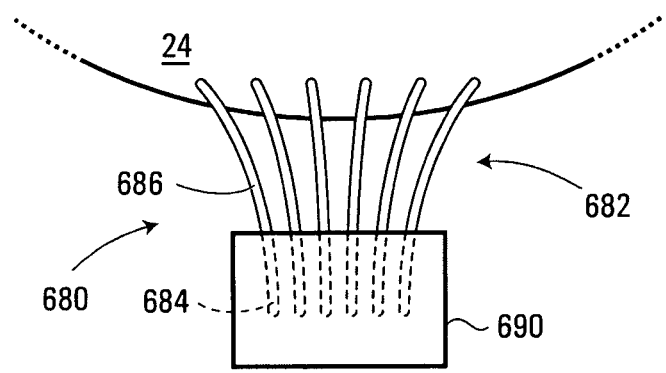
FIG. 18 is a partial bottom elevation view of a supporting device of an apparatus for supporting a workpiece, according to a tenth embodiment of the invention.

Referring to FIGS. 17 and 18, alternatively, if desired, the flexible support members may diverge by extending along respective curved paths. For example, a supporting device according to a tenth embodiment of the invention is shown generally at 680 in FIG. 18. The supporting device 680 is generally similar to the supporting device 650, and includes a plurality of flexible support members shown generally at 682, each of which has a constrained portion such as that shown at 684, and an unconstrained portion such as that shown at 686. Each of the constrained portions is constrained or locked in position within a casing 690. In this embodiment, however, the flexible support members 682 extend from the casing 690 toward the workpiece 24 along respective divergent curved paths. To achieve this, the plurality of flexible support members 682 may be pre-heated and bent into the desired curvature.

As a further alternative, if desired, each constrainer may constrain a constrained portion of only a single respective corresponding one of the flexible support members. More generally, the flexible support members 602 of the supporting device 600 may be employed in other embodiments of the invention, such as any of the other embodiments described herein, for example.

Embodiments such as those shown in FIGS. 17 and 18 tend to allow a broader distribution of contact points with the workpiece, and reduce shadowing effects.

Referring to FIGS. 16 to 19, in the above embodiments, a support system for resiliently supporting the workpiece includes a plurality of support devices similar to the supporting device 600 (or alternatively, 650 or 680), disposed at various angular positions around the outer edge of the workpiece. Although three, or even two, such supporting devices may suffice for some applications, such a system preferably includes four or more such supporting devices, to provide adequate stability of support in the event that one of the supporting devices may fail to properly engage the workpiece.

Referring to FIG. 19, in this embodiment, the flexible support members 602 (or alternatively, 652 or 682) engage the outer exclusion zone of the workpiece at an angle of approximately 25° relative to the plane of the workpiece. Alternatively, other angles may be substituted.

Figure 20:
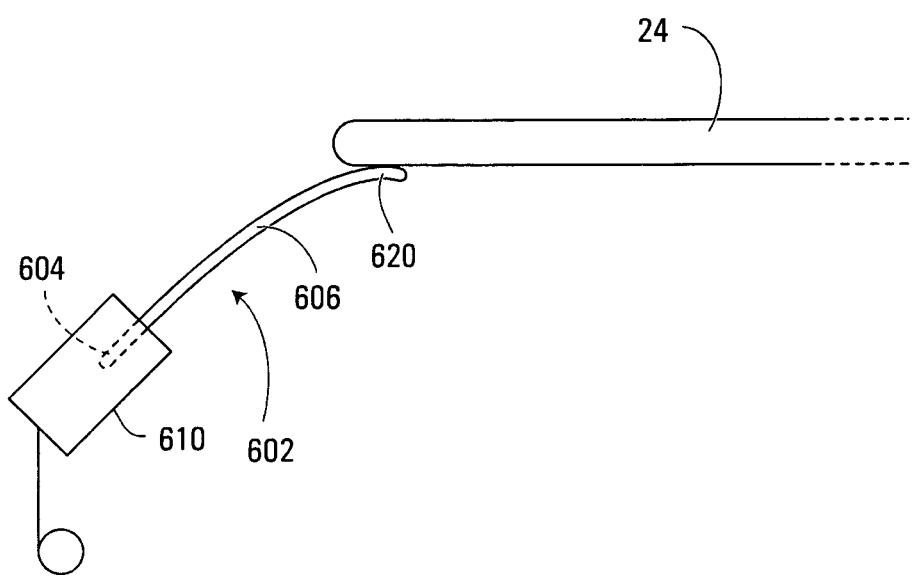
FIG. 20 is a partial side elevation view of a supporting device of an apparatus for supporting a workpiece, according to an eleventh embodiment of the invention.

Alternatively, referring to FIG. 20, in an eleventh embodiment of the invention, the flexible support members 602 (or alternatively, 652 or 682) may engage the outer exclusion zone of the workpiece at steeper angles, such as the angle of engagement between the unconstrained portion 606 of the flexible support member 602 and the workpiece 24 shown in FIG. 20, for example. If such a steeper engagement angle is employed, the unconstrained portion 606 of each of the flexible support members 602 preferably has a curved end region 620 for engaging the outer exclusion zone of the workpiece 24. Such curvature may be achieved by pre-heating the flexible support member and mechanically bending the end region 620 while it is heated, for example. The curvature of the end region 620 serves to minimize scraping of the substrate side of the workpiece by the end region 620 that might otherwise occur during thermal bowing and vibration of the workpiece.

Although the foregoing embodiment described the flexible support members 602 (or alternatively, 652 or 682) of the supporting device 600 (or 650 or 680) as being used in conjunction with one or more springs (such as the springs 506 and 520 shown in FIGS. 15 and 19 for example), alternatively, in some embodiments the flexibility provided by the flexible support members 602 (or 652 or 682) will be sufficient to resiliently support the workpiece without the need for any such springs or other resilient or flexible components. Thus, in such an embodiment, the position and orientation of the casing 610 may be fixed, and only the unconstrained portions of the flexible support members may move.

Figure 21:
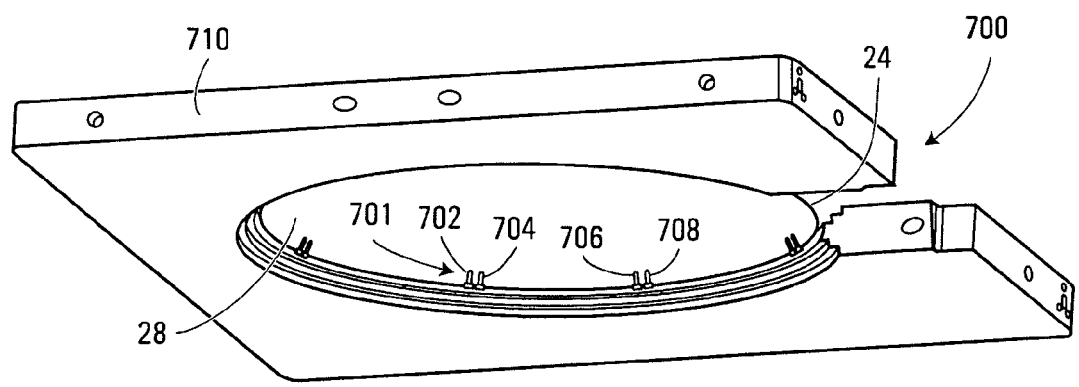
FIG. 21 is a perspective view of a workpiece and a supporting device of an apparatus for supporting the workpiece, according to a twelfth embodiment of the invention.

For example, referring to FIG. 21, a support system for supporting the workpiece 24 according to a twelfth embodiment of the invention is shown generally at 700. In this embodiment, the support system 700 includes a plurality of supporting devices 701 such as those shown at 702, 704, 706 and 708 for example, disposed at various intervals around an inner workpiece support aperture of a workpiece plane plate 710. In the present embodiment, the supporting device 702 and other similar supporting devices extend inwardly and upwardly from a lower region of the workpiece plane plate 710, to resiliently engage the outer exclusion zone of the substrate side 28 of the workpiece 24.

Figure 22:
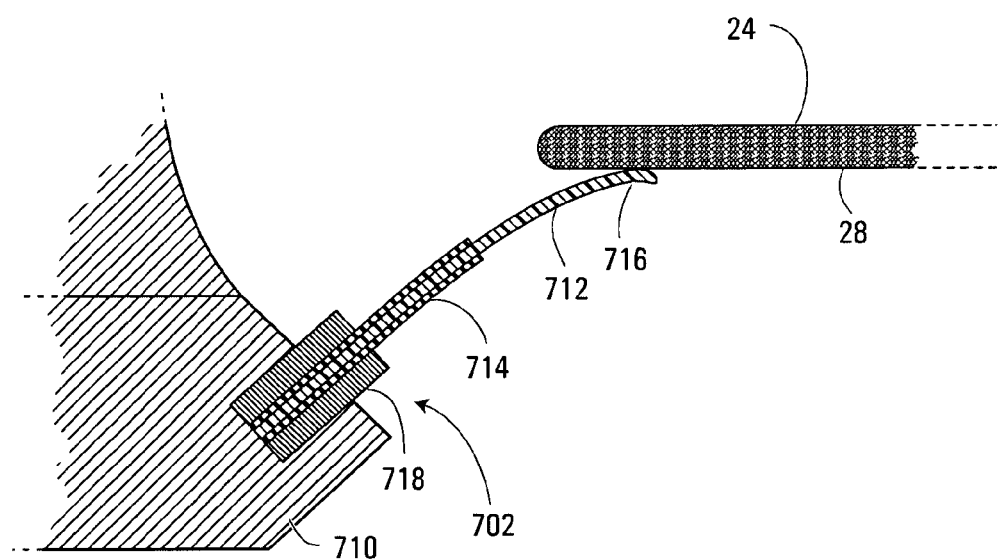
FIG. 22 is a cross-section of the supporting device shown in FIG. 21.

Referring to FIGS. 21 and 22, the supporting device 702 is shown in greater detail in FIG. 22. In this embodiment, the supporting device 702 includes a flexible support member 712, which in this embodiment includes a quartz optical fiber, although alternatively, other suitable flexible support members may be substituted, as discussed earlier herein. In the present embodiment, the flexible support member 712 is partly contained within a cladding layer 714, which in this embodiment is the aluminum cladding layer in which the quartz fiber is commercially sold. The aluminum cladding layer has been chemically removed from an unclad end region 716 of the flexible support member 712 distal from the workpiece plane plate 710 (proximal to the workpiece 24), so that the exposed or unclad end region 716 of the quartz fiber contacts the outer exclusion zone of the substrate side 28 of the workpiece 24. As described above in connection with the preceding embodiment, in the present embodiment the end region 716 of the flexible support member 712 is curved, to minimize scraping of the substrate side 28 of the workpiece by the flexible support member during thermally-induced bowing and vibratory motions of the workpiece. In this embodiment, the aluminum cladding layer is tightly secured within a casing 718, which in this embodiment includes a stainless steel tube. The casing 718 is tightly secured within the workpiece plane plate 710.

In this embodiment, the flexible support member 712 has a length of 27 mm, of which an end region proximal to the workpiece plane plate 710 having a length of 10 mm is encased within both the cladding layer 714 and the casing 718, a middle region having a length of 13 mm is encased only within the cladding layer 714, and the end region 716 distal from the workpiece plane, which has a length of 4 mm, is exposed, surrounded by neither the casing nor the cladding layer. In the present embodiment, the casing 718 and cladding layer 714 extend from the workpiece plane plate 710 at an angle of 35° from the vertical (or 55° relative to the workpiece plane), although this angle was selected primarily for convenience to minimize the modifications required to the workpiece plane plate. Alternative angles are discussed in greater detail below. More generally, other combinations of dimensions, angles or configurations may be substituted, as desired.

Referring to FIGS. 21 and 22, in this embodiment, the support system 700 includes a plurality of supporting devices such as the supporting device 702 shown in FIGS. 21 and 22, disposed at various locations around the workpiece plane plate. More particularly, in the present embodiment the workpiece support system 700 includes 16 such supporting devices, arranged in eight closely-spaced pairs, each pair disposed symmetrically around the circumference of the workpiece 24 at 45° intervals. In this regard, among other advantages, the placement of such supporting devices in closely-spaced pairs at each angular position effectively provides a back-up, so that if one of the pair of supporting devices fails to operate as intended, the other supporting device of the pair will generally be able to adequately support the workpiece at that angular position, thereby preventing the workpiece from falling or being damaged.

Alternatively, however, other numbers and angular configurations of supporting devices may be provided. Generally, for embodiments similar to the present embodiment, it is preferable that the selection of the number and positions of such supporting devices be guided by a desire to minimize the mass of the supporting devices, while at the same time providing an adequate quantity of such supporting devices to support the workpiece throughout the thermally-induced bowing and vibratory motions described herein.

For example, still referring to FIGS. 21 and 22, in a similar alternative embodiment, which may be suitable for processing of 200 mm diameter wafers, for example, a modified workpiece support system 700 includes 6 such supporting devices 702, arranged in three closely-spaced pairs, each pair disposed symmetrically around the circumference of the workpiece 24 at 120° intervals. Similarly, in yet another alternative embodiment, which may be suitable for processing of 300 mm diameter wafers, for example, a modified workpiece support system 700 includes 8 such supporting devices 702, arranged in four closely-spaced pairs, each pair disposed symmetrically around the circumference of the workpiece 24 at 90° intervals. The supporting devices 702 of these alternative embodiments are similar to those shown in FIG. 22, although in these alternative embodiments the exposed or unclad end region 716 has a length of 2 mm. In this regard, a shortening of the length of the unclad end region 716 has been found to reduce the likelihood of fiber breakage. In these embodiments, the shortened unclad end regions 716 have smooth-surfaced tips, as described below in connection with FIG. 37.

Also in these alternative embodiments, the angle of engagement of the supporting device 702 relative to the plane of the workpiece 24 has been altered. In these embodiments, each of the engagement portions is engageable with the lower surface of the workpiece 24 at an angle of 10 to 80 degrees relative to a plane of the workpiece. More particularly, in these embodiments the angle is 15 to 35 degrees.

More particularly still, in these alternative embodiments the angle is 25 degrees. In this regard, although the selection of the desired angle may vary from application to application, it has been found that for some semiconductor wafer applications, an engagement angle that is steep, such as 80 to 90° for example, increases the likelihood of gouging the wafer and damaging the support members or the wafer, while angles that are shallow, such as 0 to 10° for example, increase the likelihood of breakage of the flexible support members 712. Thus, for some applications, an angle of engagement in the range of 10 to 80° relative to the workpiece plane will be preferred; an angle of engagement of 15 to 35° will be more strongly preferred; an angle of engagement of 25° will be more preferable still for certain applications. Alternatively, however, other angles may be substituted.

In all such embodiments, it is preferable for the unencased portion of the flexible support member 712, i.e., the portion of the flexible support member 712 that extends beyond the casing 718, to be precisely identical in length to the unencased portions of the other flexible support members used in a given system, to maintain consistent flexibility from support member to support member. For similar reasons, it is preferable to precisely control the lengths of the unclad end regions 716 for consistency in flexibility and breakage resistance. Likewise, it is preferable for each of the supporting devices 702 to engage the workpiece 24 at the same angle.

More generally, other suitable configurations and dimensions, whether symmetrical and consistent or otherwise, may be substituted.

Figure 23:
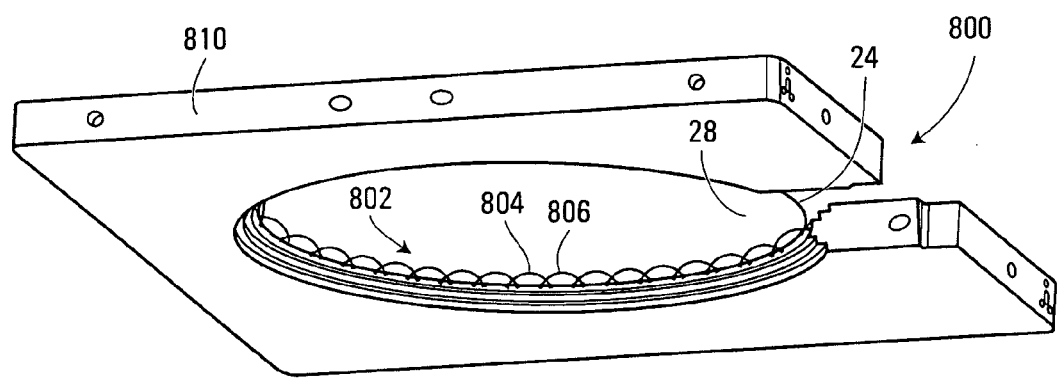
FIG. 23 is a perspective view of a workpiece and a support system of an apparatus for supporting the workpiece, according to a thirteenth embodiment of the invention.
Figure 24:
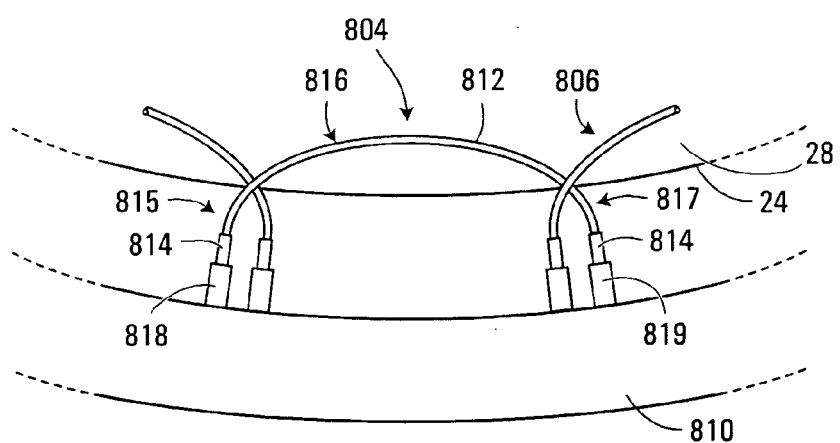
FIG. 24 is a partial bottom elevation view of a supporting device of the support system shown in FIG. 23.
Figure 25:
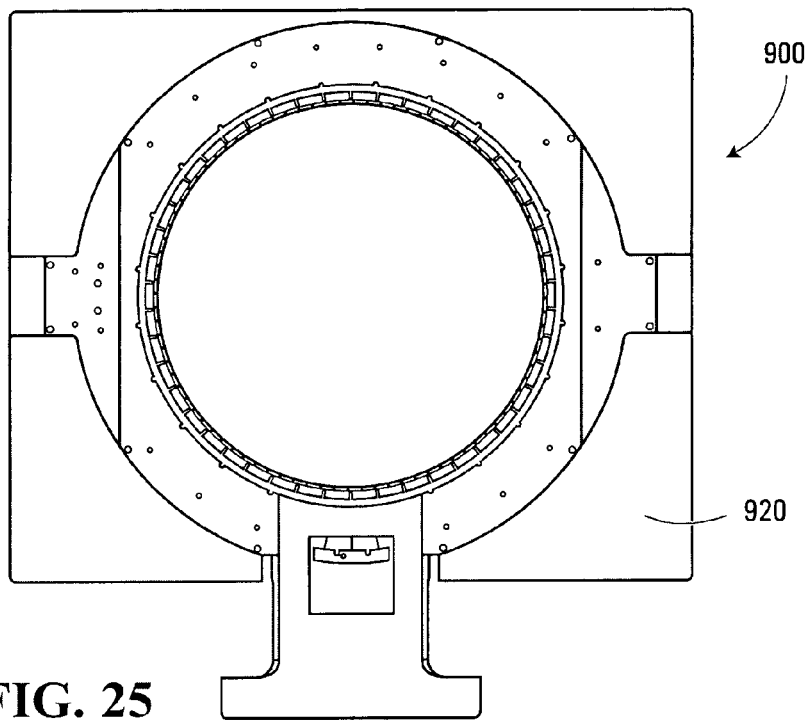
FIG. 25 is a top elevation view of a workpiece and a support system for supporting the workpiece, according to a fourteenth embodiment of the invention.
Figure 26:
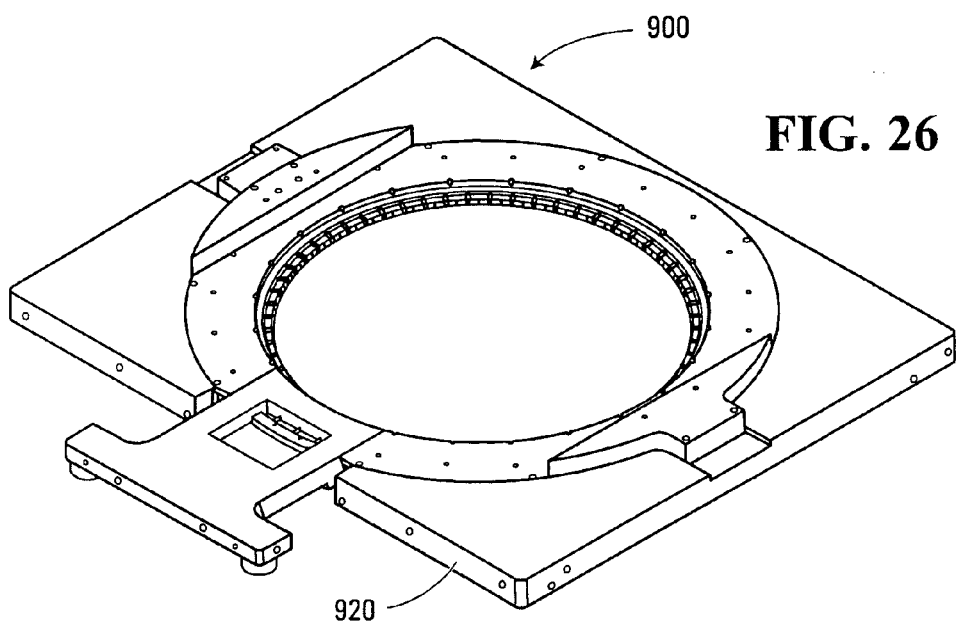
FIG. 26 is a top perspective view of the workpiece and support system shown in FIG. 25.
Figure 27:
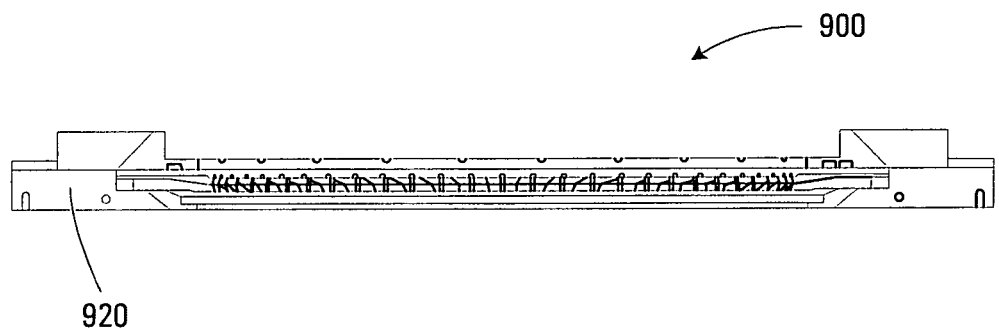
FIG. 27 is a cross-section of the workpiece and support system shown in FIG. 25.

Referring to FIGS. 23 and 24, a support system for supporting the workpiece 24 according to a thirteenth embodiment of the invention is shown generally at 800 in FIG. 23. In this embodiment, the support system 800 includes a plurality of supporting devices 802 such as those shown at 804, 806 and 808 for example, disposed at various intervals around an inner workpiece support aperture of a workpiece plane plate 810. In the present embodiment, the supporting devices 802 extend inwardly and upwardly from a lower region of the workpiece plane plate 810, to resiliently engage the outer exclusion zone of the substrate side 28 of the workpiece 24. However, unlike the previous embodiment shown in FIGS. 21 and 22, in the embodiment shown in FIGS. 23 and 24, each supporting device includes a flexible curved support member resiliently engageable with the exclusion zone of the workpiece.

In this regard, referring to FIG. 24, the supporting device 804 is shown in greater detail. In this embodiment, the supporting device 804 includes a flexible curved support member 812, which in this embodiment includes an optical quartz fiber, although alternatively, other types of flexible support members may be substituted. In this embodiment, the flexible curved support member 812 includes first and second spaced apart constrained portions, with an unconstrained portion extending in a curved path therebetween. More particularly, in this embodiment the first constrained portion includes a first end region 815, the unconstrained portion includes a middle region 816, and the second constrained portion includes a second end region 817. The first and second constrained portions are thus at opposite ends of the support member 812, and define the unconstrained portion therebetween. The first and second constrained portions, or more particularly, the first and second end regions 815 and 817, are affixed to the workpiece plane plate 810 to prevent motion of the constrained portions. In this embodiment, the flexible curved support member 812 is partly contained within a cladding layer 814, which in this embodiment is the aluminum cladding layer in which the quartz fiber is commercially sold. The aluminum cladding layer has been chemically removed from the middle region 816 of the flexible curved support member 812, so that the exposed middle region 816 of the quartz fiber contacts the outer exclusion zone of the substrate side 28 of the workpiece 24.

In this embodiment, the system 800 includes first and second constrainers configured to constrain the first and second constrained portions (i.e. the first and second end regions 815 and 817) in spaced apart relation to cause the unconstrained portion (i.e. the middle region 816) to extend in a curved path therebetween. More particularly, in this embodiment the first and second constrainers include first and second casings 818 and 819. At the first end region 815, the aluminum cladding layer 814 surrounding the flexible curved support member 812 is tightly secured within the first casing 818, which in this embodiment includes a stainless steel tube. Likewise, in this embodiment, at the second end region 817, the aluminum cladding layer 814 surrounding the flexible curved support member 812 is tightly secured within the second casing 819, which includes a similar stainless steel tube. The casings 818 and 819 are tightly secured within the workpiece plane plate 810.

Referring to FIGS. 22 and 24, in this embodiment, each of the casings 818 and 819 is similar to the casing 718 shown in FIG. 22, and is similarly secured to the workpiece plane plate. In this embodiment, however, the first and second constrainers, which in this embodiment include the casings 818 and 819, are configured to constrain the first and second constrained portions (i.e. the first and second end regions 815 and 817) to cause the unconstrained portion (the middle region 816) to extend along the curved path from the first constrained portion upwardly and inwardly toward the workpiece 24 to a region of contact therewith and to extend from the region of contact downwardly and outwardly to the second constrained portion. More particularly, rather than extending linearly inward and upward toward the workpiece, the flexible curved support member 812 protrudes from the casing 818 and cladding layer 814 at the first end region 815, and extends inwardly and upwardly along an approximately arcuate path toward the workpiece 24, so that a center of the middle region 816 contacts and supports the outer exclusion zone of the substrate side 28 of the workpiece 24. The flexible curved support member 812 then continues to extend, from its center, downwardly and outwardly along the arcuate path, to the second end region 817, where the cladding layer 814 surrounding the end region 817 is secured within the casing 819. At the center of the middle region 816 that contacts the workpiece, a tangent to the unconstrained portion (i.e. a tangent to the middle region 816 at the center thereof) is substantially parallel to a tangent to an outer circumference of the workpiece 24 in the vicinity of the region of contact. In this embodiment, as in the embodiment shown in FIG. 22, the angle of the arcuate path of the flexible curved support member 812 is approximately 35° from the vertical, although again, this angle was chosen for convenience, to minimize modifications to an existing workpiece plane plate. Alternatively, other angles and configurations may be substituted. In exemplary embodiments, the flexible support member 812 may extend from the first end region 815 for a length of 10-20 mm within the casing 818, and may extend for a further length of 20-40 mm beyond the casing within the cladding layer 814, and may extend for a further unclad length of 2-4 mm at a central region thereof, at which the flexible support member 812 contacts the workpiece 24. The flexible support member may then extend for a further length of 20-40 mm within the cladding layer 814 toward the second end region 817, and extend for a further length of 10-22 mm within the casing 819. The flexible support member may have a diameter of 0.5 to 2 mm, for example. Alternatively, other lengths and diameters may be substituted if desired. In further similar embodiments, such as those in which the flexible support member 812 includes a material such as sapphire, the cladding layer 814 may be omitted entirely if desired.

In this embodiment, the plurality of supporting devices 802 includes at least four such supporting devices similar to the supporting device 804, to provide adequately stable support in the event that one of the supporting devices breaks or otherwise fails. More particularly, in this embodiment the plurality of supporting devices 802 includes 20 such supporting devices. Alternatively, however, other numbers of supporting devices may be substituted if desired.

Referring to FIGS. 25-30, a support system for supporting the workpiece 24 according to a fourteenth embodiment of the invention is shown generally at 900. In this embodiment, the support system 900 includes a plurality of flexible support members shown generally at 902. In the present embodiment, each of the flexible support members 902 includes a flexible fiber resiliently engageable with the workpiece. More particularly, as in previous embodiments, in the present embodiment each of the flexible fibers includes a quartz optical fiber, although alternatively, as discussed elsewhere herein, sapphire or other types of fibers, or more generally, other types of flexible support members, may be substituted. Preferably, for the purposes of the present embodiment, alternative flexible support members should be non-contaminating, flexible, low-mass, and should possess adequate temperature survivability to withstand the thermal cycles described herein.

Figure 28:
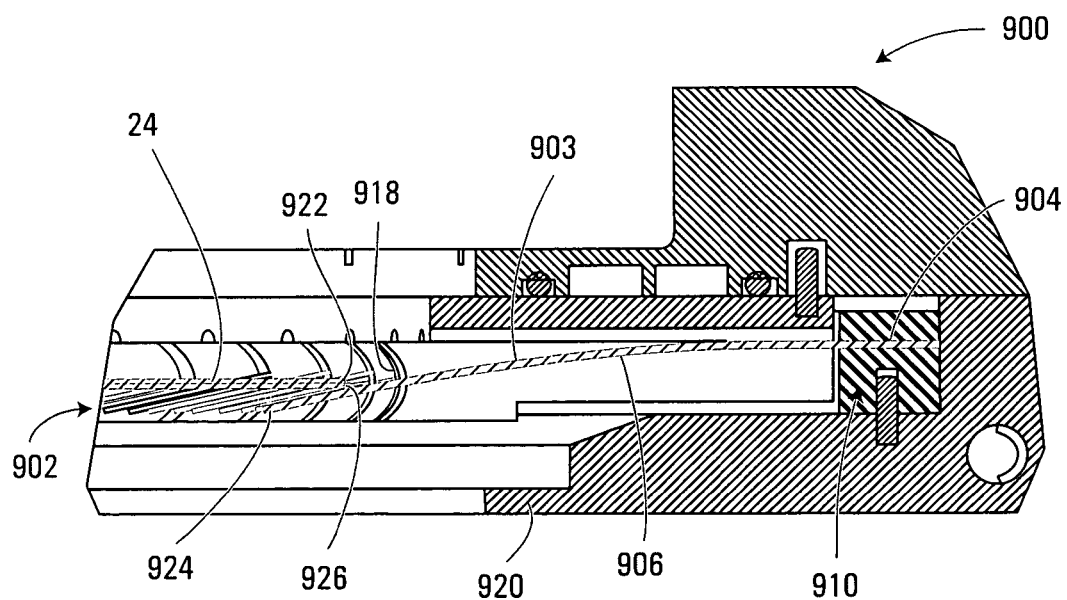
FIG. 28 is a detail of the cross-section of the workpiece and the support system shown in FIG. 27.
Figure 30:
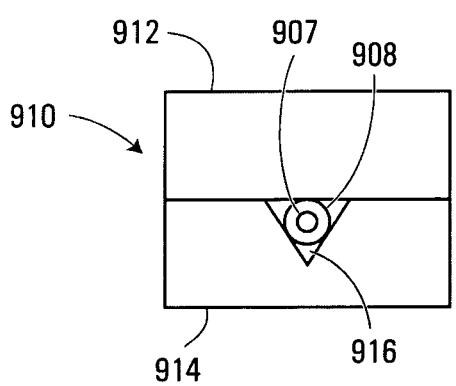
FIG. 30 is a rear elevation view of a support member clamp of the support system shown in FIGS. 25-29.

Referring to FIGS. 28 and 30, an exemplary flexible support member is shown generally at 903 in FIG. 28. For ease of illustration, only the exemplary support member is described, it being understood that the remaining flexible support members 902 are similar. In this embodiment, the flexible support member 903 has a constrained portion 904, and an unconstrained portion 906. More particularly, in the present embodiment the flexible support member 903 includes the constrained portion 904 at an end thereof, and the unconstrained portion 906 extends inwardly from the constrained portion 904 toward a central region of the workpiece 24.

In this embodiment, the flexible support member 903 includes a fiber 907. In the present embodiment, a portion of the length of the flexible fiber 907 is encased within an outer cladding layer 908, which in this embodiment is an aluminum coating layer that is commercially sold with the fiber 907. In this regard, to prevent the aluminum cladding from contacting and contaminating the workpiece, in the present embodiment, the aluminum coating has been chemically removed from a segment of the length of the unconstrained portion 906 of the flexible support members 903. More particularly, in this embodiment the flexible support member 903 has a length of 65 mm, and the aluminum cladding or coating has been chemically removed from the innermost 40 mm of its length.

Alternatively, other suitable lengths may be substituted, depending upon the desired flexibility and mass of the flexible support members 902. For example, the aluminum coating or cladding layer may be omitted entirely in some embodiments, such as embodiments in which the support members include sapphire.

In this embodiment, the support system 900 includes at least one constrainer for constraining the constrained portion 904. In the present embodiment, the at least one constrainer includes a workpiece plane plate 920. More particularly, in this embodiment the at least one constrainer includes a plurality of clamps defined within the workpiece plane plate, for clamping the constrained portions of the plurality of flexible support members 902. More particularly still, in the present embodiment, each constrained portion 904 is constrained or locked in position within a clamp shown generally at 910 in FIGS. 28 and 30. In this embodiment, the clamp 910 includes an upper clamping member 912 and a lower clamping member 914. More particularly, in the present embodiment, the upper clamping member 912 has a generally planar lower surface, and the lower clamping member 914 has a V-shaped groove or channel 916 defined in its upper surface, extending along the length of the lower clamping member 914. The dimensions of the V-shaped groove 916 are selected so that the flexible support member 903 can be inserted into the V-shaped groove 916, such that when the lower surface of the upper clamping member 912 is pressed against the upper surface of the lower clamping member 914, the outer cladding layer 908 is snugly secured between the lower surface of the upper clamping member 912 and the two surfaces of the V-shaped groove 916, thereby preventing the portion of the flexible support member 903 that is secured within the clamp 910 from movement relative thereto. The clamp 910 is oriented so that the V-shaped groove 916, and hence the flexible support member 903, point radially inward toward the center of the workpiece 24.

In this embodiment, a plurality of clamps such as that shown at 910 are defined by an upper clamping ring that effectively acts as a plurality of upper clamping members 912, and a lower clamping ring with a plurality of V-shaped grooms defined therein, which effectively acts as a plurality of lower clamping members 914. The upper and lower clamping rings extend radially inward for a length of approximately 10 mm, in which the constrained portion 904 of each flexible support member 902 is snugly secured. Alternatively, other constrained lengths may be substituted if desired.

Figure 29:
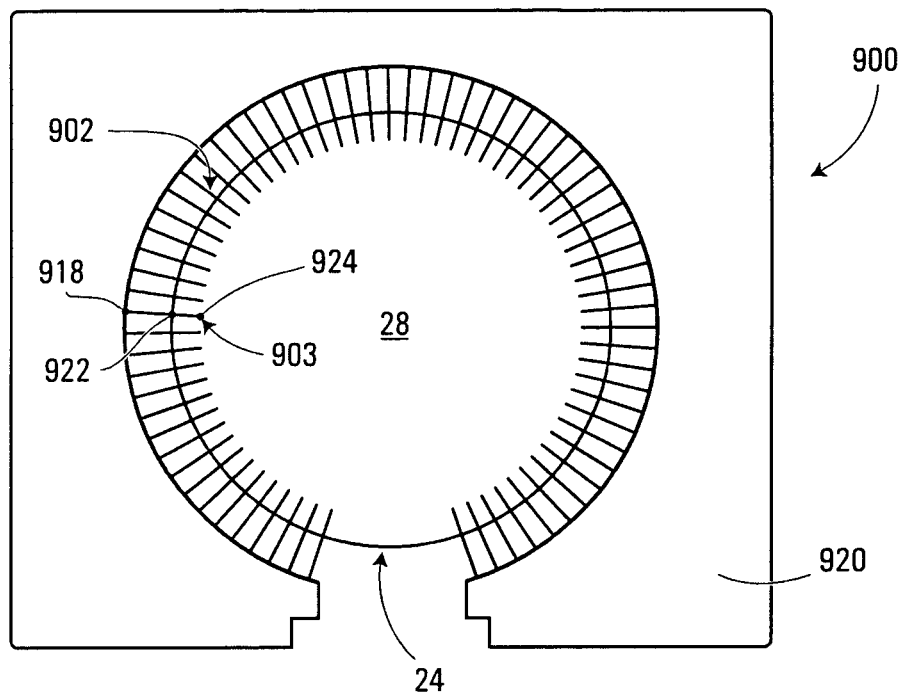
FIG. 29 is a bottom elevation view of the workpiece and the support system shown in FIG. 25.

Referring to FIGS. 28 and 29, in this embodiment the workpiece plane plate 920 defines a plurality of workpiece support apertures in an inner surface thereof, and the constrained portions 904 are affixed to the workpiece plane plate 920 with the unconstrained portions 906 extending inwardly toward the workpiece through the workpiece support apertures. More particularly, in this embodiment each of the workpiece support apertures includes a vertical slot 918 defined in the inner surface of the workpiece plane plate 920. Thus, in this embodiment the unconstrained portion 906 of the flexible support member 903 protrudes inwardly toward the center of the workpiece 24, through the vertical slot 918, which slot allows the unconstrained portion 906 of the flexible support member 903 to move upward and downward relative to the workpiece plane plate 920. In this embodiment, an inner tip 924 of each unconstrained portion 906 inwardly past an outer edge 922 of the workpiece 24, so that the inner tip 924 is at a smaller radial distance from the center of the workpiece than the outer edge 922 of the workpiece. More particularly, in this embodiment the inner tip 924 extends approximately 10 mm further inward than the outer edge 922 of the workpiece, although alternatively, other length relationships may be substituted. Thus, in this embodiment the engagement portion of the support member 903 includes an intermediate point 926 along the unconstrained portion 906 between the constrained portion 904 and the inner tip 924. The unconstrained portion 906, or more particularly the intermediate point 926 therealong, is engageable with the outer edge 922 of the workpiece, to contact and support the workpiece.

In this embodiment, the workpiece plane plate 920 is configured to constrain the constrained portions 904 in a generally horizontal direction to cause the unconstrained portions 906 to extend generally horizontally inwardly toward the central region of the workpiece 24 while downwardly sagging. In this regard, due to the downward force of gravity exerted by the outer edge 922 of the workpiece upon the intermediate point 926, the flexible support member 903 bends downward, so that the inner tip 924 of the flexible support member is vertically displaced by a "sag displacement" distance below the plane of the workpiece 24.

Still referring to FIGS. 28 and 29, in this embodiment, the plurality of flexible support members 902 includes at least twenty elongated flexible support members. More particularly, the plurality of support members 902 includes at least fifty such support members. More particularly still, in this embodiment the plurality of support members 902 includes approximately 60 flexible support members similar to the exemplary support member 903, disposed at roughly equidistant intervals around an inner workpiece support aperture defined in the workpiece plane plate 920. In this embodiment, in which the workpiece is a semiconductor wafer and the flexible support members 902 are optical fibers as described above, the "sag displacement" typically ranges from about 3 mm to about 5 mm. Thus, in the present embodiment the unconstrained portions 906 are engageable with the outer edge 922 of the workpiece 24 at an angle of less than about 10 degrees downward relative to the plane of the workpiece. Alternatively, other sag displacement distances and angles may be tolerable or desirable, depending upon the particular application at hand.

Typically, in the illustrative embodiments shown in FIGS. 28 and 29, each of the flexible support members 902 has a diameter of between approximately 0.4 mm and 2 mm. Alternatively, however, as discussed in connection with other embodiments, other suitable dimensions may be substituted, selecting length and diameter to provide the desired resiliency and fast response time for a given application.

Referring to FIGS. 20 and 28, if desired, the inner tip 924 of the flexible support member 903 shown in FIG. 28 may be provided with a curved end region similar to the curved end region 620 shown in FIG. 20, to minimize the effects of possible scraping against the substrate side 28 of the workpiece 24 during thermally-induced bowing or vibration.

Figure 31:
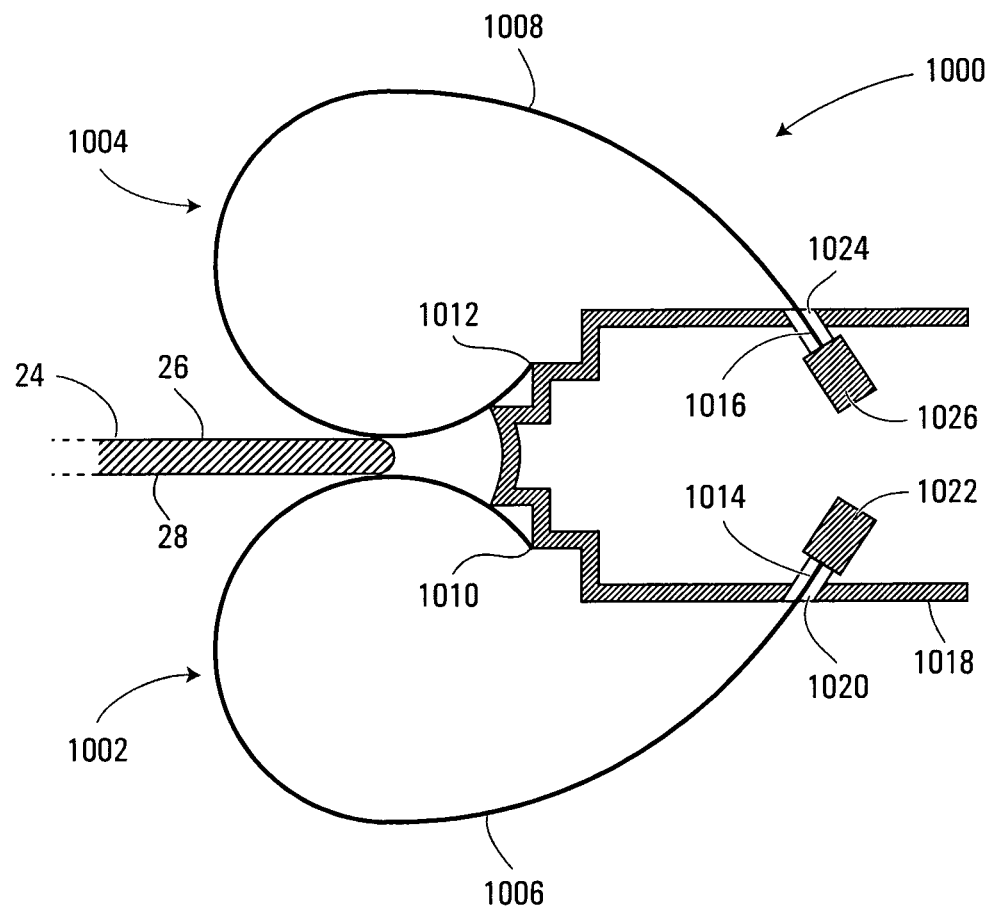
FIG. 31 is a partial cross-section of a support system of an apparatus for supporting a workpiece according to a fifteenth embodiment of the invention.

Referring to FIG. 31, a support system for supporting a workpiece according to a fifteenth embodiment of the invention is shown generally at 1000. In this embodiment, the support system 1000 is configured to suppress vibration of the workpiece, or more particularly, to suppress at least one natural vibration mode of the workpiece, which in this embodiment includes the first and second natural vibration modes of the workpiece. To achieve this, the support system 1000 includes first and second supporting devices shown generally at 1002 and 1004. The supporting devices 1002 and 1004 include respective flexible support members 1006 and 1008, which in this embodiment include quartz fibers. More particularly, in this embodiment the quartz fibers are optical quartz fibers from which the aluminum cladding layer has been chemically removed, and have a diameter of approximately 100 microns.

Alternatively, as discussed in connection with previous embodiments, other types of fibers, or more generally, other suitable types of flexible support members, may be substituted.

In this embodiment, each of the flexible support members 1006 and 1008 has first and second spaced apart constrained portions, with an unconstrained portion extending in a curved path therebetween. More particularly, the first and second constrained portions of the flexible support member 1006 respectively include a fixed end 1010 and an adjustable end 1014, and similarly, the first and second constrained portions of the flexible support member 1008 respectively include a fixed end 1012 and an adjustable end 1016. The fixed end 1010 of the flexible support member 1006 is attached to a workpiece plane plate 1018 in the vicinity of the workpiece 24, just below the plane of the workpiece 24, and similarly, the fixed end 1012 of the flexible support member 1008 is attached to the workpiece plane plate just above the plane of the workpiece. Thus, the workpiece plane plate 1018 acts as a first constrainer for constraining the fixed ends 1010 and 1012 of the flexible support members 1006 and 1008.

In this embodiment, the unconstrained portion of each support member extends along the curved path between the constrained portions, such that a tangent to the unconstrained portion at a region of contact with the workpiece extends radially inward toward a center of the workpiece. For example, in this embodiment the flexible support member 1006 extends from its fixed end 1010 (in a counter-clockwise direction as shown in FIG. 31) along a generally loop-shaped path, and contacts and supports the substrate side 28 of the workpiece 24 in the vicinity of the outer exclusion zone of the workpiece. The flexible support member 1006 continues along the loop-shaped path from the point of contact with the workpiece, looping around (counter-clockwise) and re-entering the workpiece plane plate 1018 through an aperture 1020 defined in the lower surface of the workpiece plane plate. The adjustable end 1014 of the flexible support member 1006 enters and is secured in a length controller 1022, which acts as a second constrainer for constraining the adjustable end 1014 of the flexible support member 1006.

In this regard, in the present embodiment at least one of the first and second constrained portions of each of the flexible support members 1006 and 1008 is retractably constrained. Thus, in the present embodiment, the system 1000 includes the length controller 1022, which in this embodiment includes a mechanical retractor, and which retractably constrains the second constrained portion (i.e. the adjustable end 1014) of the flexible support member 1006. The retractor is configured to retract the second constrained portion to effectively shorten the unconstrained portion, and conversely, is configured to extend the second constrained portion to effectively lengthen the unconstrained portion. In the present embodiment, the length controller 1022 is remotely controllable from outside a process chamber in which the workpiece plane plate 1018 is located, to lengthen or shorten the effective length of the flexible support member 1006, thereby changing the shape and dimensions of the loop-shaped path in which it extends to resiliently support the workpiece.

Similarly, in this embodiment the flexible support member 1008 extends from its fixed end 1012 along a generally loop-shaped path (in a clockwise direction as shown in FIG. 31), contacts the device side 26 of the workpiece 24 in the vicinity of the outer exclusion zone of the workpiece, and continues (clockwise) along the loop-shaped path to reenter the workpiece plane plate 1018 through an aperture 1024 defined in an upper surface of the workpiece plane plate. The adjustable end 1016 of the flexible support member 1008 enters and is secured in a length controller 1026, similar to the length controller 1022. In this embodiment, the length controller 1026 is remotely controllable from outside the process chamber in which the workpiece plane plate 1018 is located, to retract a sufficient length of the flexible support member 1008 to move the flexible support member 1008 completely out of a cylinder-shaped volume defined above the plane of the workpiece 24, thereby allowing the workpiece 24 to be lowered into position to be supported by the first flexible supporting device 1002, or to be raised back out of position when thermal processing is complete. For thermal processing, the length controller 1026 may be remotely controlled to extend a sufficient length of the flexible support member 1008 so that the loop-shaped path of the flexible support member 1008 contacts the device side 26 of the workpiece at the outer exclusion zone.

In general, the effective diameters of the generally loop-shaped paths of the flexible support members 1006 and 1008 depend upon the material chosen for the support members, and upon the range of expected workpiece motion. For example, the effective diameters of the generally loop-shaped paths may be between about 30 mm and 100 mm for some embodiments, although alternatively, other effective diameters may be substituted.

In this embodiment, to support the workpiece 24 for such thermal processing, the support system 1000 includes a plurality of lower support devices identical to the support device 1002, and a plurality of upper support devices identical to the supporting device 1004, disposed at various intervals around the perimeter of the workpiece plane plate 1018. Thus, the system 1000 includes first and second pluralities of elongated flexible support members. The unconstrained portions of the first plurality of flexible support members are engageable with the lower surface of the workpiece 24 and the unconstrained portions of the second plurality of flexible support members are engageable with an upper surface of the workpiece 24.

The upper support devices serve to enhance stability and suppress vibration of the workpiece 24 during the thermal cycles described herein. For example, in this embodiment, the first and second supporting devices 1002 and 1004 co-operate to at least partly suppress the first and second natural vibration modes of the workpiece 24.

Alternatively, for some applications, the supporting device 1004 and other similar upper supporting devices may be omitted if desired, leaving the workpiece to be supported by the supporting device 1002 and other lower supporting devices.

Figure 32:
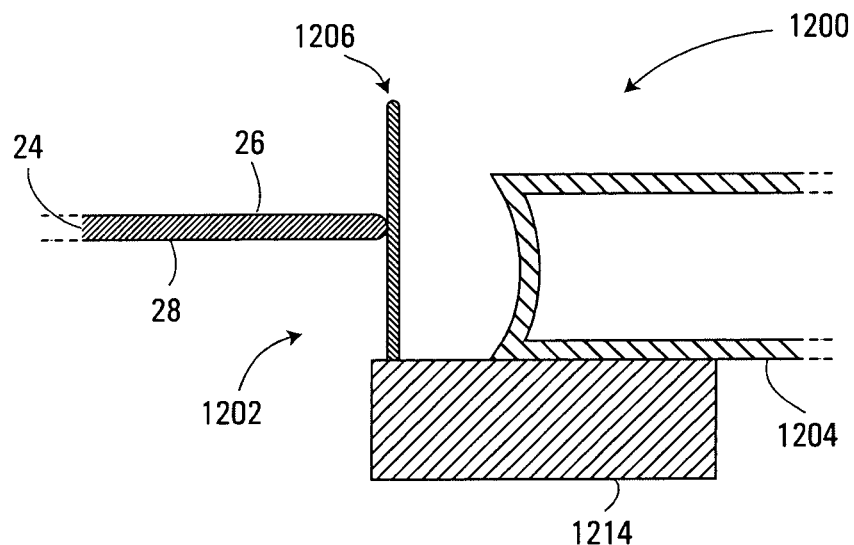
FIG. 32 is a partial cross-section of a support system of an apparatus for supporting a workpiece according to a sixteenth embodiment of the invention.
Figure 33:
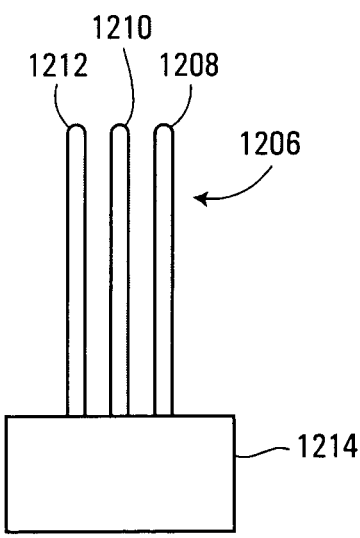
FIG. 33 is a front elevation view of a lateral supporting device of the support system shown in FIG. 32, in a direction radially outward from a center of a workpiece plane plate aperture.

Referring to FIGS. 32 and 33, a support system for supporting a workpiece according to a sixteenth embodiment of the invention is shown generally at 1200. In this embodiment, the support system 1200 includes a lateral support member configured to laterally support the workpiece 24. More particularly, in this embodiment the system 1200 includes a lateral supporting device 1202 for providing resilient lateral support to the workpiece 24. In this regard, it will be appreciated that in some cases, the thermal cycles described herein may tend to produce asymmetrical thermal bowing or vibrational motion of the workpiece, for example, due to non-uniform heating of the device side 26 of the workpiece in response to the flash, or due to non-uniform responses of various (vertical) supporting devices such as those described earlier herein, for example. Such asymmetrical motion may include lateral motion of the workpiece 24 relative to a workpiece plane plate such as that shown at 1204, for example. In the present embodiment, in which the workpiece 24 is a semiconductor wafer, if such lateral motion results in a collision between the workpiece 24 and the workpiece plane plate 1204 (which in this embodiment is aluminum), the effects of such a collision may include particle contamination, or other physical damage to the workpiece 24.

Accordingly, to prevent such collisions, in this embodiment the lateral supporting device 1202 includes a lateral support member 1206 configured to laterally support the workpiece 24. More particularly, in this embodiment the support member 1206 includes a plurality of lateral support members, such as those shown at 1208, 1210 and 1212 in FIG. 33, for example, at respective positions relative to an outer edge of the workpiece 24. In this embodiment, each of the lateral support members is resiliently engageable with the outer edge of the workpiece. More particularly, in this embodiment each of the lateral support members includes a flexible fiber, which in the present embodiment includes an optical fiber. More particularly still, in the present embodiment, each of the support members includes a quartz fiber. Alternatively, as discussed in connection with previous embodiments, sapphire fibers, other fibers, other types of flexible support members, or more generally, other types of lateral support members, may be substituted.

Referring back to FIG. 32, in this embodiment the lateral support member 1206 is connected to a positioner 1214, which in this embodiment includes an aluminum block. The positioner 1214 is connected to the workpiece plane plate 1204, and extends sufficiently far into the workpiece support aperture defined in the workpiece plane plate to position the lateral support member 1206 close to the outer edge of the workpiece 24. In the present embodiment, the lateral support member 1206 and similar support members, which in this embodiment include flexible fibers, are positioned at an angle substantially normal to a plane of the workpiece 24.

In this embodiment, in which the lateral support members include optical quartz fibers, the aluminum coating or cladding layer that is typically sold with optical quartz fibers has been chemically removed, so that at least the portions of the lateral support members 1208, 1210 and 1212 that are likely to come into contact with the workpiece 24 are exposed quartz, and hence, non-contaminating. In the present embodiment, during thermal processing, the workpiece contacts most of the lengths of the quartz fibers (other than the length segment secured within the positioner 1214), and therefore, in this embodiment the aluminum coating or cladding has been removed from the entire lengths of the fibers (if desired, the aluminum cladding may be retained along the length segment that is secured within the positioner 1214). Alternatively, other materials that are typically not sold with any such aluminum cladding, such as sapphire for example, may be substituted for the quartz fibers.

In exemplary embodiments similar to that shown in FIGS. 32 and 33, the lateral support member and the other similar lateral support members may have a length of approximately 20-40 mm (excluding the portion that is secured within the positioner 1214), and may have a diameter of 0.5-2 mm, for example. Alternatively, other suitable dimensions may be substituted for a given application.

In this embodiment, the support system 1200 includes a plurality of lateral supporting devices similar to the lateral supporting device 1202, positioned at various intervals around the perimeter of the workpiece support aperture defined in the workpiece plane plate 1204. For example, the system 1200 may include between four and 20 such lateral supporting devices, although alternatively, other numbers may be substituted. Such lateral supporting devices may be used in conjunction with vertical supporting devices, such as any of the other supporting devices described herein, for example.

Alternatively, in another exemplary embodiment, a lateral support system somewhat similar to that shown in FIGS. 32 and 33 may be provided, in which one or more rigid support members are substituted for the lateral support member 1206. For example, one or more rigid quartz pins may be substituted for the flexible support member. Such embodiments may suffice to contain lateral motion of the workpiece, however, such embodiments may also result in damage to or breakage of the workpiece 24, depending upon the lateral momentum of the workpiece relative to the rigid support member(s) when the former collides with the latter.

If desired, rather than providing separate lateral and vertical supporting devices, such lateral and vertical support may be provided by a single supporting device, if desired. For example, referring to FIGS. 21, 22 and 34, a support system for supporting a workpiece according to a seventeenth embodiment of the invention is shown generally at 1300 in FIG. 34. In this embodiment, the support system 1300 includes a support member which acts as both a vertical and lateral support member, and which includes a moveable vertical support engagement portion engageable with a lower surface of the workpiece 24, as well as a lateral support engagement portion engageable with an outer edge of the workpiece. More particularly, in this embodiment the support member includes a supporting device 1302, which is a modified version of the supporting device 702 shown in FIG. 22. In this embodiment, the moveable vertical support engagement portion of the supporting device 1302 includes the flexible support member 712, including the cladding layer 714 and the casing 718 in which the flexible support member is secured to the workpiece plane plate 710. The lateral support engagement portion of the supporting device 1302 includes a second flexible support member 1304. In this embodiment, the second flexible support member 1304 is similar to the first flexible support member 712, and therefore also includes an optical quartz fiber, although alternatively, as discussed earlier herein, other types of fibers, or more generally other types of flexible support members, may be substituted if desired. By virtue of their flexibility in the present embodiment, the vertical and lateral support engagement portions are resiliently engageable with the workpiece.

In this embodiment, the second flexible support member 1304 has a smaller diameter than the first flexible support member 712. More particularly, in this embodiment the second flexible support member 1304 has a diameter of approximately 0.5 mm, whereas the first flexible support member 712 has a diameter of approximately 4 mm. Alternatively, however, other suitable dimensions may be substituted as desired.

In this embodiment, the second flexible support member 1304 includes an outer cladding layer 1306, which in this embodiment is the aluminum coating that is commercially sold with the optical quartz fiber. In this embodiment, the aluminum coating has been chemically removed from at least a portion of the second flexible support member 1304 that may possibly come into contact with the workpiece 24, to avoid contamination of the workpiece. In this embodiment and similar exemplary embodiments, the second flexible support member 1304 extends for a length of 10-20 mm within the outer cladding layer 1306, and extends unclad for a further length of 20-40 mm beyond the cladding layer, although alternatively, other suitable lengths may be substituted if desired.

In the present embodiment, the second flexible support member 1304 is secured to the first flexible support member 712 by a collar 1308. The collar 1308 may include stainless steel or titanium, for example, although alternatively, other suitable materials may be substituted.

Alternatively, however, the second flexible support member 1304 may be connected to the remainder of the supporting device 1302 in any other suitable manner.

If desired, the supporting device 1302 may include a retractor 1310, connected to a portion of the second flexible support member 1304, for retracting the second flexible support member 1304 toward the workpiece plane plate 710, to allow insertion or removal of the workpiece 24. Alternatively, the second flexible support member 1304 may be pre-heated and pre-bent back toward the workpiece plane plate 710, to avoid the need for such a retractor. Or, as a further alternative, such pre-heating and pre-bending may be combined with a retractor in a given embodiment, if desired.

Figure 34:
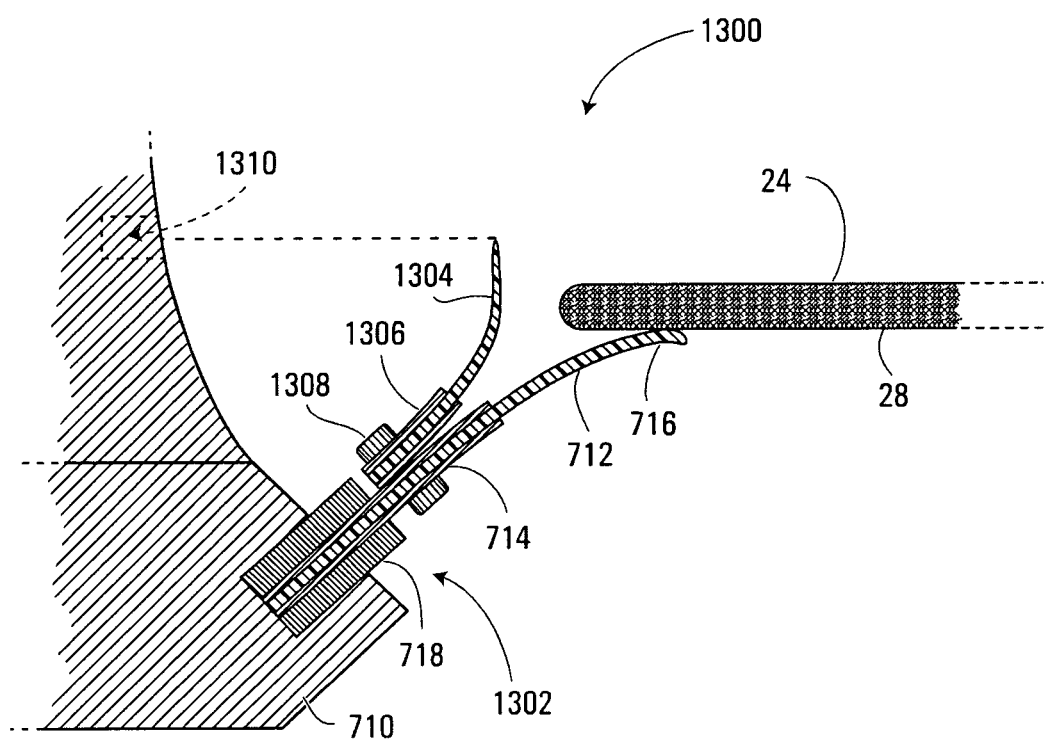
FIG. 34 is a partial cross-section of a supporting device of an apparatus for supporting a workpiece according to a seventeenth embodiment of the invention.

In the present embodiment, as with the embodiment shown in FIG. 21, the support system 1300 includes a plurality of supporting devices similar to the supporting device 1302 shown in FIG. 34, disposed at various intervals around the inner workpiece support aperture defined in the workpiece plane plate 710. Thus, the system 1300 includes a plurality of support members including a plurality of vertical and lateral support engagement portions engageable with the workpiece.

Figure 35:
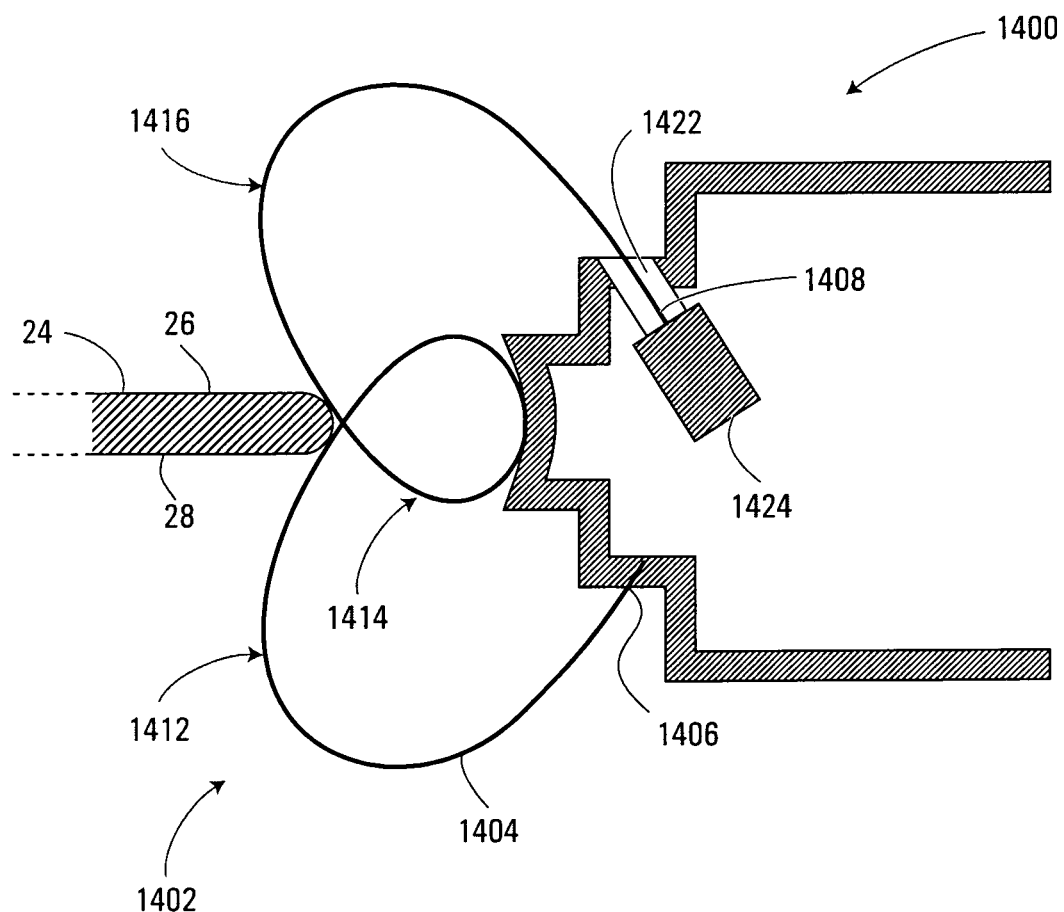
FIG. 35 is a partial cross-section of a support system of an apparatus for supporting a workpiece according to an eighteenth embodiment of the invention.

Referring to FIG. 35, as a further example of a combined lateral and vertical supporting device, a support system for supporting a workpiece according to an eighteenth embodiment of the invention is shown generally at 1400. In this embodiment, the support system 1400 includes a supporting device 1402. In the present embodiment, the supporting device 1402 includes a flexible support member 1404, which in this embodiment includes an optical quartz fiber. Alternatively, as discussed in connection with previous embodiments, other types of fibers, or more generally, other types of flexible support members, may be substituted.

In this embodiment, the flexible support member 1404 includes first and second spaced apart constrained portions, with an unconstrained portion extending in a curved path therebetween. More particularly, in this embodiment the first and second constrained portions include a fixed end 1406, and an adjustable end 1408. A workpiece plane plate 1410 acts as a first constrainer for constraining the first constrained portion, i.e. the fixed end 1406, which in this embodiment is attached to the workpiece plane plate 1410 in the vicinity of the workpiece 24, just below the plane of the workpiece 24.

In this embodiment, the unconstrained portion of the support member 1404 extends along the curved path between the constrained portions, to form a first generally loop-shaped path segment 1412 extending from the first constrained portion below a plane of the workpiece 24 and contacting the workpiece at a lower surface thereof, a second generally loop-shaped path segment 1414 extending between an outer edge of the workpiece 24 and an inner edge of the workpiece plane plate 1410, and a third generally loop-shaped path segment 1416 extending above the plane of the workpiece and contacting the workpiece at an upper surface thereof, the curved path terminating at the second constrained portion. More particularly, in this embodiment the flexible support member 1404 extends from its fixed end 1406 along the first generally loop-shaped path segment 1412 (in a clockwise direction as shown in FIG. 35) below the plane of the workpiece, contacting and supporting the substrate side 28 of the workpiece 24 in the vicinity of the outer exclusion zone of the workpiece. The flexible support member 1404 then continues to extend (clockwise) through the second generally loop-shaped path segment 1414 defined between the outer edge of the workpiece 24 and an innermost portion of the workpiece plane plate 1410. The flexible support member 1404 then continues to extend (clockwise) through the third generally loop-shaped path segment 1416 extending above the plane of the workpiece, re-entering the workpiece plane plate through an aperture 1422 defined in the upper surface of the workpiece plane plate. The adjustable end 1408 of the flexible support member 1404 enters and is secured in a second constrainer, which in this embodiment includes a length controller 1424, similar to the length controllers 1022 and 1026 shown in FIG. 31. Thus, the flexible support member 1404, due to its configuration, and in particular to the generally loop-shaped path segments 1412, 1414 and 1416, provides both vertical and lateral resilient support to the workpiece 24. In addition, this configuration of the flexible support member 1404 also partly suppresses the first and second natural vibration modes of the workpiece 24.

In the present embodiment, the second constrainer, or more particularly the length controller 1424, acts as a retractor configured to retract the second constrained portion, to move the third generally loop-shaped path segment 1416 out of a volume defined above the upper surface of the workpiece. In this regard, the length controller 1424 is remotely controllable from outside a process chamber in which the workpiece plane plate 1410 is located, to lengthen or shorten the effective length of the flexible support member 1404, thereby changing the shape and dimensions of the loop-shaped path in which it extends to resiliently support the workpiece. In particular, for some applications it is desirable to be able to sufficiently retract the flexible support member 1404 so that the third loop-shaped path segment is completely retracted out of the volume above the plane of the workpiece 24, to allow the workpiece to be inserted for thermal processing or removed when thermal processing is complete.

In this embodiment, the support system 1400 includes a plurality of supporting devices identical to the supporting device 1402, disposed at various intervals around the perimeter of the workpiece support aperture defined in the workpiece plane plate 1410. For example, in exemplary embodiments similar to that shown in FIG. 35, the support system may include between four and 20 such supporting devices, and the flexible support members of such devices may range from 0.5-2 mm in diameter, and from 50 mm to 300 mm in length. Alternatively, other numbers of supporting devices and dimensions of flexible support members may be substituted, if desired.

If desired, the second generally loop-shaped path segment 1414 defined by the flexible support member 1404 may be attached to the workpiece plane plate 1410, for additional stability. Alternatively, such attachment may be omitted if desired.

Figure 36:
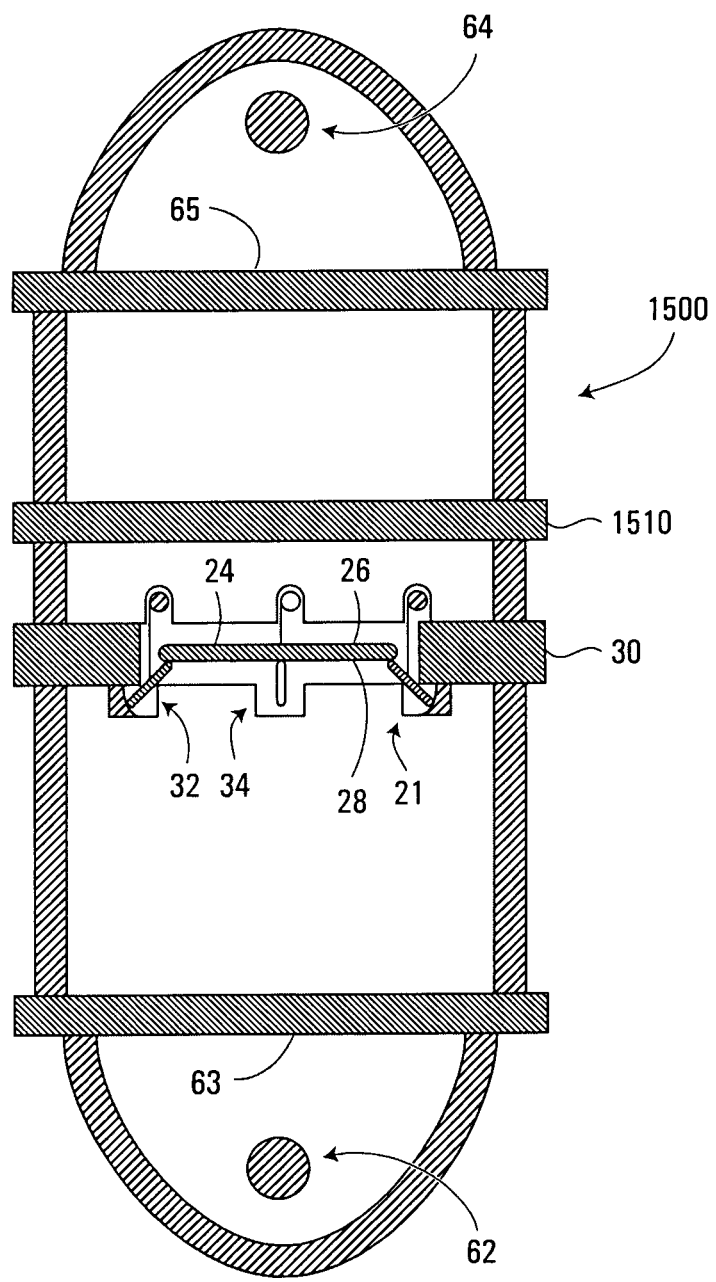
FIG. 36 is a cross-section of the workpiece shown in FIGS. 1-3 supported in a heat-treating chamber by a plurality of the supporting devices shown in FIGS. 1-3, the chamber being modified in accordance with a nineteenth embodiment of the invention.

Referring to FIGS. 4 and 36, a heat-treating chamber according to a nineteenth embodiment of the invention is shown generally at 1500 in FIG. 36. The chamber 1500 is similar to the chamber 60 shown in FIG. 4, but has been modified to include an additional quartz window 1510, mounted above and in close proximity to the device side 26 of the workpiece 24. More particularly, in this embodiment the window 1510 is mounted approximately 1 cm above a plane of the workpiece 24, although alternatively may be mounted at other distances from the workpiece, with a distance of 1 to 10 cm being preferred for the present embodiment. The window 1510 is preferably cooled, and in this embodiment is gas-cooled, although alternatively may be cooled by water or other suitable liquids, depending on the wavelengths that the window is required to transmit for heating or measurement purposes. When the workpiece 24 experiences thermal bowing induced by a heating flash as described above, the pressure of process gases between the workpiece 24 and the window 1510 provides resistance to vertical motion of the workpiece. Thus, in combination with moveable engagement portions of support members as described earlier herein, the additional gas pressure between the workpiece 24 and the window 1510 serves to oppose vertical motion of the workpiece 24, thereby tending to minimize motion of a center of mass of the workpiece. As a collateral advantage, during the pre-heating stage to heat the workpiece to an intermediate temperature prior to the flash, the window 1510 also tends to reduce convective heat loss from the device side of the workpiece, resulting in improved temperature uniformity.

Alternatively, a similar effect may be obtained without the window 1510, by moving the existing window 65 closer to the device side 26 of the workpiece 24.

If desired, the plurality of moveable engagement portions of the plurality of support members may include a plurality of smooth-surfaced tips of a plurality of respective support pins.

Figure 37:
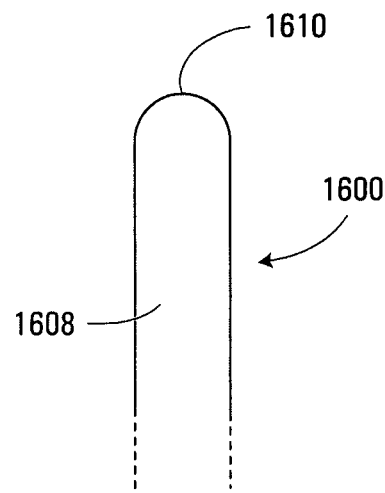
FIG. 37 is a side elevation view of a support member of an apparatus for supporting a workpiece, according to a twentieth embodiment of the invention.

For example, referring to FIG. 37, a supporting device according to a twentieth embodiment of the invention is shown generally at 1600. In this embodiment, the supporting device 1600 includes a support member 1608 having a smooth-surfaced tip 1610. More particularly, in the present embodiment the smooth-surfaced tip 1610 is ball-shaped or hemispherical, although alternatively, other smooth surfaces may be substituted. Such smooth-surfaced tips tend to reduce friction and scratching of the workpiece 24. In this regard, scratching between the support members and the lower surface of the workpiece may cause undesirable particle contamination, and may also undesirably roughen the lower surface of the workpiece. Minimization of frictional forces is desirable not only to lower stress from point loading to reduce or prevent local stress and scratching in the vicinity of the points of contact between the support members and the workpiece, but also to lower the total stress to which the workpiece is subjected during thermal processing as described herein.

In this embodiment, the support member 1608 is made of quartz, or more particularly, of an optical quartz fiber similar to those described above in connection with other embodiments of the invention. More particularly still, in the present embodiment the smooth-surfaced tip 1610 of the support member 1608 is formed by using a laser to melt the tip of the support member, thereby forming a ball-shaped tip as the tip cools.

It has been found that such a method results in a smoother surface than typical cutting and polishing approaches.

Referring to FIGS. 16 and 37, in embodiments in which the fiber is clad, such as the aluminum cladding of the unconstrained portion 606 of each flexible support member 602 shown in FIG. 16, for example, the aluminum cladding is preferably removed from the tip prior to laser-melting to form the smooth-surfaced tip 1610. For example, the cladding may be chemically removed from a 2 mm length of the fiber in the vicinity of the tip prior to formation of the smooth-surfaced tip.

Alternatively, the support member 1608 may be made of other materials, such as sapphire or any of the materials described earlier herein, for example.

Or, as a further alternative, the support member 1608 may include metal. For example, the support member 1608 may include a support pin including tungsten, and at least the tip of the support pin may have an outer coating to reduce friction and scratching. The outer coating may include tungsten nitride or tungsten carbide, for example, although other types of coatings may be substituted. Or, as a further alternative, such coatings may be omitted. To achieve the desired smooth-surfaced tip 1610 in the absence of a coating, the tip of the support member 1608 may be laser-melted to form a ball shape, in a manner similar to that described above in connection with quartz support members. Alternatively, other ways of achieving the desired smooth-surfaced tip 1610 may be substituted.

Such smooth-surfaced support members 1608 may be employed in or substituted for support pins or other support members in other embodiments of the invention.

Figure 38:
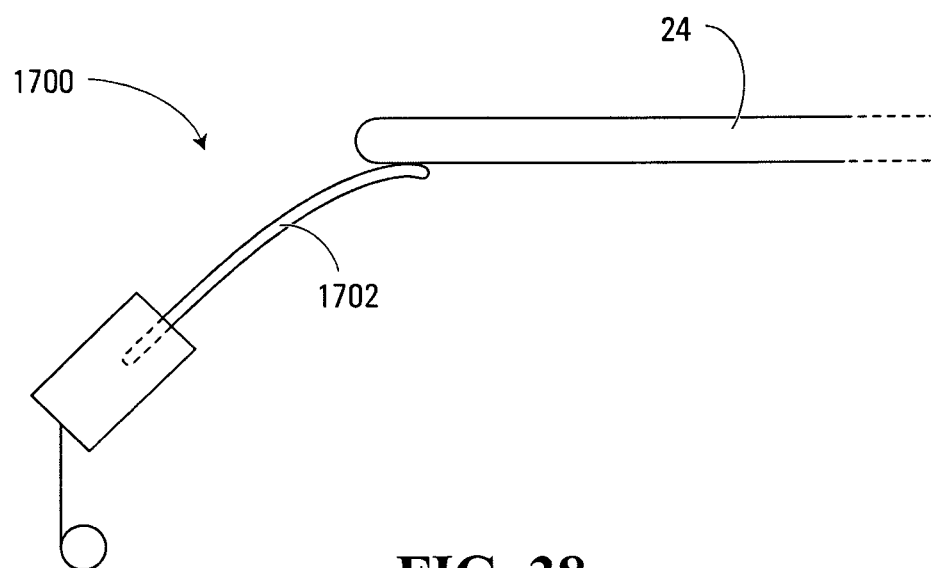
FIG. 38 is a partial side elevation view of a supporting device of an apparatus for supporting the workpiece, according to a twenty-first embodiment of the invention.

Referring to FIGS. 20 and 38, a supporting device according to a twenty-first embodiment of the invention is shown generally at 1700 in FIG. 38. The supporting device 1700 is similar to that shown in FIG. 20. However, in this embodiment, a modified support member 1702 does not engage the workpiece 24 at the outer exclusion zone thereof, but rather, engages the workpiece at a further inward region, i.e., at a smaller radial distance from the center of the workpiece than the exclusion zone. In this embodiment, the workpiece is supported by a plurality of similar support members whose moveable engagement portions engage the lower surface of the workpiece at a common radial distance from the center of the workpiece, at various angular intervals.

In this regard, the positions at which the moveable engagement portions of the support members engage the workpiece may vary, depending on the particular application in question, the available resiliency or softness of the support members in question, and the desired balance between minimizing vertical launch of the wafer and suppressing higher-order vibrational modes of the workpiece resulting from the flash. For example, in some embodiments, the support pins may be positioned at an equilibrium radial distance from the center of the wafer, so that the thermal bowing produces a downward momentum of the outer portion of the wafer outside the equilibrium radial distance that tends to balance the upward momentum of the central region of the wafer, so that the wafer does not launch itself upward from the support pins. As an illustrative example, in an embodiment where the workpiece includes a silicon semiconductor wafer having a radius of 150 mm, and having axis symmetric natural vibration modes at frequencies of approximately 113 Hz (mode 1), 476 Hz (mode 2), and 1007 Hz (mode 3), setting the radial distance r for engagement of the moveable engagement portions of the support members equal to approximately 104 mm minimizes the tendency of the workpiece to launch itself upward. However, this positioning also tends to excite the second natural vibration mode of the wafer, which may tend to damage or even shatter the workpiece, depending upon the magnitude and rapidity of the device-side temperature jump. Thus, although such a configuration may be acceptable for some applications in which the moveable engagement portions are sufficiently "soft" (i.e., provide a sufficiently low resistance force and have sufficiently lard ranges of motion) to reduce the excitation of the second natural vibration mode, such a configuration may be less desirable for embodiments in which the moveable engagement portions are less "soft". In comparison, positioning the moveable engagement portions at the outer exclusion zone typically tends to produce less excitation of higher order vibrational modes, but also results in greater initial downward motion of the outer exclusion zone of the workpiece and the moveable engagement portions of the support members, which tends to increase the force applied between the workpiece and the support members, and which may result in greater vertical motion of center of mass of the workpiece. For many applications, engaging the engagement portions of the support members with the workpiece at a radial distance somewhere between the equilibrium distance which minimizes vertical launch, and the outer exclusion zone, will be acceptable.

In the present embodiment, the modified support member 1702 is formed of a transparent material, to minimize shadowing effects on the workpiece. More particularly, in this embodiment the transparent material is quartz. Alternatively, other materials may be substituted. In this embodiment, the modified support member 1702 is also reduced in size, to further reduce any remaining shadowing effects, and also to reduce its mass.

Although thermal "bowing" and related oscillations or vibrations are the primary sources of thermally-induced motion described in connection with the above embodiments of the invention, alternatively, other embodiments of the invention may be applied to address other types of thermally-induced motion. For example, the thermally-induced motion may include thermal bending, and the support system may be configured to support the workpiece while allowing the thermal bending of the workpiece.

In this regard, one recently proposed thermal processing method involves securely holding a substrate to a stage, by mechanical clamps, electrostatic or vacuum chucks, or equivalent grasping devices. A continuous wave electromagnetic radiation source is used with focusing optics to produce a line of radiation on an upper surface of the substrate. A translation mechanism is then used to move the stage and the radiation source relative to one another, to cause the line of radiation to scan across the upper surface of the substrate. However, the use of mechanical clamps or other such grasping devices to securely hold the substrate to the stage prevents thermally-induced bending of the substrate. In the absence of such clamping, the substrate would tend to thermally bend along the line of radiation, in order to minimize its own internal stress. By preventing the substrate from bending, the use of such clamps or grasping devices causes increased thermal stress in the substrate, thereby increasing the likelihood of damage to or breakage of the substrate.

Thus, in accordance with another embodiment of the present invention, support members comprising moveable engagement portions that are moveable to allow thermally-induced motion of the workpiece, such as the support members described above in connection with other embodiments of the invention, for example, may be substituted for the mechanical clamps or other grasping devices previously proposed for this particular thermal processing method.

For example, referring back to FIGS. 13 and 14, supporting devices such as the supporting device 402 shown in FIG. 13 may be provided to allow thermally-induced bending of the workpiece, thereby reducing internal stress in the workpiece as it is effectively scanned by the line of radiation. If desired, in order to maintain the unheated portion of the workpiece flat until it has been heated by the line of radiation, the controller 420 may be re-programmed, to retain the support member 404 and the suppressing member 414 in fixed positions until after the line of radiation has passed over the location at which the support member 404 and suppressing member 414 engage the workpiece 24, and to thereafter allow thermally-induced bending of the workpiece 24. Thus, the relatively "cold" portion of the workpiece 24 which has not yet been heated is maintained flat for subsequent heating by the line of radiation, while at the same time, stress in the workpiece 24 is minimized by allowing thermally-induced motion of the portion of the workpiece that has already been heated. Alternatively, however, it will be appreciated that although maintaining the unheated portion of the workpiece flat until it has been heated by the line of radiation may be desirable (in order to maintain a constant angle and distance between the irradiance source and the portion of the workpiece being heated by the line of radiation), it may be omitted for some applications, in which case such re-programming of the controller 420 may be omitted. More generally, other moveable engagement portions of other types of support members may be substituted.

Alternatively, other types of moveable engagement portions of other types of support members may be substituted.

It will be appreciated that in the foregoing embodiments, the various support systems are configured to absorb kinetic energy from the workpiece. For example, in the flexible support member embodiments described above, when the outer regions of the workpiece initially move downward during thermal bowing, thereby pushing the engagement portions of the support members downward and thus bending the support members, at least some of the kinetic energy of the workpiece is at least temporarily absorbed by the support members and stored as potential energy therein.

Referring back to FIG. 4, a method of heat-treating a workpiece according to a further embodiment of the invention may also be employed, preferably (although not necessarily) in conjunction with other embodiments of the invention disclosed herein. The method includes irradiating a surface of the workpiece during a time period having a duration less than a thermal conduction time of the workpiece and sufficient to allow at least some thermal bowing of the workpiece, to heat the surface to a desired temperature greater than that of a bulk of the workpiece. More particularly, in this embodiment the method includes irradiating the surface of the workpiece for a first time period less than the thermal conduction time of the workpiece, to heat the surface to an intermediate temperature greater than that of the bulk of the workpiece. The method then includes irradiating the surface for a second time period less than the thermal conduction time of the workpiece, to heat the surface to the desired temperature. The second time period commences within an interval following the first time period sufficient to allow at least some thermal bowing of the workpiece.

More particularly still, in the present embodiment the heating device 64, which in the present embodiment includes a flash lamp, is used to irradiate the device side 26 surface of the workpiece 24, during both the first and second time periods. In this embodiment, the thermal conduction time of the workpiece 24 is on the order of 10-15 ms, the first time period is on the order of 1 ms, and the second time period is also on the order of 1 ms. The interval following the first time period (prior to commencement of the second time period) is on the order of several milliseconds.

Also in this embodiment, the irradiance system, or more particularly the heating device 64 which includes the flash lamp, is configured to impart more radiant energy to the surface of the workpiece during the second time period than during the first time period, and is also configured to commence the second time period within several milliseconds following the end of the first time period. Thus, for example, the heating device 64 may irradiate the device side 26 of the workpiece to deliver approximately 10 J/cm$^2$ of energy to the device side during a first time period of one millisecond, then deliver no energy to the device side during the following several millisecond interval, and then irradiate the device side to deliver approximately 20 J/cm$^2$ of energy to the device side during a second time period of one millisecond.

In this embodiment, immediately prior to irradiating the device side 26 with the heating device 64, the workpiece 24 is pre-heated by the pre-heating device 62, which irradiates the substrate side 28 to preheat the workpiece 24 to an intermediate temperature. This pre-heating occurs at a rate that is slower than the thermal conduction time of the workpiece, such as 100° C./s to 400° C./s, for example. The first time period, during which the device side 26 is first irradiated by the heating device 64, commences as soon as the intermediate temperature is reached.

As noted earlier herein, such methods may serve to reduce thermal stress and suppress vibration in the workpiece. In this embodiment, following the irradiation by the heating device 64 of the device side 26 during the first time period of approximately one millisecond in duration, the device side 26 arrives at a first peak temperature roughly simultaneously with the end of the flash (t=1 ms). At that time, the workpiece 24 has only just begun to thermally bow, and has therefore achieved only a relatively small percentage of its maximum thermal bowing amplitude. The maximum thermal bowing amplitude is not achieved until several milliseconds later, at which time the workpiece has overshot its equilibrium shape. A millisecond or so later, the workpiece 24 is still significantly bowed but is returning toward its flat position with significant return velocity. The heating device 64 subjects the device side 26 of the workpiece 24 to a second irradiance flash during the second time period of approximately 1 ms in duration. The interval between the first and second time periods (i.e., between the first and second heating flashes) is selected so that the resulting thermal bowing from the second irradiance flash occurs while the workpiece is already thermally bowed from the first flash and is returning toward its flat position. The stress in the workpiece produced by the thermal bowing resulting from the second flash is diminished, because the wafer is already thermally bowed due to the first flash. The thermal bowing resulting from the second flash also acts in a direction opposite to the existing return velocity of the workpiece as it attempts to return toward its flat position. Accordingly, the thermal bowing resulting from the second flash tends to suppress residual vibrations from the first flash. The combination of two such flash-heating stages in rapid succession allows higher peak device side temperatures to be achieved, while suppressing residual vibrations in the workpiece.

Alternatively, other irradiance powers and durations may be substituted.

For example, rather than irradiating the device side 26 with a sequence of two or more temporally spaced-apart irradiance flashes, the irradiance system may be configured to continuously irradiate the device side surface of the workpiece for an interval shorter than a thermal conduction time of the workpiece and sufficiently long to allow at least some thermal bowing of the workpiece. More particularly, the heating device 64 may be operated to expose the device side 26 to a continuous irradiance pulse having a duration shorter than the 10-15 ms thermal conduction time of the workpiece but long enough to allow at least some thermal bowing of the workpiece. Such a pulse may extend over multiple milliseconds, such as about six milliseconds, for example. If desired, the irradiance system may be configured to vary an intensity of irradiance during the interval. For example, this may include irradiating the surface with a greater intensity during a later portion of the interval than during an earlier portion of the interval, for example. Thus, the pulse may be shaped so as to deliver more energy to the surface of the workpiece during the latter half of the pulse duration than during the former half of the pulse duration.

Further Alternatives

Although a number of specific embodiments and alternatives have been described above, alternatively, other combinations of various aspects and features disclosed herein may be provided. For example, although the use of flexible support members such as optical quartz fibers has been described primarily in conjunction with passive mechanical support systems, alternatively, such flexible support members may also be provided in conjunction with active support systems, such as those shown in FIGS. 6-14, for example. In such a case, a plurality of support members may include a plurality of flexible support members, each having a constrained portion and an unconstrained portion, as described above in connection with FIG. 16, for example, and the moveable engagement portions may include the unconstrained portions. In such a case, a support member motion system as described above in connection with FIG. 6, for example, which may include a plurality of actuators connected to the plurality of constrained portions, may be configured to move the constrained portions of the support members. These and other combinations of the features disclosed in this specification may be apparent to one of ordinary skill in the art upon review of this specification, and are not considered to depart from the scope of the present invention.

In some embodiments, it will be appreciated that certain flexible support members may cause partial shadowing upon the workpiece 24. This may result in non-uniform heating of the workpiece in the vicinity of such shadows. To alleviate or reduce this difficulty, if desired, the use of optical fibers as flexible support members may be exploited, to convey additional irradiance from one or more irradiance sources (not shown) to the workpiece through the fibers themselves, to further irradiate the workpiece in the vicinity of such shadows, thereby reducing the non-uniformity of the irradiance field incident upon the workpiece.

More generally, while specific embodiments of the invention have been described and illustrated, such embodiments should be considered illustrative of the invention only and not as limiting the invention as construed in accordance with the accompanying claims.

What is claimed is:

1. An apparatus for supporting a semiconductor workpiece, the apparatus comprising:
   a heating system configured to cause thermally-induced motion of the semiconductor workpiece by heating a surface of the workpiece relative to a bulk of the workpiece; and
   a support system configured to allow the thermally-induced motion of the workpiece while supporting the workpiece;
   wherein the support system is configured to allow motion of outer regions of the workpiece while maintaining a center of mass of the workpiece in a desired range; and
   wherein the support system is configured to minimize motion of the center of mass of the workpiece.

2. The apparatus of claim 1 wherein said support system comprises a support member having a moveable engagement portion engageable with the workpiece, wherein said engagement portion is moveable to allow the thermally-induced motion of the workpiece while supporting the workpiece.

3. The apparatus of claim 2 wherein the workpiece comprises a semiconductor wafer, and wherein the moveable engagement portion is engageable with the semiconductor wafer to allow thermally-induced motion of the wafer while supporting the wafer.

4. The apparatus of claim 2 wherein the engagement portion is automatically moveable in response to the thermally-induced motion of the workpiece.

5. The apparatus of claim 2 wherein the engagement portion is moveable to minimize stress in the workpiece while supporting the workpiece during the thermally-induced motion.

6. The apparatus of claim 2 wherein the support member comprises a rigid moveable support member.

7. The apparatus of claim 2 wherein the engagement portion of the support member comprises a plurality of moveable engagement portions of a plurality of respective support members.

8. The apparatus of claim 7 wherein the plurality of moveable engagement portions of the plurality of respective support members comprises at least three moveable engagement portions of at least three respective support members.

9. The apparatus of claim 7 wherein the plurality of moveable engagement portions of the plurality of respective support members comprises at least four moveable engagement portions of at least four respective support members.

10. The apparatus of claim 7 wherein the plurality of moveable engagement portions of the plurality of support members comprises a plurality of tips of a plurality of respective support pins.

11. The apparatus of claim 10 wherein the tips of the support pins are engageable with an outer perimeter zone of the workpiece.

12. The apparatus of claim 11 wherein the support system is configured to automatically allow motion of the tips of the support pins in response to thermally-induced motion of the outer perimeter zone of the workpiece.

13. The apparatus of claim 10 wherein the plurality of support pins comprise material that is transparent to at least some irradiance wavelengths with which the workpiece is capable of being irradiance-heated.

14. The apparatus of claim 10 wherein the plurality of support pins comprise optically transparent material.

15. The apparatus of claim 10 wherein the plurality of support pins comprise quartz.

16. The apparatus of claim 10 wherein the plurality of support pins comprise sapphire.

17. The apparatus of claim 10 wherein the plurality of support pins comprise metal.

18. The apparatus of claim 10 wherein the plurality of support pins comprise tungsten.

19. The apparatus of claim 10 wherein each of the plurality of tips of the plurality of respective support pins has an outer coating.

20. The apparatus of claim 19 wherein the outer coating comprises tungsten nitride.

21. The apparatus of claim 19 wherein the outer coating comprises tungsten carbide.

22. The apparatus of claim 7 wherein each of the plurality of moveable engagement portions is resiliently engageable with the workpiece.

23. The apparatus of claim 22 further comprising a plurality of force applicators in communication with the plurality of support members to apply forces thereto to cause each of the engagement portions to tend to maintain contact with the workpiece during the thermally-induced motion of the workpiece.

24. The apparatus of claim 23 wherein each of the force applicators comprises a torque applicator.

25. The apparatus of claim 24 wherein the torque applicator is configured to apply an upward force at a location on the support member interposed between a pivot point of the support member and the engagement portion.

26. The apparatus of claim 24 wherein the torque applicator is configured to apply a downward force at a location on the support member such that a pivot point of the support member is interposed between the location and the engagement portion.

27. The apparatus of claim 23 wherein each of the force applicators comprises first and second torque applicators configured to apply first and second opposing torques to each of the support members, the second torque acting to oppose overshoot by the support member of an equilibrium position thereof.

28. The apparatus of claim 23 wherein each of the force applicators comprises a spring connected to the support member.

29. The apparatus of claim 28 wherein the spring comprises a constant force spring.

30. The apparatus of claim 7 wherein the plurality of moveable engagement portions of the plurality of support members comprises a plurality of smooth-surfaced tips of a plurality of respective support pins.

31. The apparatus of claim 7 further comprising a support member motion system configured to move the moveable engagement portions in response to the thermally-induced motion of the workpiece.

32. The apparatus of claim 31 wherein the support member motion system is configured to move the support members in response to the thermally-induced motion of the workpiece.

33. The apparatus of claim 32 wherein the motion system comprises, for each of the support members, a respective actuator connected to the support member.

34. The apparatus of claim 33 wherein the motion system is configured to apply an electric current to each of the actuators to move each of the support members.

35. The apparatus of claim 33 wherein each of the actuators comprises a voice-coil actuator connected to the support member.

36. The apparatus of claim 33 wherein each of the actuators comprises a piezoelectric actuator connected to the support member.

37. The apparatus of claim 33 wherein each of the actuators comprises a linear servo actuator connected to the support member.

38. The apparatus of claim 33 wherein the motion system further comprises, for each of the actuators, a motion translator configured to translate a linear motion of a moveable member of the actuator into an arcuate motion of the support member.

39. The apparatus of claim 32 wherein the motion system comprises at least one controller configured to adjust positions of the plurality of support members to minimize a difference between a weight of the workpiece and an upward force applied to the workpiece by the plurality of engagement portions of the plurality of support members.

40. The apparatus of claim 32 wherein the motion system comprises at least one controller configured to adjust positions of the support members to maintain a difference between a weight of the workpiece and an upward force applied to the workpiece by the engagement portions of the support members within a desired range.

41. The apparatus of claim 31 wherein the motion system is configured to move the support members in response to a predicted value of the thermally-induced motion.

42. The apparatus of claim 31 wherein the motion system is configured to move the support members in response to a detected parameter of the thermally-induced motion.

43. The apparatus of claim 31 further comprising at least one detector configured to detect the thermally-induced motion of the workpiece.

44. The apparatus of claim 43 wherein the motion system comprises a plurality of actuators each of which is connected to a respective one of the plurality of support members, and wherein the at least one detector is configured to detect, in each of the plurality of actuators, an electric current resulting from a force applied to the engagement portion of the respective support member by the motion of the workpiece.

45. The apparatus of claim 44 further comprising at least one controller configured to apply an electric current to each of the actuators to move the engagement portions.

46. The apparatus of claim 45 wherein the plurality of actuators comprises a plurality of voice-coil actuators.

47. The apparatus of claim 45 wherein the at least one controller comprises at least one processor circuit in communication with the actuators.

48. The apparatus of claim 47 wherein the at least one controller comprises a plurality of processor circuits, each in communication with a respective one of the plurality of actuators.

49. The apparatus of claim 45 wherein the at least one controller comprises the at least one detector.

50. The apparatus of claim 44 wherein, for each actuator, the at least one detector is configured to detect a deviation of the electric current from a desired electric current level, and the at least one controller is configured to control the actuator to adjust a position of the support member so as to minimize the deviation.

51. The apparatus of claim 44 wherein the at least one detector comprises at least one processor circuit in communication with the actuators.

52. The apparatus of claim 51 wherein the at least one detector comprises a plurality of processor circuits, each in communication with a respective one of the plurality of actuators.

53. The apparatus of claim 31 wherein the motion system is configured to move the engagement portions to minimize forces applied between the workpiece and the engagement portions.

54. The apparatus of claim 53 wherein the plurality of engagement portions of the plurality of support members comprises a first plurality of moveable engagement portions of a first plurality of respective support members engageable with a lower surface of the workpiece, and wherein the motion system is configured to move the first plurality of engagement portions to minimize a difference between a weight of the workpiece and a force applied between the first plurality of engagement portions and the workpiece.

55. The apparatus of claim 54 wherein the plurality of engagement portions of the plurality of support members further comprises a second plurality of moveable engagement portions of a second plurality of respective support members engageable with an upper surface of the workpiece and wherein the motion system is configured to move the second plurality of engagement portions to minimize a force applied between the workpiece and the second plurality of engagement portions.

56. The apparatus of claim 31 wherein each of the plurality of moveable engagement portions is resiliently engageable with the workpiece, and wherein the motion system is configured to move the plurality of support members in response to the thermally-induced motion.

57. The apparatus of claim 56 further comprising a plurality of torque applicators configured to apply torques to the support members about respective pivot points thereof to cause the engagement portions to tend to maintain contact with the workpiece, and wherein the motion system is configured to move the pivot points of the support members.

58. The apparatus of claim 57 wherein the plurality of torque applicators comprises a plurality of springs connected to the support members at locations other than the pivot points thereof, and wherein the motion system is configured to apply electric currents to a plurality of actuators connected to the plurality of support members to move the support members.

59. The apparatus of claim 56 wherein the plurality of support members comprises a plurality of flexible support members, each having a constrained portion and an unconstrained portion; wherein the unconstrained portions are resiliently engageable with the workpiece; and wherein the motion system is configured to move the constrained portions of the support members.

60. The apparatus of claim 59 wherein a plurality of actuators are connected to the plurality of constrained portions.

61. The apparatus of claim 56 further comprising a detector configured to detect the thermally-induced motion of the workpiece.

62. The apparatus of claim 7 wherein the plurality of moveable engagement portions of the plurality of support members comprises a first plurality of moveable engagement portions of a first plurality of respective support members engageable with a lower surface of the workpiece and a second plurality of moveable engagement portions of a second plurality of support members engageable with an upper surface of the workpiece.

63. The apparatus of claim 62 wherein the first and second pluralities of engagement portions are respectively engageable with the lower and upper surfaces of the workpiece at an outer perimeter zone of the workpiece.

64. The apparatus of claim 7 wherein the plurality of support members comprises a plurality of flexible support members each having an unconstrained portion and a constrained portion, and wherein the moveable engagement portions comprise the unconstrained portions of the flexible support members.

65. The apparatus of claim 64 wherein the plurality of flexible support members comprises a plurality of fibers.

66. The apparatus of claim 65 wherein the plurality of fibers comprises a plurality of optical fibers.

67. The apparatus of claim 65 wherein the plurality of fibers comprises a plurality of quartz fibers.

68. The apparatus of claim 65 wherein the plurality of fibers comprises a plurality of sapphire fibers.

69. The apparatus of claim 64 further comprising at least one constrainer configured to constrain the constrained portions of the flexible support members.

70. The apparatus of claim 69 wherein the at least one constrainer comprises a plurality of constrainers disposed around an outer perimeter of the workpiece.

71. The apparatus of claim 70 wherein the plurality of constrainers consists of fewer constrainers than the number of the flexible support members, and wherein each of the constrainers is configured to constrain more than one of the flexible support members.

72. The apparatus of claim 71 wherein each of the constrainers is configured to constrain the more than one of the flexible support members generally parallel to each other.

73. The apparatus of claim 71 wherein each of the constrainers is configured to constrain the more than one of the flexible support members generally divergent from each other.

74. The apparatus of claim 70 wherein the plurality of constrainers consists of the same number of constrainers as the number of the flexible support members, and wherein each of the constrainers is configured to constrain a respective corresponding one of the constrained portions.

75. The apparatus of claim 70 further comprising a plurality of force applicators configured to apply forces to the plurality of constrainers to cause each of the unconstrained portions to tend to maintain contact with the workpiece during the thermally-induced motion of the workpiece.

76. The apparatus of claim 75 wherein the plurality of force applicators comprises a plurality of torque applicators.

77. The apparatus of claim 75 wherein the plurality of force applicators comprises a plurality of springs.

78. The apparatus of claim 69 wherein each of the flexible support members comprises the constrained portion at an end thereof, and wherein the unconstrained portion extends inwardly from the constrained portion toward a central region of the workpiece.

79. The apparatus of claim 78 wherein an inner tip of the each of the unconstrained portions extends inwardly past an outer edge of the workpiece, and wherein the engagement portion comprises an intermediate point along the unconstrained portion between the constrained portion and the inner tip, the intermediate point being engageable with the outer edge of the workpiece.

80. The apparatus of claim 69 wherein the at least one constrainer comprises a workpiece plane plate surrounding the workpiece.

81. The apparatus of claim 80 wherein the constrainer comprises at least one clamp for clamping the constrained portions.

82. The apparatus of claim 80 wherein the workpiece plane plate defines a plurality of workpiece support apertures in an inner surface thereof, and wherein the constrained portions are affixed to the workpiece plane plate with the unconstrained portions extending inwardly toward the workpiece through the workpiece support apertures.

83. The apparatus of claim 80 wherein the workpiece plane plate is configured to constrain the constrained portions in a generally horizontal direction to cause the unconstrained portions to extend generally horizontally inwardly toward the central region of the workpiece while downwardly sagging.

84. The apparatus of claim 83 wherein the unconstrained portions are engageable with an outer edge of the workpiece.

85. The apparatus of claim 84 wherein the unconstrained portions are engageable with the outer edge of the workpiece at an angle of less than about 10 degrees downward relative to a plane of the workpiece.

86. The apparatus of claim 80 wherein the plurality of flexible support members comprises a plurality of elongated flexible support members.

87. The apparatus of claim 86 wherein the plurality of elongated flexible support members comprises at least twenty elongated flexible support members.

88. The apparatus of claim 86 wherein the plurality of elongated flexible support members comprises at least fifty elongated flexible support members.

89. The apparatus of claim 69 wherein each of the flexible support members comprises first and second constrained portions at opposite ends of the support member defining the unconstrained portion therebetween, and wherein the at least one constrainer comprises first and second constrainers configured to constrain the first and second constrained portions in spaced apart relation to cause the unconstrained portion to extend in a curved path therebetween.

90. The apparatus of claim 64 wherein each of the engagement portions is engageable with a lower surface of the workpiece at an angle of 10 to 80 degrees relative to a plane of the workpiece.

91. The apparatus of claim 64 wherein each of the engagement portions is engageable with a lower surface of the workpiece at an angle of 15 to 35 degrees relative to a plane of the workpiece.

92. The apparatus of claim 64 wherein each of the engagement portions is engageable with a lower surface of the workpiece at an angle of 25 degrees relative to a plane of the workpiece.

93. The apparatus of claim 64 wherein each of the flexible support members comprises first and second spaced apart constrained portions with the unconstrained portion extending in a curved path therebetween.

94. The apparatus of claim 93 wherein the unconstrained portion extends along the curved path from the first constrained portion upwardly and inwardly toward the workpiece to a region of contact therewith and to extend from the region of contact downwardly and outwardly to the second constrained portion.

95. The apparatus of claim 94 wherein the unconstrained portion extends along the curved path such that a tangent to the unconstrained portion at the region of contact is substantially parallel to a tangent to an outer circumference of the workpiece in the vicinity of the region of contact.

96. The apparatus of claim 94 wherein the unconstrained portion extends along the curved path such that a tangent to the unconstrained portion at the region of contact extends radially inward toward a center of the workpiece.

97. The apparatus of claim 93 wherein the unconstrained portion extends along the curved path to form a first generally loop-shaped path segment extending from the first constrained portion below a plane of the workpiece and contacting the workpiece at a lower surface thereof, a second generally loop-shaped path segment extending between an outer edge of the workpiece and an inner edge of a workpiece plane plate, and a third generally loop-shaped path segment extending above the plane of the workpiece and contacting the workpiece at an upper surface thereof, the curved path terminating at the second constrained portion.

98. The apparatus of claim 97 further comprising a retractor configured to retract the second constrained portion to move the third generally loop-shaped path segment out of a volume defined above the upper surface of the workpiece.

99. The apparatus of claim 93 wherein the first and second constrained portions are affixed to a workpiece plane plate to prevent motion of the constrained portions.

100. The apparatus of claim 93 wherein at least one of the first and second constrained portions is retractably constrained.

101. The apparatus of claim 100 further comprising a retractor configured to retract the at least one of the first and second constrained portions to effectively shorten the unconstrained portion.

102. The apparatus of claim 100 further comprising a retractor configured to extend the at least one of the first and second constrained portions to effectively lengthen the unconstrained portion.

103. The apparatus of claim 64 wherein the plurality of flexible support members comprises first and second pluralities of elongated flexible support members, wherein the unconstrained portions of the first plurality of flexible support members are engageable with a lower surface of the workpiece and wherein the unconstrained portions of the second plurality of flexible support members are engageable with an upper surface of the workpiece.

104. The apparatus of claim 2 wherein the support system is configured to suppress vibration of the workpiece.

105. The apparatus of claim 104 wherein the support system is configured to suppress at least one natural vibration mode of the workpiece.

106. The apparatus of claim 105 wherein the support system is configured to suppress a second natural vibration mode of the workpiece.

107. The apparatus of claim 105 wherein the support system is configured to suppress a first natural vibration mode of the workpiece.

108. The apparatus of claim 104 wherein the support system is configured to absorb kinetic energy from the workpiece.

109. The apparatus of claim 2 further comprising a lateral support member configured to laterally support the workpiece.

110. The apparatus of claim 109 wherein the lateral support member comprises a plurality of lateral support members at respective positions relative to an outer edge of the workpiece.

111. The apparatus of claim 110 wherein each the plurality of lateral support members is resiliently engageable with the outer edge of the workpiece.

112. The apparatus of claim 110 wherein the plurality of lateral support members comprises a plurality of flexible fibers.

113. The apparatus of claim 112 wherein the flexible fibers are positioned at an angle substantially normal to a plane of the workpiece.

114. The apparatus of claim 112 wherein the fibers comprise optical fibers.

115. The apparatus of claim 112 wherein the fibers comprise quartz fibers.

116. The apparatus of claim 112 wherein the fibers comprise sapphire fibers.

117. The apparatus of claim 109 wherein the support member comprises the lateral support member, and wherein the support member comprises a moveable vertical support engagement portion engageable with a lower surface of the workpiece, and a lateral support engagement portion engageable with an outer edge of the workpiece.

118. The apparatus of claim 117 wherein the support member comprises a plurality of support members comprising a plurality of vertical and lateral support engagement portions engageable with the workpiece.

119. The apparatus of claim 117 wherein the vertical and lateral support engagement portions are resiliently engageable with the workpiece.

120. The apparatus of claim 117 wherein the vertical and lateral support engagement portions are flexible.

121. The apparatus of claim 120 wherein the vertical and lateral support engagement portions comprise first and second fibers.

122. The apparatus of claim 1 wherein the support system is configured to support the workpiece while allowing thermal bowing of the workpiece.

123. The apparatus of claim 1 wherein the support system is configured to support the workpiece while allowing thermal bending of the workpiece.

124. The apparatus of claim 1 wherein the heating system comprises an irradiance system configured to irradiate the surface of the workpiece.

125. The apparatus of claim 124 wherein the irradiance system is configured to irradiate the surface for a time period shorter than a thermal conduction time of the workpiece to heat the surface to a greater temperature than a temperature of the bulk of the workpiece.

126. The apparatus of claim 125 wherein the irradiance system is configured to irradiate the surface for a time period of less than about 1 millisecond.

127. The apparatus of claim 124 wherein the irradiance system comprises a flash lamp.

128. The apparatus of claim 127 wherein the flash lamp comprises a liquid-cooled arc lamp.

129. The apparatus of claim 127 wherein the flash lamp comprises a water-wall arc lamp.

130. The apparatus of claim 129 wherein the water-wall arc lamp comprises a double-water-wall arc lamp.

131. An apparatus for supporting a semiconductor workpiece, the apparatus comprising:
  a heating system configured to cause thermally-induced motion of the semiconductor workpiece by heating a surface of the workpiece relative to a bulk of the workpiece; and
  a support system configured to allow the thermally-induced motion of the workpiece while supporting the workpiece;
  wherein said support system comprises a support member having a moveable engagement portion engageable with the workpiece, wherein said engagement portion is moveable to allow the thermally-induced motion of the workpiece while supporting the workpiece; and
  wherein the support member is flexible and has a constrained portion and an unconstrained portion, and wherein the moveable engagement portion comprises the unconstrained portion.

132. An apparatus for supporting a semiconductor workpiece, the apparatus comprising:

a heating system configured to cause thermally-induced motion of the semiconductor workpiece by heating a surface of the workpiece relative to a bulk of the workpiece; and a support system configured to allow the thermally-induced motion of the workpiece while supporting the workpiece;

wherein said support system comprises a support member having a moveable engagement portion engageable with the workpiece, wherein said engagement portion is moveable to allow the thermally-induced motion of the workpiece while supporting the workpiece; and wherein the moveable engagement portion of the support member is resiliently engageable with the workpiece.

133. An apparatus for supporting a semiconductor workpiece, the apparatus comprising:

a heating system configured to cause thermally-induced motion of the semiconductor workpiece by heating a surface of the workpiece relative to a bulk of the workpiece; and a support system configured to allow the thermally-induced motion of the workpiece while supporting the workpiece;

wherein the heating system comprises an irradiance system configured to irradiate the surface of the workpiece; and wherein the irradiance system is configured to:

irradiate the surface of the workpiece for a first time period less than the thermal conduction time of the workpiece, to heat the surface to an intermediate temperature greater than that of the bulk of the workpiece; and irradiate the surface for a second time period less than the thermal conduction time of the workpiece, to heat the surface to the desired temperature greater than the intermediate temperature, wherein the second time period commences within an interval following the first time period sufficient to allow at least some thermal bowing of the workpiece.

134. The apparatus of claim 133 wherein the irradiance system is configured to impart more radiant energy to the surface of the workpiece during the second time period than during the first time period.

135. The apparatus of claim 133 wherein the irradiance system is configured to commence the second time period within several milliseconds following the end of the first time period.

136. An apparatus for supporting a semiconductor workpiece, the apparatus comprising:

a heating system configured to cause thermally-induced motion of the semiconductor workpiece by heating a surface of the workpiece relative to a bulk of the workpiece; and a support system configured to allow the thermally-induced motion of the workpiece while supporting the workpiece;

wherein the heating system comprises an irradiance system configured to irradiate the surface of the workpiece; and wherein the irradiance system is configured to continuously irradiate the surface of the workpiece for an interval shorter than a thermal conduction time of the workpiece and sufficiently long to allow at least some thermal bowing of the workpiece.

137. The apparatus of claim 136 wherein the irradiance system is configured to vary an intensity of irradiance during the interval.

138. The apparatus of claim 137 wherein the irradiance system is configured to irradiate the surface with a greater intensity during a later portion of the interval than during an earlier portion of the interval.

139. A method of supporting a semiconductor workpiece, the method comprising:

causing thermally-induced motion of the semiconductor workpiece by heating a surface of the workpiece relative to a bulk of the workpiece; and allowing the thermally-induced motion of the workpiece while supporting the workpiece;

wherein allowing the thermally-induced motion comprises allowing motion of outer regions of the workpiece while maintaining a center of mass of the workpiece in a desired range; and wherein maintaining comprises minimizing motion of the center of mass of the workpiece.

140. The method of claim 139 wherein supporting comprises engaging a moveable engagement portion of a support member with the workpiece, said engagement portion being moveable to allow the thermally-induced motion of the workpiece while supporting the workpiece.

141. The method of claim 140 wherein engaging comprises engaging the moveable engagement portion of the support member with a semiconductor wafer to allow thermally-induced motion of the wafer while supporting the wafer.

142. The method of claim 140 further comprising automatically allowing motion of the engagement portion in response to the thermally-induced motion of the workpiece.

143. The method of claim 140 wherein allowing the thermally-induced motion comprises allowing motion of the engagement portion to minimize stress in the workpiece while supporting the workpiece during the thermally-induced motion.

144. The method of claim 140 wherein engaging comprises engaging with the workpiece, as the engagement portion, a portion of a rigid moveable support member.

145. The method of claim 140 wherein engaging comprises engaging a plurality of moveable engagement portions of a plurality of respective support members with the workpiece.

146. The method of claim 145 wherein engaging comprises engaging at least three moveable engagement portions of at least three respective support members with the workpiece.

147. The method of claim 145 wherein engaging comprises engaging at least four moveable engagement portions of at least four respective support members with the workpiece.

148. The method of claim 145 wherein engaging comprises engaging a plurality of tips of a plurality of respective support pins with the workpiece.

149. The method of claim 148 wherein engaging comprises engaging the tips of the support pins with an outer perimeter zone of the workpiece.

150. The method of claim 149 further comprising automatically allowing motion of the tips of the support pins in response to thermally-induced motion of the outer perimeter zone of the workpiece.

151. The method of claim 148 wherein engaging comprises engaging, with the workpiece, a plurality of tips of a plurality of respective support pins comprising material that is transparent to at least some irradiance wavelengths with which the workpiece is capable of being irradiance-heated.

152. The method of claim 148 wherein engaging comprises engaging, with the workpiece, a plurality of tips of a plurality of respective support pins comprising optically transparent material.

153. The method of claim 148 wherein engaging comprises engaging, with the workpiece, a plurality of tips of a plurality of respective support pins comprising quartz.

154. The method of claim 148 wherein engaging comprises engaging, with the workpiece, a plurality of tips of a plurality of respective support pins comprising sapphire.

155. The method of claim 148 wherein engaging comprises engaging, with the workpiece, a plurality of tips of a plurality of respective support pins comprising metal.

156. The method of claim 148 wherein engaging comprises engaging, with the workpiece, a plurality of tips of a plurality of respective support pins comprising tungsten.

157. The method of claim 148 wherein engaging comprises engaging, with the workpiece, a plurality of coated tips of a plurality of respective support pins with the workpiece.

158. The method of claim 157 wherein engaging comprises engaging a plurality of tungsten nitride coated tips of a plurality of respective tungsten support pins with the workpiece.

159. The method of claim 157 wherein engaging comprises engaging a plurality of tungsten carbide coated tips of a plurality of respective tungsten support pins with the workpiece.

160. The method of claim 145 wherein engaging comprises resiliently engaging each of the moveable engagement portions with the workpiece.

161. The method of claim 160 wherein resiliently engaging comprises applying a force to each of the support members to cause each engagement portion to tend to maintain contact with the workpiece during the thermally-induced motion of the workpiece.

162. The method of claim 161 wherein applying a force comprises applying a torque to each of the support members.

163. The method of claim 162 wherein applying a torque comprises applying an upward force at a location on each support member interposed between a pivot point of the support member and the engagement portion.

164. The method of claim 162 wherein applying a torque comprises applying a downward force at a location on each support member such that a pivot point of the support member is interposed between the location and the engagement portion.

165. The method of claim 161 wherein applying a force comprises applying first and second forces to apply first and second opposing torques to each of the support members, the second torque acting to oppose overshoot by the support member of an equilibrium position thereof.

166. The method of claim 161 wherein applying a force comprises applying a spring force.

167. The method of claim 166 wherein applying the spring force comprises applying the force with a spring connected to each of the support members.

168. The method of claim 166 wherein applying the spring force comprises applying a constant force with a constant force spring connected to each of the support members.

169. The method of claim 145 wherein engaging comprises engaging a plurality of smooth-surfaced tips of a plurality of respective support pins with the workpiece.

170. The method of claim 145 further comprising moving the moveable engagement portions in response to the thermally-induced motion of the workpiece.

171. The method of claim 170 wherein moving the moveable engagement portions comprises moving the support members.

172. The method of claim 171 wherein moving the support members comprises, for each of the support members, applying an electric current to an actuator connected to the support member.

173. The method of claim 172 wherein applying an electric current comprises applying an electric current to a voice-coil actuator connected to the support member.

174. The method of claim 172 wherein applying an electric current comprises applying an electric current to a piezoelectric actuator connected to the support member.

175. The method of claim 172 wherein applying an electric current comprises applying an electric current to a linear servo actuator connected to the support member.

176. The method of claim 172 further comprising translating a linear motion of a moveable member of the actuator into an arcuate motion of the support member.

177. The method of claim 171 wherein moving comprises adjusting positions of the plurality of support members to minimize a difference between a weight of the workpiece and an upward force applied to the workpiece by the plurality of engagement portions of the plurality of support members.

178. The method of claim 171 wherein moving comprises adjusting positions of the support members to maintain a difference between a weight of the workpiece and an upward force applied to the workpiece by the engagement portions of the support members within a desired range.

179. The method of claim 170 wherein moving the engagement portions in response to the thermally-induced motion comprises moving the support members in response to a predicted value of the thermally-induced motion.

180. The method of claim 170 wherein moving the engagement portions in response to the thermally-induced motion comprises moving the support members in response to a detected parameter of the thermally-induced motion.

181. The method of claim 170 further comprising detecting the thermally-induced motion of the workpiece.

182. The method of claim 181 wherein detecting comprises detecting, in each of a plurality of actuators each of which is connected to a respective one of the plurality of support members, an electric current resulting from a force applied to the engagement portion of the support member by the motion of the workpiece.

183. The method of claim 182 wherein moving the engagement portions comprises applying an electric current to each of the actuators.

184. The method of claim 182 wherein detecting the electric current comprises detecting the current in each of a plurality of voice-coil actuators each of which is connected to a respective one of the support members, and wherein moving the engagement portions comprises applying electric currents to the voice-coil actuators.

185. The method of claim 182 wherein detecting the electric current comprises, for each actuator, detecting a deviation of the electric current from a desired electric current level, and wherein moving the engagement portions comprises, for each support member, adjusting a position of the support member to minimize the deviation.

186. The method of claim 185 wherein detecting the deviation comprises detecting the deviation at a processor circuit in communication with the actuator.

187. The method of claim 170 wherein moving comprises moving the engagement portions to minimize forces applied between the workpiece and the engagement portions.

188. The method of claim 187 wherein moving comprises moving a first plurality of engagement portions of a first plurality of respective support members engaged with a lower surface of the workpiece to minimize a difference between a weight of the workpiece and a force applied between the first plurality of engagement portions and the workpiece.

189. The method of claim 188 wherein moving further comprises moving a second plurality of engagement portions of a second plurality of support members engaged with an upper surface of the workpiece to minimize a force applied between the workpiece and the second plurality of engagement portions.

190. The method of claim 170 wherein engaging comprises resiliently engaging the engagement portions of the support members with the workpiece, and wherein moving comprises moving the support members in response to the thermally-induced motion.

191. The method of claim 190 wherein resiliently engaging comprises applying torques to the support members about respective pivot points thereof to cause the engagement portions to tend to maintain contact with the workpiece, and wherein moving comprises moving the pivot points of the support members.

192. The method of claim 191 wherein applying torques comprises applying spring forces to the support members at locations other than the pivot points thereof, and wherein moving comprises applying electric currents to a plurality of actuators connected to the plurality of support members to move the support members.

193. The method of claim 190 wherein the plurality of support members comprises a plurality of flexible support members, each having a constrained portion and an unconstrained portion; wherein resiliently engaging comprises resiliently engaging the unconstrained portions of the flexible support members with the workpiece; and wherein moving comprises moving the constrained portions of the support members.

194. The method of claim 193 wherein moving comprises applying electric currents to a plurality of actuators connected to the plurality of constrained portions.

195. The method of claim 190 further comprising detecting the thermally-induced motion of the workpiece.

196. The method of claim 145 wherein engaging comprises engaging a first plurality of moveable engagement portions of a first plurality of respective support members with a lower surface of the workpiece and engaging a second plurality of engagement portions of a second plurality of support members with an upper surface of the workpiece.

197. The method of claim 196 wherein engaging comprises engaging the first and second pluralities of engagement portions with the lower and upper surfaces of the workpiece at an outer perimeter zone of the workpiece.

198. The method of claim 145 wherein the plurality of support members comprises a plurality of flexible support members each having an unconstrained portion and a constrained portion, and wherein engaging the plurality of moveable engagement portions comprises engaging the unconstrained portions of the flexible support members with the workpiece.

199. The method of claim 198 wherein the plurality of flexible support members comprises a plurality of fibers, and wherein engaging comprises engaging the unconstrained portions of the fibers with the workpiece.

200. The method of claim 198 wherein the plurality of flexible support members comprises a plurality of optical fibers, and wherein engaging comprises engaging the unconstrained portions of the optical fibers with the workpiece.

201. The method of claim 198 wherein the plurality of flexible support members comprises a plurality of quartz fibers, and wherein engaging comprises engaging the unconstrained portions of the quartz fibers with the workpiece.

202. The method of claim 198 wherein the plurality of flexible support members comprises a plurality of sapphire fibers, and wherein engaging comprises engaging the unconstrained portions of the sapphire fibers with the workpiece.

203. The method of claim 198 further comprising constraining each of the constrained portions of the flexible support members.

204. The method of claim 203 wherein constraining comprises constraining the constrained portions in a plurality of constrainers disposed around an outer perimeter of the workpiece.

205. The method of claim 204 wherein the plurality of constrainers consists of fewer constrainers than the number of the flexible support members, and wherein constraining comprises constraining more than one of the flexible support members in each of the constrainers.

206. The method of claim 205 wherein constraining comprises, in each of the constrainers, constraining the more than one of the flexible support members generally parallel to each other.

207. The method of claim 205 wherein constraining comprises, in each of the constrainers, constraining the more than one of the flexible support members generally divergent from each other.

208. The method of claim 204 wherein the plurality of constrainers consists of the same number of constrainers as the number of the flexible support members, and wherein constraining comprises constraining each of the constrained portions in a respective corresponding one of the constrainers.

209. The method of claim 204 wherein engaging comprises applying a force to each of the constrainers to cause each of the unconstrained portions to tend to maintain contact with the workpiece during the thermally-induced motion of the workpiece.

210. The method of claim 209 wherein applying a force comprises applying a torque.

211. The method of claim 209 wherein applying a force comprises applying a spring force.

212. The method of claim 203 wherein each of the flexible support members comprises the constrained portion at an end thereof, and wherein constraining comprises constraining the constrained portion to cause the unconstrained portion to extend inwardly toward a central region of the workpiece.

213. The method of claim 212 wherein an inner tip of the each of the unconstrained portions extends inwardly past an outer edge of the workpiece, and wherein engaging comprises engaging, with the outer edge of the workpiece, an intermediate point along the unconstrained portion between the constrained portion and the inner tip.

214. The method of claim 203 wherein constraining comprises constraining the constrained portions in a workpiece plane plate surrounding the workpiece.

215. The method of claim 214 wherein constraining comprises clamping.

216. The method of claim 214 wherein constraining each of the constrained portions comprises affixing the constrained portion to the workpiece plane plate with the unconstrained portion extending inwardly toward the workpiece through a workpiece support aperture defined in the plate.

217. The method of claim 214 wherein constraining comprises constraining the constrained portions in a generally horizontal direction to cause the unconstrained portions to extend generally horizontally inwardly toward the central region of the workpiece while downwardly sagging.

218. The method of claim 217 wherein engaging comprises engaging the unconstrained portions with an outer edge of the workpiece.

219. The method of claim 218 wherein engaging comprises engaging the unconstrained portions with the outer edge of the workpiece at an angle of less than about 10 degrees downward relative to a plane of the workpiece.

220. The method of claim 214 wherein the plurality of flexible support members comprises a plurality of elongated flexible support members.

221. The method of claim 220 wherein the plurality of elongated flexible support members comprises at least twenty elongated flexible support members, and wherein constraining comprises constraining each of the at least twenty elongated flexible support members in the workpiece plane plate.

222. The method of claim 220 wherein the plurality of elongated flexible support members comprises at least fifty elongated flexible support members, and wherein constraining comprises constraining each of the at least fifty elongated flexible support members in the workpiece plane plate.

223. The method of claim 203 wherein each of the flexible support members comprises first and second constrained portions at opposite ends of the support member defining the unconstrained portion therebetween, and wherein constraining comprises constraining the first and second constrained portions in spaced apart relation to cause the unconstrained portion to extend in a curved path therebetween.

224. The method of claim 223 wherein constraining comprises constraining the first and second constrained portions to cause the unconstrained portion to extend along the curved path from the first constrained portion upwardly and inwardly toward the workpiece to a region of contact therewith and to extend from the region of contact downwardly and outwardly to the second constrained portion.

225. The method of claim 224 wherein constraining comprises constraining the first and second constrained portions to cause the unconstrained portion to extend along the curved path such that a tangent to the unconstrained portion at the region of contact is substantially parallel to a tangent to an outer circumference of the workpiece in the vicinity of the region of contact.

226. The method of claim 224 wherein constraining comprises constraining the first and second constrained portions to cause the unconstrained portion to extend along the curved path such that a tangent to the unconstrained portion at the region of contact extends radially inward toward a center of the workpiece.

227. The method of claim 223 wherein constraining comprises constraining the first and second constrained portions to cause the unconstrained portion to extend along the curved path to form a first generally loop-shaped path segment extending from the first constrained portion below a plane of the workpiece and contacting the workpiece at a lower surface thereof, a second generally loop-shaped path segment extending between an outer edge of the workpiece and an inner edge of a workpiece plane plate, and a third generally loop-shaped path segment extending above the plane of the workpiece and contacting the workpiece at an upper surface thereof, the curved path terminating at the second constrained portion.

228. The method of claim 227 further comprising retracting the second constrained portion to move the third generally loop-shaped path segment out of a volume defined above the upper surface of the workpiece.

229. The method of claim 223 wherein constraining comprises affixing the first and second constrained portions to prevent motion of the constrained portions.

230. The method of claim 223 wherein constraining comprises retractably constraining at least one of the first and second constrained portions.

231. The method of claim 230 further comprising retracting the at least one of the first and second constrained portions to effectively shorten the unconstrained portion.

232. The method of claim 230 further comprising extending the at least one of the first and second constrained portions to effectively lengthen the unconstrained portion.

233. The method of claim 198 wherein engaging comprises engaging each of the engagement portions with a lower surface of the workpiece at an angle of 10 to 80 degrees relative to a plane of the workpiece.

234. The method of claim 198 wherein engaging comprises engaging each of the engagement portions with a lower surface of the workpiece at an angle of 15 to 35 degrees relative to a plane of the workpiece.

235. The method of claim 198 wherein engaging comprises engaging each of the engagement portions with a lower surface of the workpiece at an angle of 25 degrees relative to a plane of the workpiece.

236. The method of claim 198 wherein the plurality of flexible support members comprises first and second pluralities of flexible support members, and wherein engaging the plurality of moveable engagement portions comprises engaging the unconstrained portions of the first plurality of flexible support members with a lower surface of the workpiece and engaging the unconstrained portions of the second plurality of flexible support members with an upper surface of the workpiece.

237. The method of claim 140 further comprising suppressing vibration of the workpiece.

238. The method of claim 237 wherein suppressing comprises suppressing at least one natural vibration mode of the workpiece.

239. The method of claim 238 wherein suppressing comprises suppressing a second natural vibration mode of the workpiece.

240. The method of claim 238 wherein suppressing comprises suppressing a first natural vibration mode of the workpiece.

241. The method of claim 237 wherein suppressing comprises absorbing kinetic energy from the workpiece.

242. The method of claim 140 further comprising laterally supporting the workpiece.

243. The method of claim 242 wherein laterally supporting comprises positioning a plurality of lateral support members at respective positions relative to an outer edge of the workpiece.

244. The method of claim 243 wherein positioning comprises resiliently engaging the plurality of lateral support members with the outer edge of the workpiece.

245. The method of claim 243 wherein positioning comprises positioning a plurality of flexible fibers at the respective positions.

246. The method of claim 245 wherein positioning comprises positioning the flexible fibers at an angle substantially normal to a plane of the workpiece.

247. The method of claim 245 wherein positioning comprises positioning a plurality of optical fibers.

248. The method of claim 245 wherein positioning comprises positioning a plurality of quartz fibers.

249. The method of claim 245 wherein positioning comprises positioning a plurality of sapphire fibers.

250. The method of claim 242 wherein engaging and laterally supporting comprise engaging a vertical support engagement portion of a support member with a lower surface of the workpiece, and engaging a lateral support engagement portion of the support member with an outer edge of the workpiece.

251. The method of claim 250 wherein engaging and laterally supporting comprise engaging a plurality of vertical and lateral support engagement portions of a plurality of respective support members with the workpiece.

252. The method of claim 250 wherein engaging and laterally supporting comprise resiliently engaging the vertical and lateral support engagement portions with the workpiece.

253. The method of claim 250 wherein engaging and laterally supporting comprise engaging, as the vertical and lateral support engagement portions, flexible engagement portions.

254. The method of claim 253 wherein engaging and laterally supporting comprise engaging with the workpiece, as the vertical and lateral support engagement portions, first and second fibers.

255. The method of claim 139 wherein allowing comprises allowing thermal bowing of the workpiece.

256. The method of claim 139 wherein allowing comprises allowing thermal bending of the workpiece.

257. The method of claim 139 wherein heating comprises irradiating the surface of the workpiece.

258. The method of claim 257 wherein irradiating comprises irradiating the surface for a time period shorter than a thermal conduction time of the workpiece to heat the surface to a greater temperature than a temperature of the bulk of the workpiece.

259. The method of claim 258 wherein irradiating comprises irradiating the surface for a time period of less than about 1 millisecond.

260. The method of claim 257 wherein irradiating comprises irradiating the surface with a flash lamp.

261. A method of supporting a semiconductor workpiece, the method comprising:
causing thermally-induced motion of the semiconductor workpiece by heating a surface of the workpiece relative to a bulk of the workpiece; and
allowing the thermally-induced motion of the workpiece while supporting the workpiece;
wherein supporting comprises engaging a moveable engagement portion of a support member with the workpiece, said engagement portion being moveable to allow the thermally-induced motion of the workpiece while supporting the workpiece; and
wherein the support member is flexible and has a constrained portion and an unconstrained portion, and wherein engaging comprises engaging the unconstrained portion with the workpiece.

262. A method of supporting a semiconductor workpiece, the method comprising:
causing thermally-induced motion of the semiconductor workpiece by heating a surface of the workpiece relative to a bulk of the workpiece; and
allowing the thermally-induced motion of the workpiece while supporting the workpiece;
wherein supporting comprises engaging a moveable engagement portion of a support member with the workpiece, said engagement portion being moveable to allow the thermally-induced motion of the workpiece while supporting the workpiece; and
wherein engaging comprises resiliently engaging the moveable engagement portion of the support member with the workpiece.

263. A method of supporting a semiconductor workpiece, the method comprising:
causing thermally-induced motion of the semiconductor workpiece by heating a surface of the workpiece relative to a bulk of the workpiece; and
allowing the thermally-induced motion of the workpiece while supporting the workpiece;
wherein heating comprises irradiating the surface of the workpiece; and
wherein irradiating comprises:
irradiating the surface of the workpiece for a first time period less than the thermal conduction time of the workpiece, to heat the surface to an intermediate temperature greater than that of the bulk of the workpiece; and
irradiating the surface for a second time period less than the thermal conduction time of the workpiece, to heat the surface to the desired temperature greater than the intermediate temperature, wherein the second time period commences within an interval following the first time period sufficient to allow at least some thermal bowing of the workpiece.

264. The method of claim 263 wherein irradiating comprises imparting more radiant energy to the surface of the workpiece during the second time period than during the first time period.

265. The method of claim 263 wherein irradiating comprises commencing the second time period within several milliseconds following the end of the first time period.

266. A method of supporting a semiconductor workpiece, the method comprising:
causing thermally-induced motion of the semiconductor workpiece by heating a surface of the workpiece relative to a bulk of the workpiece; and
allowing the thermally-induced motion of the workpiece while supporting the workpiece;
wherein heating comprises irradiating the surface of the workpiece; and
wherein irradiating comprises continuously irradiating the surface of the workpiece for an interval shorter than a thermal conduction time of the workpiece and sufficiently long to allow at least some thermal bowing of the workpiece.

267. The method of claim 266 wherein continuously irradiating comprises varying an intensity of irradiance during the interval.

268. The method of claim 267 wherein varying comprises irradiating the surface with a greater intensity during a later portion of the interval than during an earlier portion of the interval.

269. An apparatus for supporting a semiconductor workpiece, the apparatus comprising:

means for causing thermally-induced motion of the semiconductor workpiece by heating a surface of the workpiece relative to a bulk of the workpiece;
means for supporting the workpiece; and
means for allowing the thermally-induced motion of the workpiece while the workpiece is being supported;
wherein the means for allowing the thermally-induced motion comprises means for allowing motion of outer regions of the workpiece while maintaining a center of mass of the workpiece in a desired range; and
wherein the means for allowing comprises means for minimizing motion of the center of mass of the workpiece.

270. The apparatus of claim 269 wherein the means for supporting and means for allowing respectively comprise means for supporting a semiconductor wafer and means for allowing thermally-induced motion of the wafer while the wafer is being supported.

271. The apparatus of claim 269 wherein the means for allowing comprises means for automatically allowing motion of the means for supporting in response to the thermally-induced motion of the workpiece.

272. The apparatus of claim 269 wherein the means for allowing the thermally-induced motion comprises means for allowing motion of the means for supporting to minimize stress in the workpiece while supporting the workpiece during the thermally-induced motion.

273. The apparatus of claim 269 wherein the means for allowing comprises means for allowing thermal bowing of the workpiece.

274. The apparatus of claim 269 wherein the means for allowing comprises means for allowing thermal bending of the workpiece.

275. The apparatus of claim 269 further comprising means for suppressing vibration of the workpiece.

276. The apparatus of claim 275 wherein the means for suppressing comprises means for absorbing kinetic energy from the workpiece.

277. The apparatus of claim 269 further comprising means for applying a force to the means for supporting to cause the means for supporting to tend to maintain contact with the workpiece during the thermally-induced motion of the workpiece.

278. The apparatus of claim 277 wherein the means for applying a force comprises means for applying a torque to the means for supporting.

279. The apparatus of claim 277 wherein the means for applying a force comprises means for applying a first force and means for applying a second force to apply first and second opposing torques to the means for supporting, the second torque acting to oppose overshoot by the means for supporting of an equilibrium position thereof.

280. The apparatus of claim 277 wherein the means for applying a force comprises means for applying a constant force.

281. The apparatus of claim 277 wherein the means for supporting comprises means for transmitting at least some irradiance wavelengths with which the workpiece is capable of being irradiance-heated.

282. The apparatus of claim 277 wherein the means for supporting comprises means for reducing friction between the means for supporting and the workpiece.

283. The apparatus of claim 269 further comprising means for moving the means for supporting in response to the thermally-induced motion of the workpiece.

284. The apparatus of claim 283 further comprising means for translating a linear motion of a moveable member of the means for moving into an arcuate motion of the means for supporting.

285. The apparatus of claim 283 wherein the means for moving comprises means for adjusting positions of the means for supporting to minimize a difference between a weight of the workpiece and an upward force applied to the workpiece by the means for supporting.

286. The apparatus of claim 283 wherein the means for moving comprises means for adjusting positions of the means for supporting to maintain a difference between a weight of the workpiece and an upward force applied to the workpiece by the means for supporting within a desired range.

287. The apparatus of claim 283 further comprising means for detecting the thermally-induced motion of the workpiece.

288. The apparatus of claim 283 wherein the means for moving comprises means for minimizing forces applied between the workpiece and the means for moving.

289. The apparatus of claim 288 wherein the means for minimizing comprises means for minimizing a difference between a weight of the workpiece and a force applied between the means for supporting and the workpiece.

290. The apparatus of claim 283 wherein the means for supporting comprises means for resiliently supporting the workpiece.

291. The apparatus of claim 290 wherein the means for allowing comprises means for applying torques to the means for supporting about respective pivot points thereof to cause the means for supporting to tend to maintain contact with the workpiece, and wherein the means for moving comprises means for moving the pivot points of the means for supporting.

292. The apparatus of claim 290 further comprising means for detecting the thermally-induced motion of the workpiece.

293. The apparatus of claim 269 wherein the means for supporting comprises first means for supporting the workpiece and second means for supporting the workpiece, the first means for supporting being engageable with a lower surface of the workpiece and the second means for supporting being engageable with an upper surface of the workpiece.

294. The apparatus of claim 288 wherein the first and second means for supporting are engageable with the lower and upper surfaces of the workpiece at an outer perimeter zone of the workpiece.

295. The apparatus of claim 293 further comprising means for retracting the second means for supporting to move the second means for supporting out of a volume defined above the upper surface of the workpiece.

296. The apparatus of claim 269 wherein the means for supporting comprise flexible means for supporting, and wherein the means for allowing comprises means for applying a force to the flexible means for supporting to cause the means for supporting to tend to maintain contact with the workpiece during the thermally-induced motion of the workpiece.

297. The apparatus of claim 296 wherein the means for applying a force comprises means for applying a torque.

298. The apparatus of claim 269 wherein the means for supporting comprise flexible means for supporting, and wherein the means for supporting are engageable with a lower surface of the workpiece at an angle of 10 to 80 degrees relative to a plane of the workpiece.

299. The apparatus of claim 269 wherein the means for supporting comprise flexible means for supporting, and wherein the means for supporting are engageable with a lower surface of the workpiece at an angle of 15 to 35 degrees relative to a plane of the workpiece.

300. The apparatus of claim 269 wherein the means for supporting comprise flexible means for supporting, and further comprising means for retracting the flexible means for supporting.

301. The apparatus of claim 269 further comprising means for laterally supporting the workpiece.

302. The apparatus of claim 301 wherein the means for laterally supporting are resiliently engageable with an outer edge of the workpiece.

303. The apparatus of claim 302 wherein the means for laterally supporting are flexible.

304. The apparatus of claim 269 wherein the means for heating comprises means for irradiating the surface of the workpiece.

305. The apparatus of claim 304 wherein the means for irradiating comprises means for irradiating the surface for a time period shorter than a thermal conduction time of the workpiece to heat the surface to a greater temperature than a temperature of the bulk of the workpiece.

306. An apparatus for supporting a semiconductor workpiece, the apparatus comprising:
    means for causing thermally-induced motion of the semiconductor workpiece by heating a surface of the workpiece relative to a bulk of the workpiece;
    means for supporting the workpiece; and
    means for allowing the thermally-induced motion of the workpiece while the workpiece is being supported;
    wherein the means for supporting comprise flexible means for supporting.

307. The apparatus of claim 306 further comprising means for constraining the means for supporting.

308. The apparatus of claim 307 wherein the means for constraining comprises means for clamping.

309. The apparatus of claim 307 wherein the means for constraining comprises means for affixing the means for supporting to a workpiece plane plate.

310. An apparatus for supporting a semiconductor workpiece, the apparatus comprising:
    means for causing thermally-induced motion of the semiconductor workpiece by heating a surface of the workpiece relative to a bulk of the workpiece;
    means for supporting the workpiece; and
    means for allowing the thermally-induced motion of the workpiece while the workpiece is being supported;
    wherein the means for causing thermally-induced motion by heating comprises means for irradiating the surface of the workpiece; and
    wherein the means for irradiating comprises:
        means for irradiating the surface of the workpiece for a first time period less than the thermal conduction time of the workpiece, to heat the surface to an intermediate temperature greater than that of the bulk of the workpiece; and
        means for irradiating the surface for a second time period less than the thermal conduction time of the workpiece, to heat the surface to the desired temperature greater than the intermediate temperature, wherein the means for irradiating the surface for the second time period comprises means for commencing the second time period within an interval following the first time period sufficient to allow at least some thermal bowing of the workpiece.

311. An apparatus for supporting a semiconductor workpiece, the apparatus comprising:
    means for causing thermally-induced motion of the semiconductor workpiece by heating a surface of the workpiece relative to a bulk of the workpiece;
    means for supporting the workpiece; and
    means for allowing the thermally-induced motion of the workpiece while the workpiece is being supported;
    wherein the means for causing thermally-induced motion by heating comprises means for irradiating the surface of the workpiece; and
    wherein the means for irradiating comprises means for continuously irradiating the surface of the workpiece for an interval shorter than a thermal conduction time of the workpiece and sufficiently long to allow at least some thermal bowing of the workpiece.

312. The apparatus of claim 311 wherein the means for continuously irradiating comprises means for varying an intensity of irradiance during the interval.

313. The apparatus of claim 312 wherein the means for varying comprises means for causing the surface to be irradiated with a greater intensity during a later portion of the interval than during an earlier portion of the interval.

* * * * *